(12) United States Patent
Hanzawa et al.

(10) Patent No.: US 6,281,725 B1
(45) Date of Patent: Aug. 28, 2001

(54) SEMICONDUCTOR INTEGRATED CIRCUIT HAVING A CLOCK RECOVERY CIRCUIT

(75) Inventors: Satoru Hanzawa, Kokubunji; Takeshi Sakata, Kodaira; Katsutaka Kimura, Akishima, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/337,421

(22) Filed: Jun. 22, 1999

(30) Foreign Application Priority Data

Aug. 6, 1998 (JP) .................................................. 10-222637

(51) Int. Cl.$^7$ .............................. H03L 7/00; H03H 11/26
(52) U.S. Cl. ............................................ 327/152; 327/201
(58) Field of Search .................................... 327/165, 166, 327/172, 176, 261–264, 268–272, 276–278, 284, 285, 144, 152, 236, 299

(56) References Cited

U.S. PATENT DOCUMENTS

| | | | |
|---|---|---|---|
| 5,699,003 | 12/1997 | Saeki ..................................... | 327/261 |
| 5,708,382 | * 1/1998 | Park ..................................... | 327/277 |
| 5,767,712 | * 6/1998 | Takemae et al. ..................... | 327/152 |
| 5,909,133 | * 6/1999 | Park ..................................... | 327/277 |
| 5,945,861 | * 8/1999 | Lee et al. ............................. | 327/277 |
| 6,075,395 | * 6/2000 | Saeki ................................... | 327/161 |
| 6,084,453 | * 7/2000 | Fuse et al. ........................... | 327/176 |

FOREIGN PATENT DOCUMENTS 8-237091   9/1996   (JP) .
10126254   5/1998   (JP) .

OTHER PUBLICATIONS

Horowitz et al., "PLL Design for a 500 MB/s Interface", 1993 IEEE Int'l Solid–State Circuits Conference, Feb. 1993, pp. 160–161.
Lee et al., "A 2.5V Delay–Locked Loop for an 18Mb 500MB/s DRAM", ISSCC94/Session 18, Feb. 1994, pp. 300–301.

* cited by examiner

Primary Examiner—My-Trang Nuton
(74) Attorney, Agent, or Firm—Antonelli, Terry, Stout & Kraus, LLP

(57) ABSTRACT

A clock recovery circuit is provided for use in a memory with a clock synchronized interface or the like, wherein an external clock is temporarily intercepted to shorten the lock-in time when an internal clock is to be generated from the external clock.

The clock recovery circuit includes a delay circuit array, into which an external clock is inputted, for generating a plurality of reference clocks, a control circuit for comparing the phases of the external clock and of the plurality of reference clocks and detecting the number of delay stages of the delay circuits required for locking in, and latching circuit for holding the number of delay stages required for locking in.

Once synchronism is detected and the number of delay stages required for locking in are held in the latching circuit, the generation of the internal clock can be resumed in a short period of time even if the supply of the external clock is temporarily suspended.

22 Claims, 35 Drawing Sheets

SEMICONDUCTOR INTEGRATED CIRCUIT HAVING A CLOCK RECOVERY CIRCUIT

FIELD OF THE INVENTION

The present invention relates to a semiconductor apparatus (or semiconductor integrated circuit) having a clock generating circuit for generating an internal clock signal synchronized with a clock signal entered from outside, and more particularly to a clock generating circuit for generating an internal clock signal whose timing error occurring with a clock signal entered from outside is infinitesimal and to the application of a clock signal formed by the clock generating circuit to a semiconductor apparatus.

BACKGROUND OF THE INVENTION

References referred to in this specification are the following:

{REF 1} 1993 International Solid-State Circuit Conference Digest of Technical Papers, pp. 160–161, February 1993;
{REF 2} 1994 International Solid-State Circuit Conference Digest of Technical Papers, pp. 300–301, February 1994;
{REF 3} Japanese Patent Laid-open No. 8-23709 (counterpart U.S. Pat. No. 5,699,003);
{REF 4} Japanese Patent Laid-open No. 10-126254. These references will be referred to below by their respective reference numbers.

As clock recovery circuits for generating an internal clock synchronized in phase with an external clock, phase locked-loop (PLL) and a delay-locked loop (DLL) circuits are known, as disclosed in {REF 1} and {REF 2}, respectively. Since these circuits are feedback circuits, they take a relatively long time for phase matching.

Known clock recovery circuits to shorten the time required for phase matching include so-called synchronous mirror delay (SMD) circuits disclosed in {REF 3} and {REF 4}.

The SMD circuit described in {REF 3} comprises a first delay circuit array for generating a plurality of reference clock arrays from a standard clock; a control circuit for comparing the plurality of reference clock arrays with the standard clock to select and pass a reference clock close in phase to the standard clock; and a second delay circuit array for adding to the clock selected by the control circuit delays equal to the number of delay stages passed in the first delay circuit array. As a consequence, the accuracy of phase synchronism of the SMD circuit is determined by the delay time per stage of delay circuit. FIGS. 12 and 13 of {REF 3} show a variable delay circuit for performing adjustment by an integral multiple of a delay time shorter than that of the delay circuits of the SMD circuit at a time into the input section of the first delay circuit array of the SMD circuit. The delay time of this variable delay circuit is under feedback control by a standard clock entered into the delay circuit, an internal circuit formed by the second delay circuit, an array coupled to the SMD circuit, and a phase comparator.

The present inventors studied a synchronous DRAM (SDRAM) for delivering and receiving data in synchronism with a clock signal entered from outside as a high speed dynamic random access memory (DRAM). As its operating frequency is enhanced and the clock cycle time reduced, the clock access time from the entry of the external clock until the outputting of data poses a problem, because the clock access time should be sufficiently shorter than the clock cycle time in order to secure a time for the data read out of the SDRAM to be set up. In this connection, a clock generating circuit (which may as well be called a clock recovery circuit) for generating an internal clock within the SDRAM from the external clock signal is important for high speed operation.

Subjects for a clock generating circuit to be required for the above mentioned application are the following. (1) The lock-in time taken to generate an internal clock from an external clock again, with the external clock being temporarily intercepted, should be sufficiently short to place the SDRAM in a low power consumption mode. (2) While reducing the lock-in error between the external and internal clocks, the lock-in time until generating the internal clock should be sufficiently short. (3) Power consumption by the clock recovery circuit should be low. (4) Both the dimensions of the circuit and the area it occupies on the semiconductor substrate should be small.

In spite of these requirements, the DLL and the PLL described in {REF 1} and {REF 2}, though they have the advantages that the internal clock is generated with high accuracy (with little lock-in error) and that they involve little jitter problem, take a relatively long time for the internal clock to be recovered. The circuit illustrated in FIG. 12 of {REF 3} seems susceptible to little lock-in error of the internal clock if it operates ideally because it has both an SMD circuit and a variable delay circuit for fine tuning. However, no consideration is given to the stability of the system in this circuit, wherein each of the SMD circuit and the fine-tuning variable delay circuit has its own independent feedback path.

An object of the present invention is to maintain the stability of the clock recovery circuit and shorten the lock-in time until the generation of the internal clock while reducing the lock-in error between the external and internal clocks.

Another object of the invention is to shorten the lock-in time taken when the external clock is temporarily intercepted and the internal clock is generated from the external clock.

Still another object of the invention is to reduce the circuit area and power consumption by the clock recovery circuit.

SUMMARY OF THE INVENTION

In order to achieve the foregoing objects, a typical configuration of a semiconductor integrated circuit according to the invention, includes a clock recovery circuit which receives an external clock and generates an internal clock, wherein said clock recovery circuit comprises an input standard node, to which said external clock is coupled, for supplying a first standard clock; a plurality of first delay circuits, whose initial stage is coupled to said input standard node, for supplying a plurality of reference clocks differing in phase from each other; a comparator for detecting a predetermined number of delay stages required for locking in by comparing the plurality of reference clock arrays with said first standard clock and detecting the reference clock closest in phase to said standard clock; a control circuit having a latch circuit for holding information on said predetermined number of delay stages; a plurality of second delay circuits each having an input node into which said first standard clock is entered via a switch; and an output standard node, which is coupled to the final stage of said second delay circuits, for supplying said internal clock, wherein said internal clock is formed by causing said first standard clock to be entered into said input node of the corresponding one of said plurality of second delay circuits to said predetermined number of delay stages, detected by said control circuit.

DETAILED DESCRIPTION OF THE PREFERRED EMBODIMENTS

Preferred embodiments of the present invention will be described in detail below with reference to the accompanying drawings. Circuit elements constituting each of the blocks described below are formed of known features of integrated circuit technology, including but not limited to complementary Moss (CMOSs) and bipolar transistors, over one semiconductor substrate of single crystal silicon or the like.

<Embodiment 1>

Figure 1:
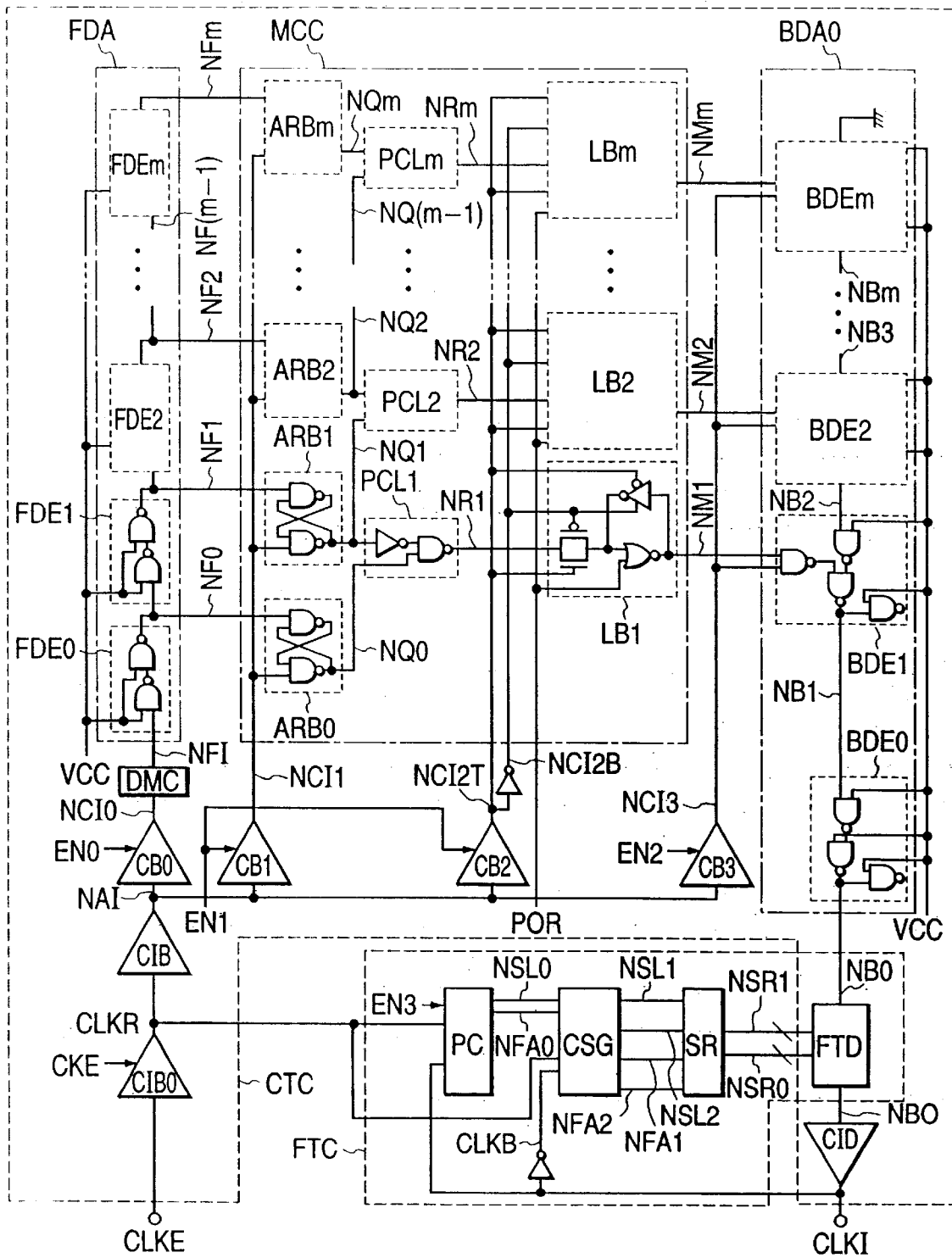
FIG. 1 illustrates Example 1 of a clock recovery circuit according to the present invention.

An example a clock recovery circuit according to the invention is illustrated in FIG. 1. The clock recovery circuit shown in FIG. 1 is characterize in that any timing error between an external clock and an internal clock is automatically identified and, while fine-tuning that difference, an internal clock is generated by delaying the external clock according to its period. This clock recovery circuit consists of a clock recovery circuit for coarse tuning CTC (a coarse tuning circuit) and a clock recovery circuit for fine tuning FTC (fine tuning circuit). The coarse tuning circuit CTC consists of clock input buffers CIB0 and CIB, clock buffers CB0, CB1,CB2 and CB3, a delay monitor DMC, a forward delay circuit FDA, a control circuit MCC, a backward delay circuit array BDA0, a delay time fine tuning circuit FTD and a clock driver CID, while the fine tuning circuit FTC consists of a delay time fine tuning FTD, a phase comparator PC, a control signal generator CSG, a shift register SR, and a clock driver CID. [1-1. Configuration of the Coarse Tuning Clock Recovery Circuit]

The forward delay circuit array FDA, to which (m+1) delay circuits FDE0 to FDEm are connected in series, consists of two NAND circuits connected in series, of each of which one input terminal is connected to a source voltage VCC. To a clock entered from the DMC into the FDA is added a delay (tD) of a fixed quantity every time it passes a delay circuit, and a plurality of delay clock signals (a plurality of reference clock signals) to which a delay time is added in an arithmetic sequence from each of a plurality of output terminals (NF0 to NFm).

The control circuit MCC consists of a clock input buffer CIB, (m+1) arbiters ARB0 to ARBm into which the outputs NF0 to NFm of the delay circuits FDE0 to FDEm are respectively entered, m logic circuits PCL1 to PCLm which perform logical operations on the outputs of each pair of adjoining arbiters, and m latch circuits LB1 to LBm for holding the outputs of the logic circuits PCL1 to PCLm. Each of the arbiters ARB0 to ARBm, which are exemplified here by circuits known as RS latches, has a function to compare the phases of clock signals entered via first and second inputs, and generates an output conforming to a predetermined phase condition. Thus, if the phase of a clock entered via the second input (e.g. NF0 in FIG. 1) is ahead of one entered via the first input (e.g. NCI1 in FIG. 1), which is supposed to be the standard clock, an arbiter provides an output of a predetermined level (a high level by any arbiter in FIG. 1). Or, conversely, if the phase of a clock entered via the second input is behind, the standard clock entered via the first input is permitted to pass as it is and supplied as the output (an inverted standard clock passes in any arbiter in FIG. 1). Even if the phases of two entered clock signals are exactly identical, a slight degree of asymmetry of the circuit defines the action to be either of the above-described two.

Into each of the logic circuits PCL1 to PCLm is entered an inverted signal from one input side of a two-input NAND circuit. If the levels of signals entered via the first input and the second input (the input on the side fitted with an inverter) are the same, each of these logic circuits always supplies an output of a predetermined level (for instance the high level in FIG. 1). Further, signals entered via the first and second inputs are internal standard clock signals, which periodically vary to high and low levels in the same phase, the output is always at the same predetermined level. When the first input is always at the high level and the second input is at a low level, a low level output is given only as long as the second input is at the low level.

Each of the latch circuits LB1 to LBm consists of a latch connected to a transfer gate and one input of a two-input NOR via a clock inverter. Thus, when the other input of the two-input NOR is at a low level and the standard clock 8 eg. NCI2T in FIG. 1), the output signal of each of the logic circuits PCL1 to PCLM is entered into the latch circuit, and when the internal standard clock is at a low level, the level of the entered signals is maintained. A reset signal POR is also supplied to LB1 to LBm commonly to delete the whole latch information when the power supply is actuated. Incidentally, as the transfer gate in this drawing exemplifies, the transistor symbol for the gate of a P-type MISFET in drawings accompanying this specification will be marked with ○ while that of the gate of an N type MISFET will be marked in no way.

Now the operation of the control circuit MCC will be described. For example, it is supposed that NF(i−1) entered into the ith arbiter ARB(i−1) is ahead of the standard clock NCI1, and Nfi entered into the (i+1)th arbiter ARBi is behind the standard clock NCI1. Then a high level is supplied at every one of the outputs NQ0 to NQ(i−1) of the arbiters ARB0 to ARB(i−1), and every one of the outputs NQi to NQm of the arbiters ARBi to ARBm inverts the standard clock NCI1 and lets it pass as it is. Thus, out of the arbiters ARB0 to ARBm, the pair of adjoining arbiters whose outputs differ is that of ARB(i−1) and ARBi. Therefore, the logic circuit receiving the outputs NQ(i−1) and NQi of the arbiters ARB (i−1) and ARBi, respectively, supplies from its output NRi a signal resulting from the inversion of the standard clock NCI1, which is the output of NQi. As signals of the same level are entered into both inputs of the logic circuits PCL1 to PCL(i−1) and PLC(i+1) to PLCm, high level signals are supplied at all their outputs NR1 to NR(i−1) and NR(i+1) to NRm. Only NRi supplies a low level signal, and the latch circuit LBi receiving this signal supplies from its output NMi an inverted high level signal. As high level signals are entered into the respective inputs of the logic circuits LB1 to LB(i−1) and LB(i+1) to LBm, low level signals are supplied at all their outputs NM1 to NM(i−1) and NM(i+1) to NMm.

The functions required of the control circuit MCC described above are summed up below. Thus, the control circuit MCC has a plurality of first input terminals (NF0 to NFm) for receiving a plurality of delay clock signals differing in phase from each other, a second input terminal for receiving the standard clock (NCI1), and a plurality of output terminals (NM1 to NMm) provided to match said plurality of first input terminals. The control circuit MCC compares the phases of the plurality of delay clock signals differing in phase from each other and of the standard clock; selects at least one, out of the plurality of delay clock signals, having the phase closest to that of the standard clock; supplies a high level signal at the first output terminal (s) matching the first input terminal (s) into which the selected delay clock(s)is entered; and supplies a low level signal at all others of the plurality of first output terminals. Furthermore, it latches the result of comparison, and signals from the plurality of first output terminals are fixed.

The backward delay circuit array BDA0 consists of m+1 delay circuits BDE0 to BDEm connected in series. Each of the delay circuits BDE0 to BDEm commonly a first NAND circuit whose output is connected to one (open), and second and third NAND circuits connected in series. One input of the first NAND circuit is connected to the output of the second NAND circuit. One input of the third NAND circuit is connected to the output of the delay circuit of the preceding stage. The other inputs of the first and third NAND circuits are connected to Vcc.

While the other input terminal of the second NAND circuit of BDE0 is connected to Vcc, the output of a fourth NAND circuit is coupled to the other delay circuits BDE1 to BDEm. To one terminal of the fourth NAND circuit is commonly supplied an internal standard clock NCI3 from the clock buffer CB3, while the other terminal is connected to the output nodes NM1 to NMm of the control circuit MCC. Thus, the fourth NAND circuit serves as a sort of switch, resulting in the configuration that, because only one of NM1 to NMm supplies a high level output upon detection of synchronism by MCC, the internal standard clock NCI3 is entered from one delay circuit corresponding to that lock-in stage, followed by sequential propagation from there and delays of a predetermined number of stages are added until an output is supplied from BDE0.

This configuration makes possible matching of delay times of delay circuits with a smaller number of gates. Thus, delay circuits of the same circuitry form equal in delay time per stage are used for each of FDA and BDA0 so that delays in the forward and backward directions be equal. BDA0, having a plurality of input terminals, is subjected to a delay different with the position of the terminal where a clock is entered, and a delay of the same delay time as that applied by FDA is added.

Figure 3:
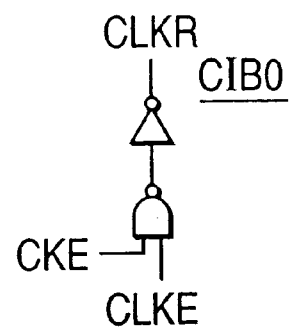
FIG. 3 illustrates an example of a clock input buffer CIB0.
Figure 4:
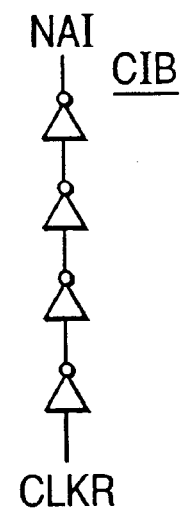
FIG. 4 illustrates an example of a clock input buffer CIB.
Figure 5:
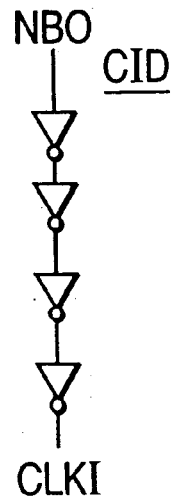
FIG. 5 illustrates an example of a clock driver.
Figure 6:
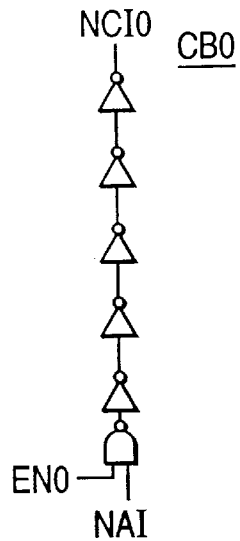
FIG. 6 illustrates an example of a clock buffer CB0.
Figure 7:
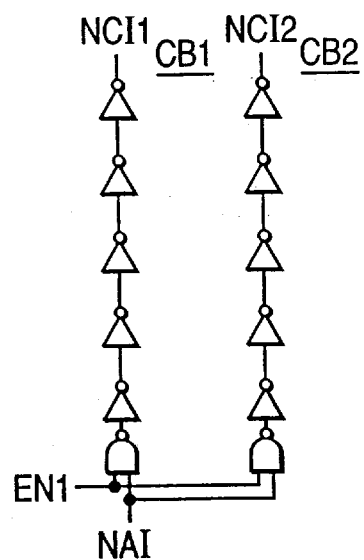
FIG. 7 illustrates an example of clock buffers CB1 and CB2.

FIGS. 3 to 8 illustrate specific examples of clock input buffer and clock driver. The clock input buffer CIB0 can be composed, as shown in FIG. 3, by connecting in series a NAND circuit to one of whose input terminals a clock input signal CKE is entered and an inverter. The clock input buffer CIB, as shown in FIG. 4, can be composed of an array of inverters known as a cascaded driver, intended to increase the drive capability. The clock driver CID can be composed, as shown in FIG. 5 for instance, of an array of inverters connected in series, intended to increase the drive capability. Each of the clock buffers CB0, CB1, CB2 and CB3, as respectively shown in FIGS. 6, 7 and 8, a NAND circuit into which a clock control signal EN0, EN1 or EN2 is to be entered and an array of inverters known as a cascaded driver, intended to increase the drive capability. These configurations make it possible to reduce the delay times in clock buffers by shortening the sequences of inverters known as cascaded drivers, intended to increase the drive capability, and to distribute standard clocks from NAI to NCI0, NCI1, NCI2 and NCI3 according to a clock control signal.

Figure 9:
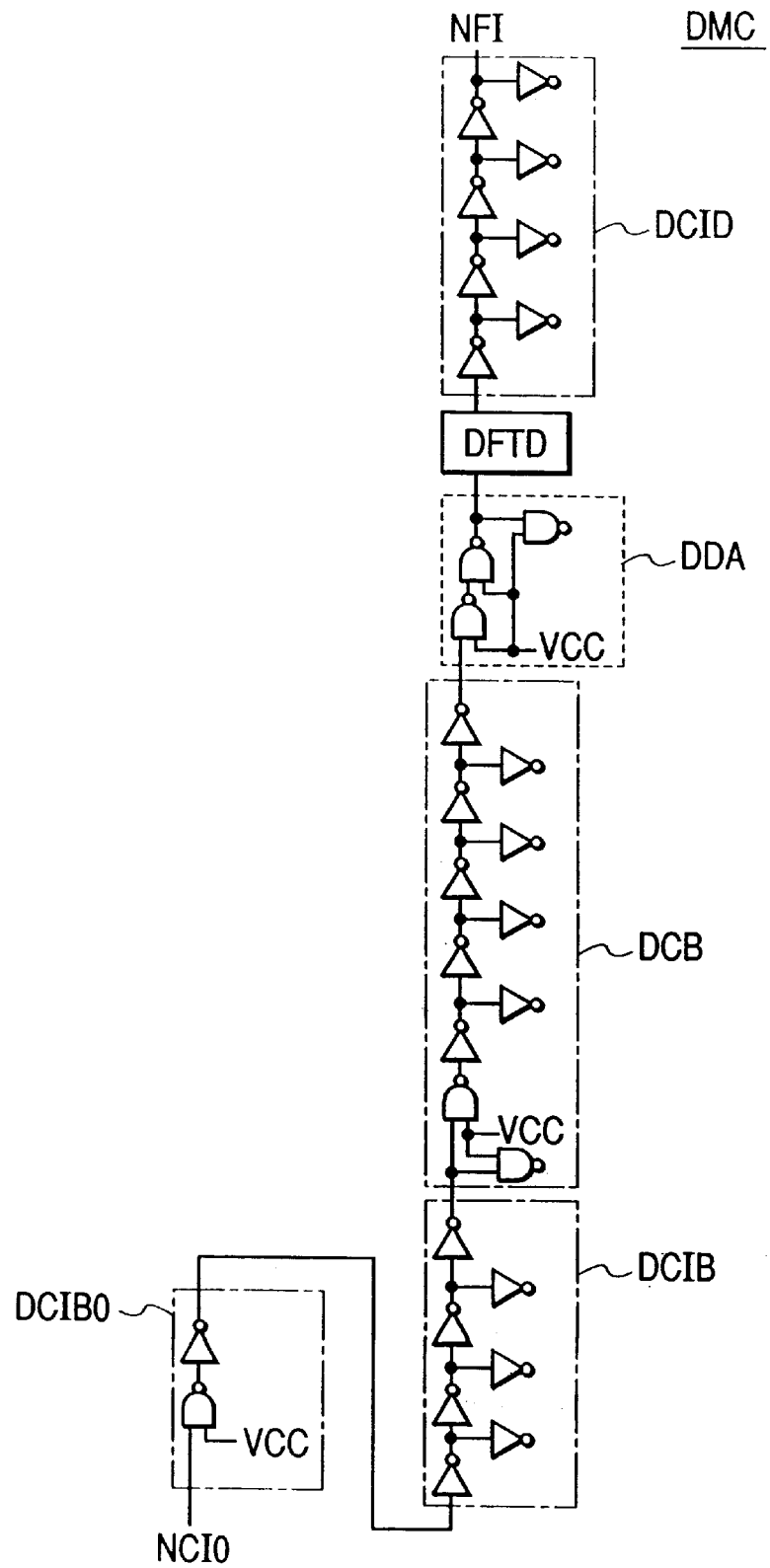
FIG. 9 illustrates an example of a delay monitor DMC.

The delay monitor DMC illustrated in FIG. 9 is intended to monitor the clock input buffers CIB0 and CIB; the clock buffers CB0, CB1, CB2 and CB3; the delay circuits FDE0 to FDEm constituting the forward delay circuit array; the delay circuits BDE0 to BDEm constituting the backward delay circuit array; the delay time fine tuning circuit FTD; and the clock driver CID. DMC consists of a dummy circuit DCIB0 for CIB0; a dummy circuit DCIB for CIB; a dummy circuit DCB for one of CB0, CB1, CB2 and CB3; a dummy circuit DDA for the delay circuits FDE0 to FDEm and BDE0 to BDEm; a dummy circuit DFTD for FTD; and a dummy circuit DCID for CID. A dummy circuit in this context is a circuit for equivalent creating the delay time of a circuit corresponding thereto. Into one input terminal each of the NAND circuits of the dummy circuits DCIB0, DCIB, DCB and DDA is entered a source voltage level VCC. Each of the dummy circuits DCIB, DCB and DCID consists of an array of inverters whose outputs are open, connected as loads. This configuration makes possible monitoring of the delay time of cascaded drivers without having to use inverters MOS transistors of a large gate width similar to CIB, CB0, CB1, CB2, CB3 and CID occupying large areas. Furthermore, NAND circuits whose outputs are open in the dummy circuit DCB have a load capacity equal to the gate capacity connected to the output of the clock input buffer CIB shown FIG. 1.

[1-2. Configuration of the Fine Tuning Clock Recovery Circuit]

Figure 2:
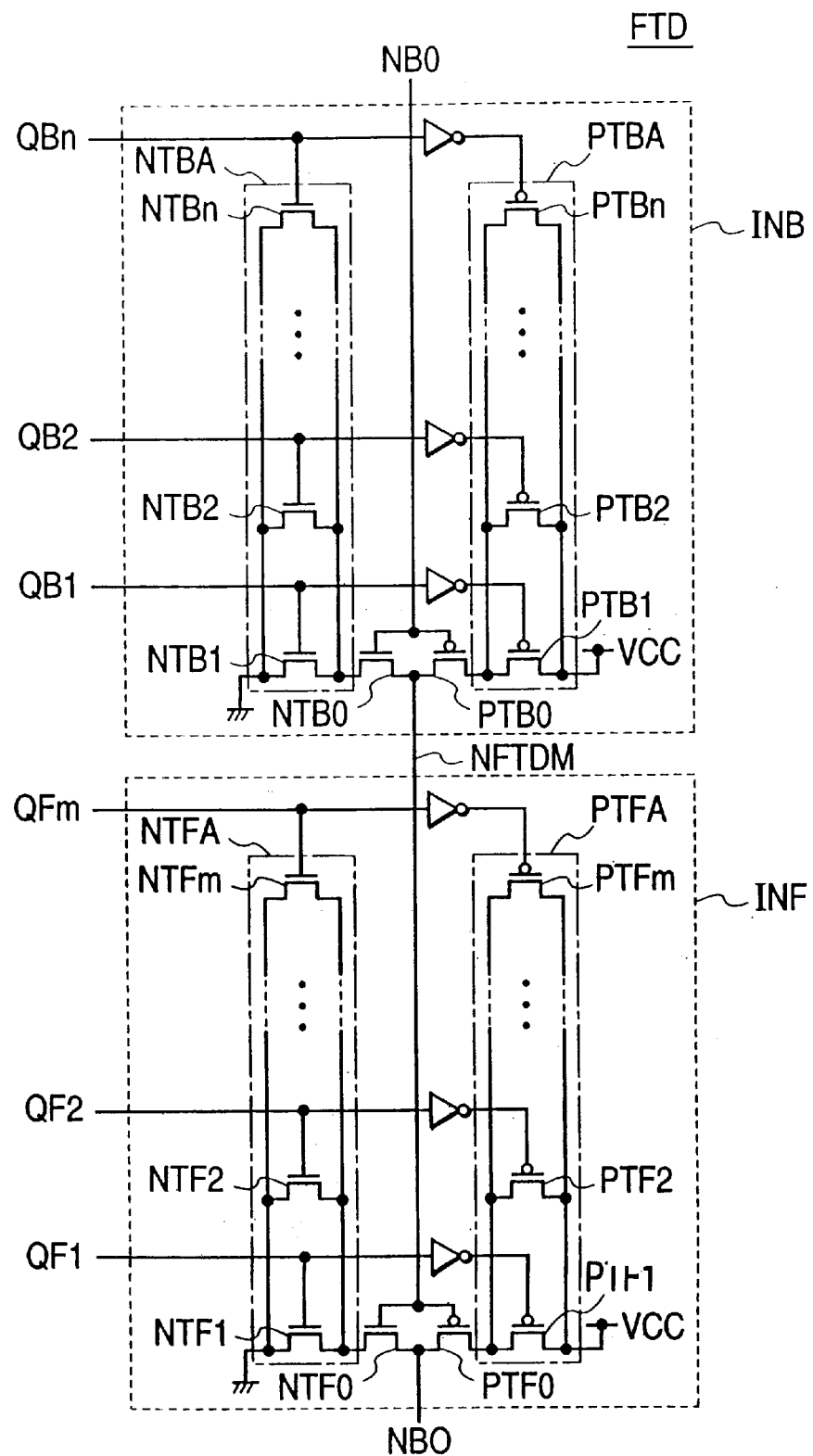
FIG. 2 illustrates an example of a delay time fine tuning circuit.

Next will be described the configuration of the fine tuning circuit FTC. The delay time fine tuning circuit FTD consists, as illustrated in FIG. 2 for example, of current limiting type inverters INF and INB connected in series. FTD is a variable delay circuit whose delay time can be finely varied in multiple stages. In the current limiting type inverter INB, a delay clock (NB0 in FIG. 1 for instance), which is the output of the backward delay circuit array BDA0, is entered into the gates of a P type MOS transistor PTB0 and an N type MOS transistor NTB0, connected to each other by drains; a current limiting P type MOS transistor array PTBA is connected between the source of the P type MOS transistor PTB0 and the power source; and an N type MOS transistor array NTBA is connected between the source of the current limiting N type MOS transistor NTB0 and the power source. PTBA consists of n P type MOSFETs PTB1 to PTBn, different in gate size, connected in parallel in the descending order of size. NTBA is also composed by connecting in parallel, in the descending order of size, n N type MOSFETs NTBs to NTBm, different in size, in a paired manner. Into the gates of PTB1 to PTBm and NTB1 to NTBm are entered complementary signals generated from control signals QB1 to QBn (supplied from a shift register SR to be described later), respectively, and one pair of P type and N type MOSFETs is selected and turned on. This enables the delay time to be adjusted in n stages each of a time length tdy. The current limiting type inverter INF is configured similarly to INB, and permits adjustment of the delay time in m stages. The graduation tdy of delay time adjustment in INF and INB may be, not should be, set to about 1⁄20 of the delay time by a delay circuit per stage of the coarse tuning circuit CTC, and preferably should be between 1⁄10 and 1⁄20.

To cite one example in which only the shift register outputs QBj and QFi are at a high level and all the others are at a low level, a pair of PTBj and NTBj are selected and turned on in INB while a pair of PTFi and NTFi are selected and turned on in INF, so that a delay time different from the delay time in the delay circuits FDE0 to FDEm of FDA and the delay circuits BDE0 to BDEm of BDA can be generated.

Figure 10:
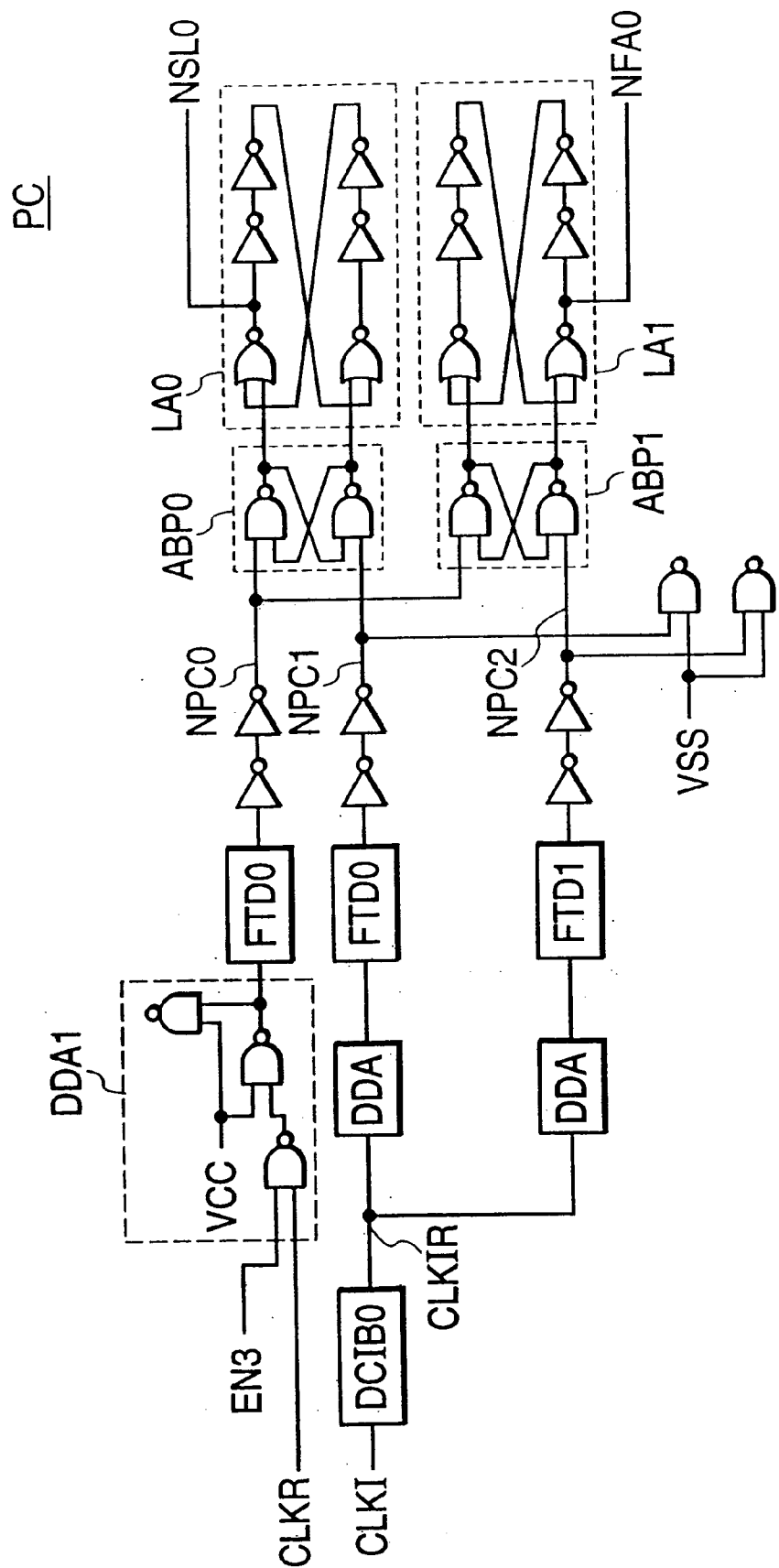
FIG. 10 illustrates an example of a phase comparator.

The phase comparator PC, as illustrated in FIG. 10, consists of the dummy circuit DCIB0; the dummy circuits DDA and DDA1 respectively of the delay circuits FDE0 to FDEm constituting the forward delay circuit array FDA and the delay circuits BDE0 to BDEm constituting the backward delay circuit array BDA0; the delay time fine tuning circuits FTD0 and FTD1; three pairs of waveform shaping delay circuits each consisting of two inverters connected in series; two arbiters ABP0 and ABP1; and two latch circuits LA0 and LA1.

For each of the arbiters ABP0 and ABP1, a similar circuit to what is commonly known as a RS latch is shown. To one input terminal of the arbiter ABP0 is connected an output NPC0 from an in-chip standard clock CLKR through the dummy circuit DDA1k, the delay time fine tuning circuit FTD0 and a waveform shaping delay circuit, and to the other input terminal is connected an output NPC1 from an internal clock CLKI through the clock input buffer DCIB0, the dummy circuit DDA, the delay time fine tuning circuit FTD0 and a waveform shaping delay circuit. To one input terminal of the arbiter ABP1 is connected a node NPC0, and to the other input terminal is connected an output NPC2 from the internal clock CLKI through the clock input buffer DCIB0, the dummy circuit DDA, the delay time fine tuning circuit FTD1 and a waveform shaping delay circuit (two inverters). Further to each of the nodes NPC1 and NPC2, in order to equalize their load capacities to that of the node NPC0, a NAND circuit of which one input terminal is connected to a ground voltage level VSS and the output terminal is open. As an example of latch circuits LA0 and LA1, each of which is a circuit commonly known as an RS circuit, there are shown ones each having two stages of inverters connected to the output terminal of two NOR circuits in order to remove shot pulse signals, and the respective output terminals thereof are connected two stages of inverters in series in a cross manner.

The example of dummy circuit DDA1 shown in FIG. 10 is a similar one to the dummy circuit DDA, with the only exception that DDA has a VCC instead of a node, into which EN3 is entered, in DDA1. The clock control signal EN3 of DDA1 is, for example the output signal of a clock counter, and is at a low level in the initial state. However, when =the internal clock CLKI derived from an external clock CLKE through the clock recovery circuit shown in FIG. 1 is entered into the clock counter, the clock control signal EN3 changes its level from low to high, and an in-chip standard clock CLKR is supplied to the node NPC0. As the internal clock CLKI is also supplied to NPC1 and NPC2 then, the phase comparator PC shown in FIG. 10 begins phase comparison after the internal clock CLKI is supplied. This prevents competition with the coarse tuning circuit CTC.

As the two delay time fine tuning circuits FTD0 and FTD1, ones similar to FTD shown in FIG. 2 are used, except that they are set in a state where in a different pair of current limiting MOS transistors different from those in FTD0 and FTD1 are selected. In other words, FTD0 and FTD1 are so set as to generate different delay times. The setting is accomplished by designing a wiring arrangement to connect the gate control signal to a predetermined potential. Preferably, selection after completion can be accomplished with a fuse or the like if any fine tuning is required. An in-chip standard clock (CLKR in FIG. 1 for instance) is entered into one of the first delay circuits, and the internal clock CLKI is entered into the other first delay circuit and the second delay circuit.

As an example, it is supposed that the delay time in the delay time fine tuning circuit FTD1 is longer by Δtdz than that in FTD0. For this Δtdz, which is the width of insensitive time (i.e. the accuracy of phase determination) of the phase comparator PC, an appropriate value should be chosen, because infinitesimal Δtdz would adversely affect stability and invite the occurrence of jitter. If the rise of the output CLKIR from the internal clock CLKI through the dummy circuit DCIB0 then is slower by Δtdz than that of the in-chip standard clock CLKR, a high level signal NSL0 is supplied as long as CLKR stays at its high level. Or if the rise of the output CLKIR is faster by Δtdz than that of the in-chip standard clock CLKR, a high level signal NFA0 is supplied as long as CLKIR stays at its high level. On the other hand, if the lag between the rise of CLKIR and that of CLKR (timing error) is smaller than Δtdz, the phase comparator outputs NSL0 and NFA0 remain at a low level.

Figure 11:
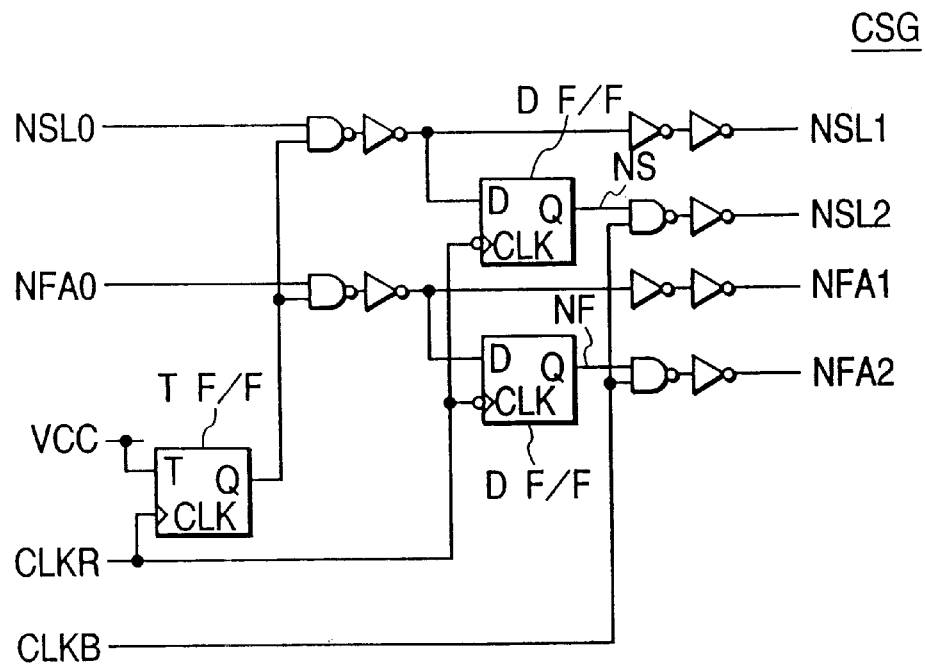
FIG. 11 illustrates an example of a shift register control signal generating circuit.

A shift register control signal generating circuit CSG illustrated in FIG. 11 consists of one T flip-flop T F/F, two D flip-flops D F/F, logic circuits consisting of NAND circuits and inverter circuits, a cascaded driver consisting of two inverters for enhancing the drive capability. T F/F can be composed of a circuit known as a JK flip-flop usually consisting of an RS latch. By connecting its input terminal to the source voltage VCC and its enable signal terminal to the in-chip standard clock CLKR, T F/f is caused to generate a high level signal in an even-numbered clock cycle time and a low level signal in an odd-numbered clock cycle time from the entry of the clock signal CLKE. D F/F can be composed of master-slave flip-flops or edge trigger flip-flops cause to operate on enable signals of opposite phases between the former and latter stages usually by two stage cascade connection of RS latches. By connecting the enable signal terminal to the in-chip standard clock CLKR, it is so disposed that the output value varies only when at the time of transition of the external clock signal.

As an example, it is supposed that the phases of the in-chip standard clock CLKR and of the internal clock CLKI are compared, and the phase comparator output NSL0 is raised to a high level, and entered into one input terminal of the NAND circuit. As the output Q of the T flip-flop which takes on a high level in an even-numbered clock cycle time from the entry of the external clock signal CLKE is then connected to the other input terminal of the NAND circuit, a high level shift register control NSL1 is generated by the phase comparator output NSL0 in an even-numbered clock cycle time from the entry of the external clock signal CLKE. Further, as the level of the shift register control signal NSL1 is held by a D flip-flop from the time this even-numbered internal standard clock falls to a low level and it takes on a low level again at the next such clock cycle, the entry of this signal NSL1 and a bar signal CLKB of the internal clock CLKI into the NAND circuit results in the generation of a high level shift register control signal NSL2. In the same manner as in the example described so far, shift register control signals NFA1 and NFA2 are generated from the phase comparator output NFA0.

Figure 12:
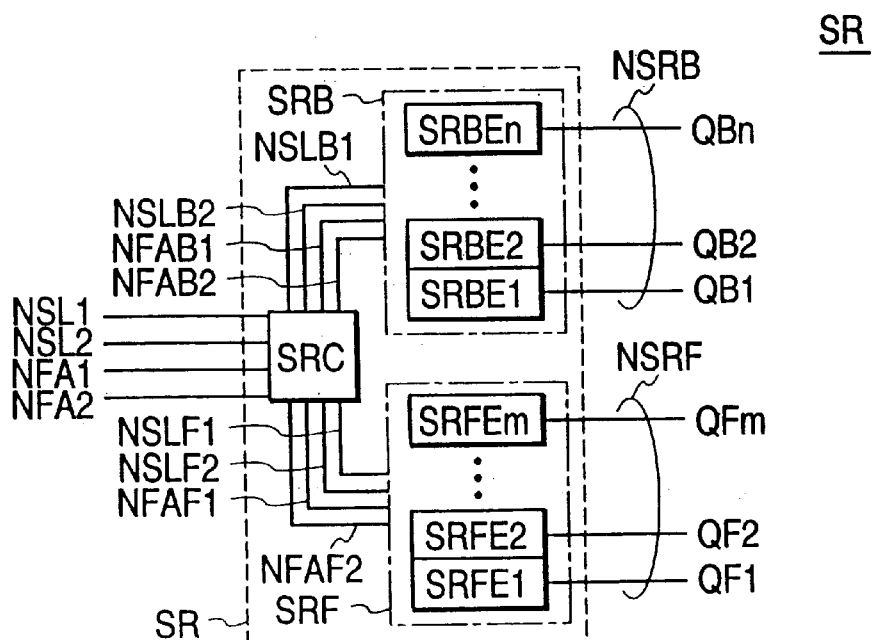
FIG. 12 illustrates an example of a shift register circuit.

A shift register SR illustrated in FIG. 12 can be composed of a shift register SRF consisting of m latch circuits and a shift register SRB consisting of n latch circuits. Each of the shift registers SRF and SRB is a master-slave type consisting of two sets of latch circuits, and are bidirectional shift registers controlled with shift register control signals NSLF1 and NSLF2, NFAF1, NFAF2, NSLB1 and NSLB2, NFAB1 and NFAB2 generated by entering shift register control signals NSL1 and NSL2, NFA1 and NFA2 into a shift register control circuit SRC. Each of the shift registers SRF and SRB can be controlled so that only one each of shift register outputs QF1 to QFm and QB1 to QBn, respectively, take on a high level and all the rest be at a low level. Furthermore, each of the shift registers SRF and SRB can be controlled so that, when the position of the shift register providing a high level in one shift register changes, the position of the shift register providing a high level in the other shift register do not change.

As an example, it is supposed that the shift register outputs QFi and QB1 are at a high level and all the other shift register outputs QF1 to QF(i−1), QF(i−1) to QFm and QB2 to QBn are at a low level in the initial state. When shift register control signals NSL1 and NSL2 at a low level and NFA1 and NFA2 of a high level are then entered into the shift register SR, the shift register control circuit can generate NSLF1, NSLF2, NSLB1, NSLB2, NFAB1 and NFAB2 of a low level and NFAF1 and NFAF2 of a high level. It is thereby made possible to have the shift register outputs QF(i+1) and QB1 at a high level and all the others including QF1 to QFi, QF(i+2) to Qfm and QB2 to QBn at a low level in a time length of two clock cycles of the external clock.

Meanwhile, if in the same initial state as in the above-described NFA1 and NFA2 of a low level and NSL1 and NSL2 of a high level are entered into the shift register SR, the shift register control circuit can generate NFAF1, NFAF2, NSLB1, NFAB1 and NFAB2 of a low level and NSLF1 and NSLF2 of a high level. It is thereby made possible to have the shift register outputs QF(i−1) and QB1 at a high level and all the others including QF1 to QF(i−2), QFi to QFm and QB2 to QBn at a low level in a time length of two clock cycles of the external clock.

[1-3. Operation of the Coarse Tuning Clock Recovery Circuit]

Since the clock recovery circuit of FIG. 1 consists to two circuits, i.e. the coarse tuning circuit CTC and the fine tuning circuit FTC, different parts operate in response to clock control signals EN0, EN1 and EN2. As an example to begin with, the basic operation of the coarse tuning circuit CTC will be described with reference to FIG. 13, wherein the clock cycle time is relatively long (the clock cycle time tCK is about twice as long as the delay time tDMC of the delay monitor), and the internal clock CLKI is generated about 3 clock cycles behind the entry of a clock enable signal CKE.

First, the outputs NM1 to NMm of the latch circuits LB1 to LBm are initially at a low level because a power-on reset signal PO of a high level is entered when the power supply is turned on. This reset signal POR is generated in a predetermined sequence by the voltage of operating power supplied from outside, with a power supply monitor being provided in the semiconductor apparatus whereon the clock recovery circuit is mounted. Particularly where it is used to be in an SDRAM or the like to be described later, it is preferable to make it resettable by a command (a mode setting command of the SDRAM) to provide for actions to substantially vary the operational clock or the like. A dedicated reset terminal (pin) may be provided, depending on the conditions of the apparatus. The clock control signals EN0 and EN1 are set at a high level, and EN2, at a low level.

Next, when the clock enable signal CKE takes on a high level, the external clock CLKE is supplied from the clock input buffer CIB0 to a node CLKR, and further supplied to a node NAK through the clock input buffer CIB. The number of this clock is counted with a known counter to a number set by, for instance a mode register to control the clock control signals EN0, EN1 and EN2, and clocks of the node NAI are distributed to different parts of the coarse tuning circuit CTC.

First, as the clock control signal EN0 is at a high level, the in-chip standard clock CLKR is supplied from the clock buffer CB0 to the node NCI0, and entered into the forward delay circuit array FDA through the delay monitor DMC to be successively propagated in the delay circuits FDE0 to FDEm in FDA. The in-chip standard clock CLKR is also supplied from the clock buffer CB1 to the node NCI1 because the clock control signal EN1 is at a high level. Therefore, the pulses of the output nodes NF0 to NFm of the delay circuits FDE0 to FDEm by the control circuit MCC, and compared by the arbiters ARB0 to ARBm with the pulse of the output node NC11 of the clock input buffer CIB1 with respect to the rise timing.

Figure 13:
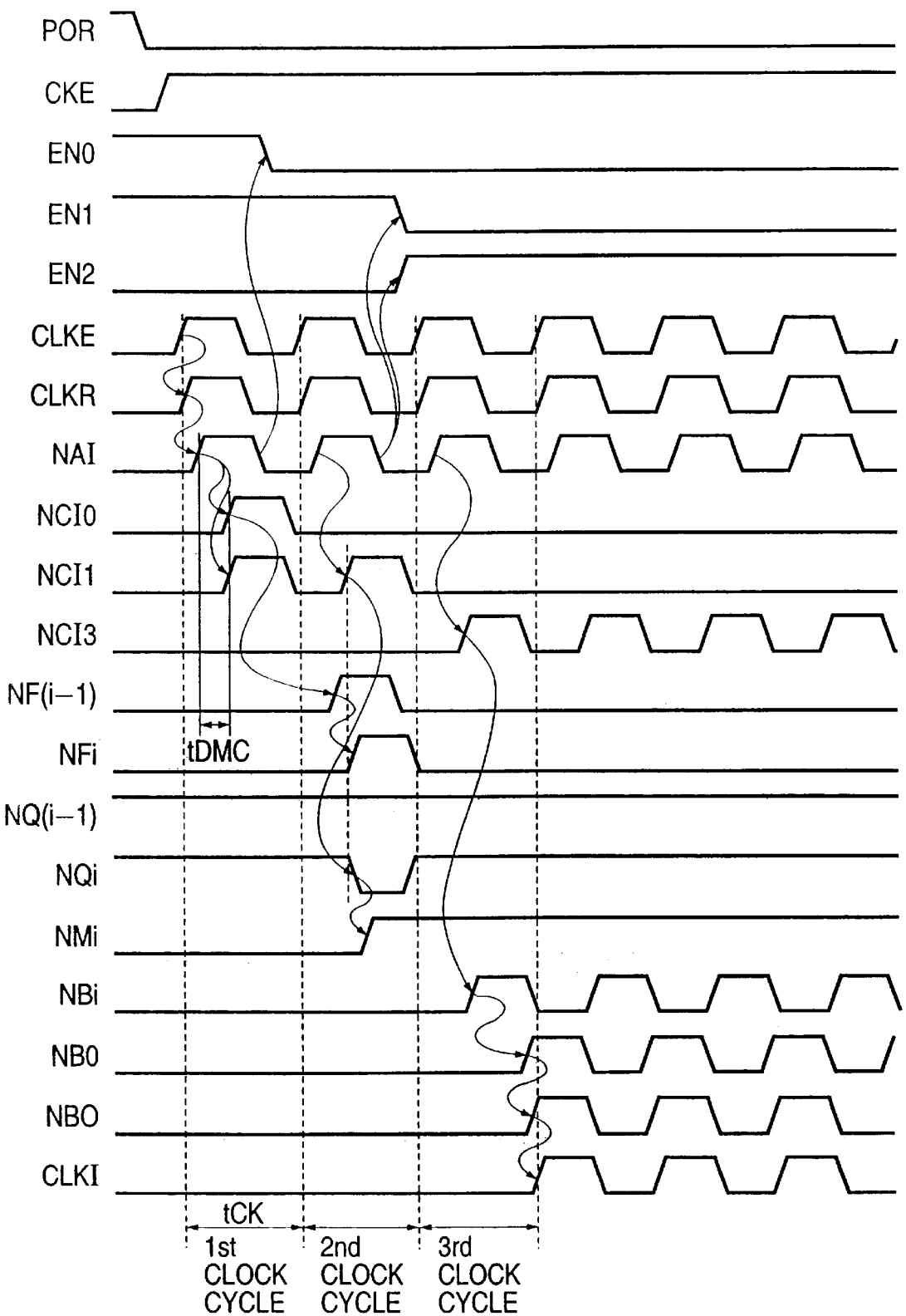
FIG. 13 illustrates the basic operation of a coarse tuning circuit when the clock cycle time of the clock recovery circuit of FIG. 1 is relatively long.

As illustrated in FIG. 13, in the basic operation, NCI1 rises for the second time between the rise of the input $NF(i-1)$ to the $(i+1)$th delay circuit FDEi and the rise of the output NFi. Thus, detection of synchronism in MCC is carried out in two clock cycles. In the arbiters ARB0 to ARB(i-1) until the ith, a high level is maintained until the inputs NF0 to NF(i-1) go down to a low level because the inputs NF0 to NF(i-1) rise earlier than NCI1. On the other hand, in the arbiters ARBi to ARBm from the $(i+1)$th and onward, the outputs NQi to NQ fall to a low level when NCI1 1 rises and rise to a high when NCI1 falls, because the inputs NFi to NFm rise later than NCI1. Thus, the pulse of NCI1 passes the arbiters ARBi to ARBm as it is. These outputs entered into the logic circuits PCL1 to PCLm, and the outputs of adjoining arbiters are compared. As a result, the output of PCLi alone, which receives the output $NQ(i-1)$ and the output of NQi, out of the logic circuits PCL1 to PCLm, takes on a low level. When the outputs NR1 to NRm of these logic circuits PCL1 to PCLm are entered into the latch circuits LB1 to LBm, and the output NMi of only the latch circuit LBi out of them takes on a high level.

In order to make possible the operation so far described, the clock control signal EN0 should remain at a high level by all means as long as the first clock at the node NAI is at a high level. Also, the clock control signal EN1 should remain at a high level by all means as long as the second clock at the node NAI is at a high level. Further, to fix the outputs of the latch circuits LB1 to LBm immediately after the generation of the outputs NR1 to NRm of the logic circuits PCL1 to PCLm, the clock control signal EN1 should be shifted in level from high to low when the second clock at the node NAI shifts in level from high to low. Once the outputs of the latch circuits LB1 to LBm are fixed, the forward delay circuit array FDA can be stopped by keeping the clock control signal EN0 at a low level. Thus, once the lock-in condition of the internal clock is determined by MCC, that information held by the latch circuits. Therefore, it is no longer necessary to supply the internal standard clock to FDA and MCC. Accordingly, stopping the supply of the internal standard clock for EN0 and EN1 at a timing with established stops the actions of many gate circuits in FDA and MCC and thereby greatly contributes to saving the consumption of power. This point is an important feature of using latch circuits for the output of MCC.

On the other hand, the reason for initial setting of the clock control signal EN2 at a low level is that it permits the backward delay circuit array BDA0 to be stopped when FDA and the control circuit MCC are at work. However, after the outputs of the latch circuits LB1 to LBm are fixed, the clock control signal EN2 is raised to a high level before the third clock at the node NAI rises to a high level, i.e. when the second clock at the node NAI falls in level from high to low. Then, the third clock at the node NAI is entered from the clock buffer CB3 through the node NCI3 into the delay circuit BDE1 in the backward delay circuit array BDA0.

To keep the outputs NM1 to $NM(i-1)$ and $NM(i+1)$ to NMm of the latch circuits LB1 to $LB(i-1)$ and $LB(i+1)$ to LBm at a low level, no in-chip standard clock CLKR is entered into the delay circuits BDE1 to $BDE(i-1)$ and $BDE(i+1)$ to BDEm, and the delay circuits $BDE(i-1)$ to BDE1 successively propagate pulses. A pulse supplied from the backward delay circuit array BDA0 to the node NB0 is further supplied to the node NB0 through the delay time fine tuning circuit FTD set to any desired delay time, and finally is amplified by the clock driver CID to be supplied as the internal clock CLK1. As the same delay as what was added in FDA is added in BDA0, the delay on the route from the external clock CLKE to the internal clock CLKI is 1 cycle. Eventually, the internal clock CLK1 is generated 3 cycles after the external clock CLKE is entered to fix the clock route.

While an example of operation to fix the latch circuits LB1 to LBm upon comparing phases only once was described above with reference to FIG. 13, if the mode register is set according to the number of times phases are compared and to the clock cycle time, the internal clock can be generated by appropriately controlling the clock control signals EN0, EN1 and EN2.

Figure 14:
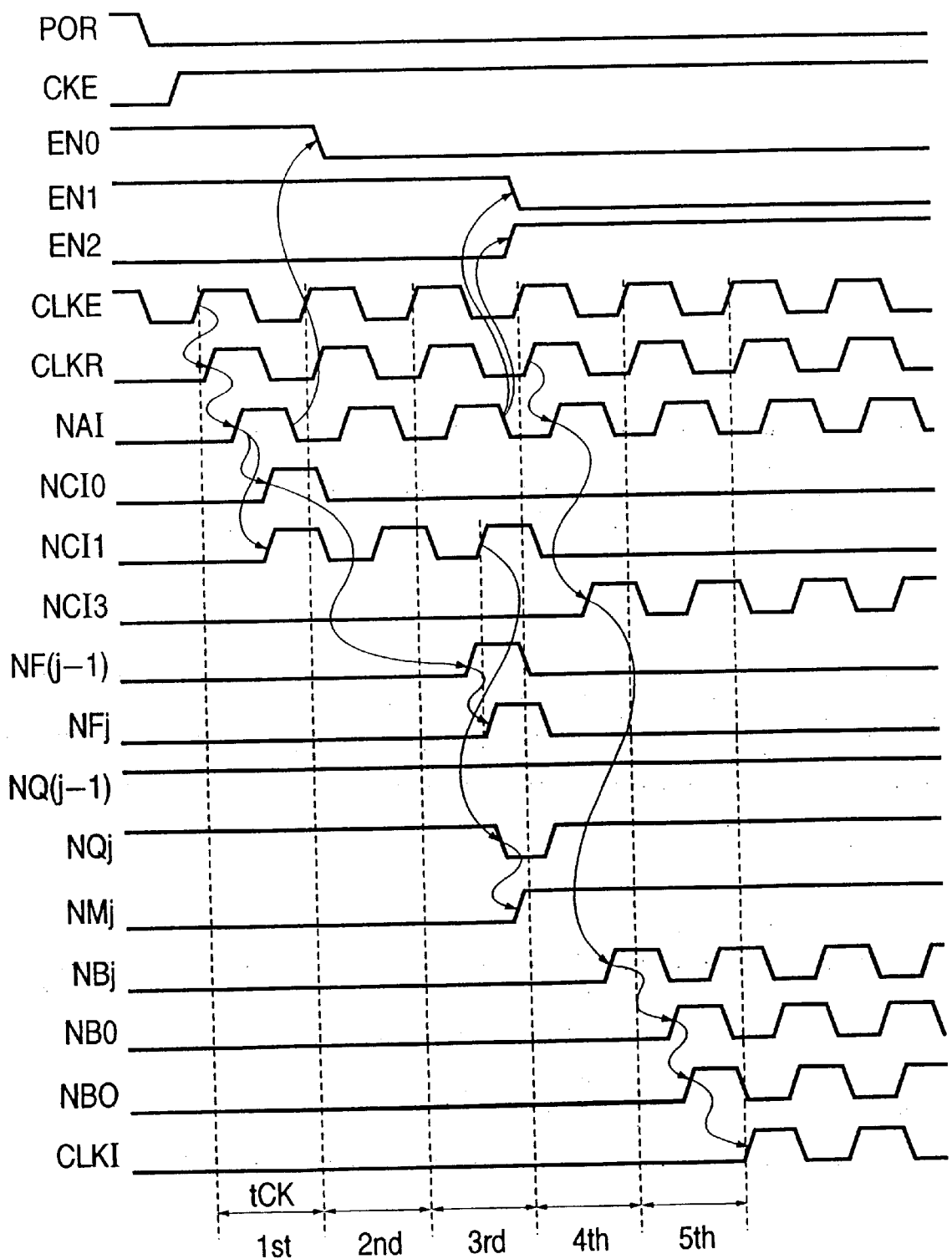
FIG. 14 illustrates the basic operation of a coarse tuning circuit when the clock cycle time of the clock recovery circuit of FIG. 1 is relatively short.

Now, as another example, FIG. 14 illustrates the operation of the coarse tuning circuit CTC to generate the internal clock CLK1 5 clock cycles behind the entry of the clock enable signal CKE when the clock cycle time is short (the clock cycle time tCK is short relative to the delay time tDMC of the delay monitor).

First, the outputs NM1 to NMm of the latch circuits LB1 to LBm are initially at a low level because the power-on resetting signal POR of a high level is entered when the power supply is turned on. The clock control signals EN0 and EN1 are at a high level, and EN2, at a low level. When the clock enable signal CKE takes on a high level, the external clock CLKE is entered from the clock input buffer CIB through the delay monitor DMC into the forward delay circuit array FDA. Here, when $$tCK < tDMC \qquad (EQ. 1)$$

holds, the node NAI rises for the second time before the input node NFI of FDA rises. In this case, there exists no delay circuit FDE1 where the second rise of NC11 would take place after the input $NF(i-1)$ rises and before the output NFi rises, and the delay time required for delaying the action of the node NC10 by 1 clock cycle cannot be figured out as the number of stages of delay circuits within FDA. However, the pulse entered into the node NF1 successively propagates to the delay circuits FDE0 to FDEm, and there exists the delay circuit FDEj where the third rise of NC11 takes place after the input $NF(j-1)$ rises and before the output NFj rises. Therefore, when the clock cycle time has the relationship of EQ. 1, the arbiters ARB0 to ARBm should compare with respect to phase the clock at the plurality of outputs NF0 to NFm of FDA from the node NAI through the clock buffer CB0 and the standard clock NC11 of two cycles later from the node NAI through the clock buffer CB1.

Therefore, the clock control signal EN0 should remain at a high level by all means as long as the first clock at the node NAI is at a high level. Also, the clock control signal EN1 should remain at a high level by all means as long as the third clock at the node NAI is at a high level. Further, to fix the outputs of the latch circuits LB1 to LBm immediately after the generation of the outputs NR1 to NRm of the logic circuits PCL1 to PCLm, the clock control signal EN1 should be shifted in level from high to low when the third clock at the node NAI shifts in level from high to low.

Once the outputs of the latch circuits LB1 to LBm are fixed, the forward delay circuit array FDA can be stopped by keeping the clock control signal EN0 at a low level. On the other hand, the reason for initial setting of the clock control signal EN2 at a low level is that it permits the backward delay circuit array BDA0 to be stopped when the forward delay circuit array FDA and the control circuit MCC are at work. However, after the outputs of the latch circuits LB1 to LBm are fixed, the clock control signal EN2 is raised to a high level before the fourth clock at the node NAI rises to a high level, i.e. when the third clock at the node NAI falls in level from high to low. Then, the fourth clock at the node NAI is entered from the clock buffer CB3 through the node NCI3 into the delay circuit BDEj in the backward delay circuit array BDA0.

To keep the outputs NM1 to NM(j−1) and NM(j+1) to NMm of the latch circuits LB1 to LB(j−1) and LB(j+1) to LBm at a low level, no in-chip standard clock CLKR is entered into the delay circuits BDE1 to BDE(j−1) and BDE(j+1) to BDEm, and the delay circuits BDE(j−1) to BDE1 successively propagate pulses. A pulse supplied from BDA0 to the node NB0 is further supplied to the node NB0 through FTD set to any desired delay time, and finally is amplified by the clock driver CID to be supplied as the internal clock CLK1. As the same delay as what was added in FDA is added in BDA0, the delay on the route from the external clock CLKE to the internal clock CLKI is 1 cycle. Eventually, the internal clock CLK1 is generated 5 cycles after the external clock CLKE is entered to fix the clock route.

As illustrated in FIG. 14, even if the clock cycle time tCK is shorter than the delay time tDMC of the delay monitor, the internal clock CLKI synchronized with the external clock CLKE can be supplied by changing the setting of the mode register and appropriately controlling the clock control signals EN0, EN1 and EN2. Further, if the external clock cycle time is short, the internal clock CLKI can be supplied 7, 9, . . . clock cycles after changing the setting of the mode register and entering the external clock CLKE.

As illustrated in FIGS. 13 and 14, the coarse turning circuit CTC shown in FIG. 1 figures out, in terms of the number of stages of delay circuits in the forward delay circuit array, the delay time required for delaying the clock by a clock cycle time equal to an integral multiple with respect to the node NCI0, and effects a further delay equivalent to that number of stage in the backward delay circuit array BDA. Thus, the external clock CLKE is delayed by an equivalent of n clock cycles (n is 1 or a greater integer) to determine the clock propagating route; the clock propagation route is fixed at the next clock cycle; and the internal clock CLKI is supplied by delaying the external clock CLKE by an equivalent of n clock cycles. Therefore, the internal cock CLKI is generated (2n+1) clock cycles after the clock enable signal CKE is entered. Once synchronization is carried out with this setting-up action, when CTC is to be restored from a standby state by raising the level of the clock enable signal CKE in FIG. 1, for example, from low to high, the internal clock synchronizing condition is held in a latch circuit within MCC unless the power-on resetting signal POR is entered, so that the internal clock CLKI is generated n clock cycles after the clock enable signal CKE is entered. Where the clock cycle time is relatively long, the internal clock can be generated in only 1 cycle.

The foregoing description affirms that the CTC shown in FIG. 1, as it has latch circuits in MCC, can stop the gates of FDA and MCC and, as it can make the lock cycle at the time of returning from a standby state shorter than at the time of setting up, can effectively save power consumption.

[1-4. Operation of the Fine Tuning Clock Recovery Circuit]

Next will be described with reference to FIG. 15 the operation of the fine tuning circuit FTC shown in FIG. 1. It is supposed that the internal clock CLKI has been generated by the coarse tuning circuit CTC. The phase comparator PC illustrated in FIG. 10 compares the rise timing of the in-chip standard clock CLKR of an even-numbered clock from the time the clock enable signal CKE takes on a high level and the external clock CLKE is entered into the clock recovery circuit shown in FIG. 1 with the rise timing of the output CLKIR from the CLKI through the dummy circuit DCIB0.

If the rise timing of CLKIR here is earlier than that of the 2kth in-chip standard clock CLKR and the difference is greater than the delay time difference $\Delta tdz$ between the delay time fine tuning circuits FTD0 and FTD1, the arbiter ABP1 and the latch circuit LA1, shown in FIG. 10, cause the phase comparator output NFA0 of a high level to be supplied as long as the internal clock CLKI is and, as the output Q of T F/F in the shift register control signal generating circuit CSG, shown in FIG. 11, is also at a high level, the shift register control signal NFA1 is supplied through a cascaded driver. The output NFA0 of the phase comparator PC is entered into one input terminal of the NAND circuit in the shift register control signal generator circuit CSG through D F/F and further, when a clock bar signal, resulting from the inversion of the output signal of the clock driver CLKD, entered into the other input terminal of the NAND circuit takes on a high level, the shift register control signal NFA2 is supplied.

Figure 15:
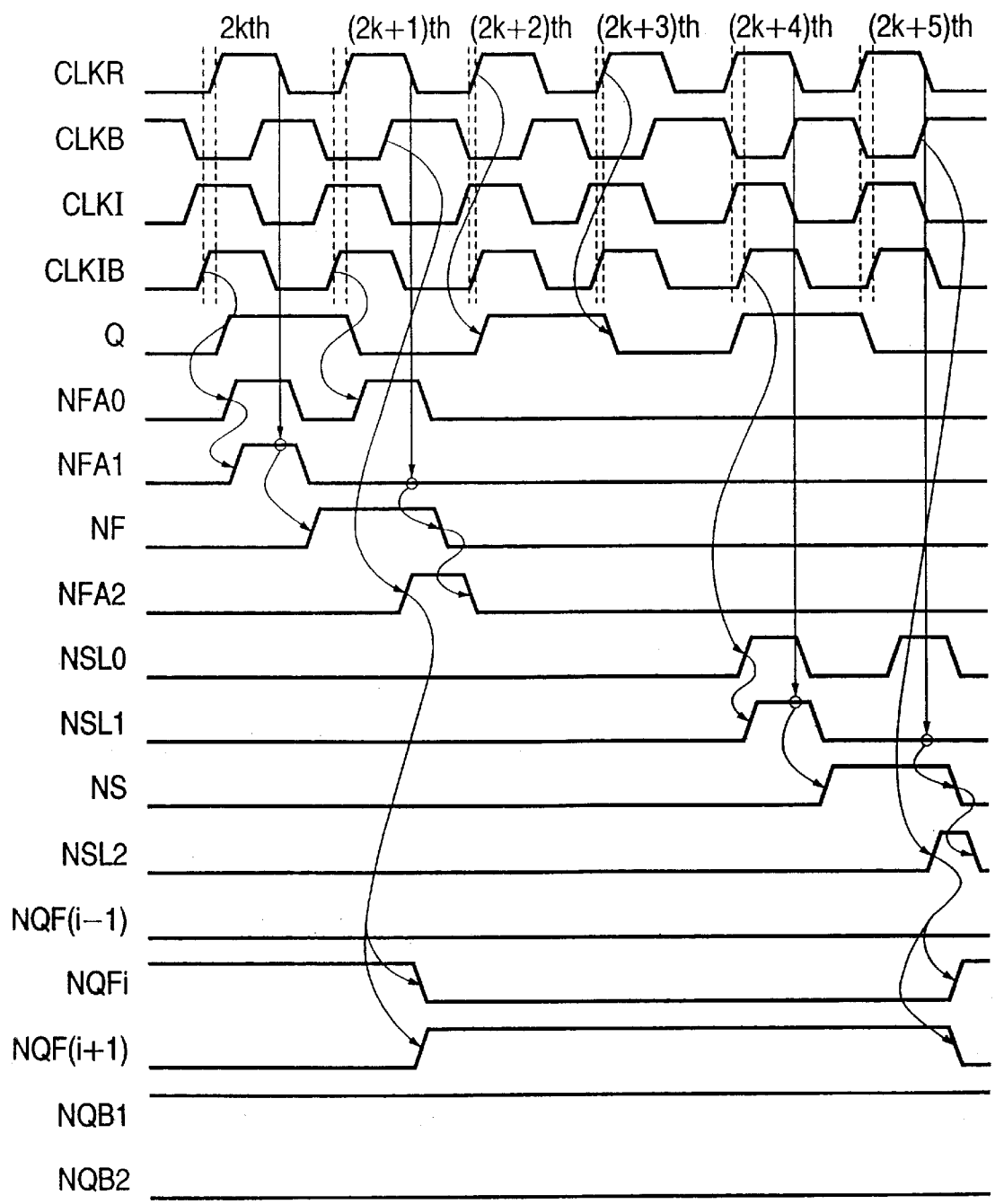
FIG. 15 illustrates the operation of the fine tuning circuit of the clock recovery circuit of FIG. 1.

As illustrated in FIG. 15, when the shift register output signals QFi and QB1 are set at a high level and the other signals QF1 to QF(i−1), QF(i+1) to QFm and QB2 to QBn are set at a low level within (2 k−1) clock cycles, the shift register control signal NFA1 is entered in 2 k clock cycles and NFA2 is further entered in (2 k+1) clock cycles, resulting in the occurrence of the transition of QFi from a high to a low level and that of QF(i+1) from a low to a high level. Thus, by changing the current limiting MOSFET to be selected in FTD from a combination of PTFi, NTFi, PTB1 and NTB1 to another of PTF(i+1), NTF(i+1), PTB1 and NTB1, the delay time of the clock propagating in FTD can be delayed to reduce the timing error between the rise of the internal clock CLKI and that of the external clock CLKE. When the rise of the clock CLKIR here is earlier than the (2 k+1)th in-chip standard clock CLKR and the difference is greater than the delay time difference $\Delta tdz$ between FTD0 and FTD1, the phase comparator PC generates the phase comparator output NFA0. However, since the output Q of T F/F in the shift register control signal generating circuit CSG is at a low level, the shift register control signals NFA1 and NFA2 are not generated, and no transition of the signal level occurs in the shift register outputs QF1 to QFm and QB1 to QBn in (2 k+2) clock cycles. Thus, the shift register is controlled at 2 cycle intervals.

Then, if the rise timing of the clock CLKIR is earlier than that of the (2 k+2)th and (2 k+3)th in-chip standard clocks CLKR and the difference is smaller than $\Delta tdz$, the phase comparator outputs NFA0 and NSL0 remain at a low level, and therefore no signal level transition takes place in the shift register outputs QF1 to QFm and QB1 to QBn.

On the other hand, if the rise timing of the clock CLKIR is later than that of the (2 k+4)th clock CLKR, the arbiter ABP0 and the latch circuit LA0 cause the phase comparator output NSL0 of a high level to be supplied as long as CLKI is and, as the output Q of T F/F in the shift register control signal generating circuit CSG is also at a high level, the shift register control signal NSL1 is supplied through a cascaded driver. The output NSL0 of the phase comparator PC is entered into one input terminal of the NAND circuit in the shift register control signal generator circuit CSG through D F/F and further, when a clock bar signal, resulting from the inversion of the output signal of the clock driver CLKD, entered into the other input terminal of the NAND circuit takes on a high level, the shift register control signal NSL2 is supplied.

Referring to FIG. 15, as QF(i+1) and QB1 are set at a high level and QF1 to QFi, QF(i+2) to QFm and QB2 to QBn are set at a low level within (2 k+3) clock cycles, the shift register control signal NSL1 is entered in (2 k+4) clock cycles. Then the shift register control signal NSL2 is entered in (2 k+5) clock cycles, and QF(i+1) shifts from a high to a low level while QFi shift from a low to a high level. Thus, by changing the current limiting MOSFET to be selected in the delay time fine tuning circuit from a combination of PTF(i+1), NTF(i+1), PTB1 and NTB1 to another of PTFi, NTFi, PTB1 and NTB1, the delay time of the clock propagating in FTD can be advanced to reduce the timing error between the rise of the internal clock CLKI and that of the external clock CLKE. However, because the shift register is controlled at 2 cycle intervals as stated above, though the phase comparator PC generates the phase comparator output NSL0 when the rise timing of the clock CLKIR is later than the (2 k+5) th in-chip standard clock CLKR; however, since the output Q of T F/F in the shift register control signal generating circuit CSG is at a low level, the shift register control signals NSL1 and NSL2 are not generated, and no transition of the signal level occurs in the shift register outputs QF1 to QFm and QB1 to QBn in (2 k+5) clock cycles.

As described above, this fine tuning circuit FTC determines with the phase comparator PC the timing error between the rise of the in-chip standard clock CLKR and that of the output CLKIR from the internal clock CLKI through the dummy circuit DCIB0, controls the shift register with a signal generated on the basis of the result of determination to consecutively select the current limiting MOS transistor for generating a delay time required by the delay fine tuning circuit FTD, and thereby reduces the timing error between the rise of the external clock CLKE and that of the internal CLKI Since the position where the output is at a high level in the shift register SR can be shifted bidirectionally as stated above, it is possible to reduce the timing error between the rise of the external clock CLKE and that of the internal CLKI following variations in chip temperature and external clock frequency occurring while the clock recovery circuit shown in FIG. 1 is operating. Therefore, if the FTC has a configuration in which the delay time fine tuning circuits FTD shown in FIG. 2 are connected in series in multiple stages, it is possible to follow even greater variations in the operating environment in supplying an internal clock reduced in timing error. Also, as the fine tuning circuit FTC performs fine tuning after coarse tuning to fix the clock pulse propagation route in the coarse tuning circuit CTC with the latch circuits LB1 to LBm, there is no possibility for a double feedback loop to emerge.

[1-5. Simulation of Operation]

Now are considered the time required to obtain an output the timing error between the rise of the external clock CLKE and that of the internal CLKI in the operation of FIG. 13. The delay time of the delay monitor DMC is represented by tDMC, and the delay time per stage of the delay circuits FDE0 to FDEm and BDE0 to BDEm as well as the delay time DDA equivalent thereto, by tD. Further, the note NC11 is supposed to rise behind the rise of the input NF(i−1) to the ith arbiter ARB(i−1) by a time Δt, where $$\Delta t < tD \quad (EQ. 2)$$

The clock cycle time tCK can be represented by $$tCK = tDNC + i \cdot tD + \Delta t \quad (EQ. 3)$$

from the cycle of the node NC10. Further, with the delay time in the control circuit MCC being represented by tMCC; the delay time of the clock input buffer CIB0, by tCIB0; the delay time of the clock input buffer CIB, by tCIB; the delay time of the clock buffers CB0, CB1, CB2 and CB3, by tCB, the delay time of the delay time fine tuning circuit FTD, by tFDj; and the delay time of the clock driver, by tCID, the delay time tDMC of the delay monitor DMC illustrated in FIG. 9 is set to be $$tDMC = tCIB0 + tCIB + tCB + tD + tFTDj + tCID \quad (EQ. 4)$$

Since FIGS. 1 and 9 show that the number of stages of logic circuits in the control circuit MCC is smaller than that of stages of logic circuits in the delay monitor DMC, $$tMCC < tDMC \quad (EQ. 5)$$

Figure 8:
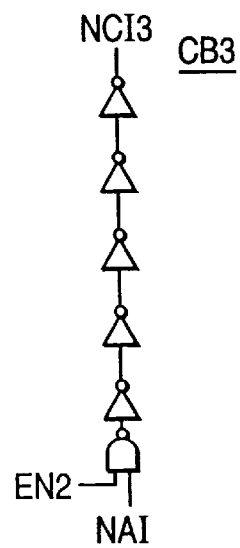
FIG. 8 illustrates an example of a clock buffer CB3.

Therefore, it is possible to set the backward delay circuit BDA0 into which the in-chip standard clock CLKR is to be entered by immediately fixing the state of the outputs NM1 to NMm of the control circuit MCC with 1 clock cycle after figuring out with the forward delay circuit array FDA the number of stages of delay circuits required for the backward delay circuit BDA0. However, since FIGS. 1 and 8 show that the number of stages of logic circuits in the control circuit MCC is greater than that of stages of logic circuits in the clock buffer CB3, $$tMCC < tCB \quad (EQ. 6)$$

Therefore, while the state of the outputs NM1 to NMm of the control circuit MCC is fixed, the in-chip standard clock CLKR cannot be entered into the backward delay circuit BDA0, but CLKR of the next clock cycle should be entered into BDA0. With the delay time of the delay fine tuning circuit FTD then being represented by tFTDk, the delay time tLB on the clock propagating route is:

$$tLB = tCIB0\ tCIB + tCB + i \cdot tD + tD + tFTDk + tCID \quad (EQ. 7)$$

Therefore, from (EQ. 3), (EQ. 4) and (EQ. 7), the total tDB of the delay time from the external clock CLKE till the internal clock CLKI is at the shortest:

$$tDB = [(tCIB0 + tCIB) + (tDMC + i \cdot tD + \Delta t)] + [tCK - (tCIB0 + tCIB)] + [tCIB0 + tCIB + tCB + (i+1) \cdot tD + tFDk + tCID]$$

$$= [(tCIB0 + tCIB + tCB + tD + tFTDj + tCID) + i \cdot tD + \Delta t] + tCK + [tCIB0 + tCIB + tCB + (i+1) \cdot tD + tFTDk + tCID]$$

$$= 3 \cdot tCK - \Delta t \quad (EQ. 8)$$

Thus, the internal clock is supplied in substantial synchronism 3 cycles at the minimum behind the external clock CLKE, provided that tFTDj is equal to tFTDj. Similarly, the total delay time from the external clock CLKE till the internal clock CLKI for the operation of FIG. 14 is presumably (5·cK−Δt) at the minimum.

From (EQ. 8), the timing error δ from the rise of the external clock CLKE to that of the internal clock CLKI is:

$$\delta = -\Delta t \qquad (EQ.\ 9)$$

This is because the delay time determined by propagation in the backward delay circuit BDA0 takes a discrete value with respect to the clock cycle time tCK. However, the absolute value of this timing error δ is, from (EQ. 2), smaller than the per-stage delay time tD of the delay circuits FDE0 to FDEm and BDE0 to BDEm, and tD is equal to the delay time equivalent to 2 stages of NAND gates. Moreover, the value itself of the timing error δ depends on the accuracy of the delay monitor DMC. Then, the conditions required of the current limiting MOS transistor constituting the delay time fine tuning circuit FTD for reducing this timing error δ are considered.

FTD shown in FIG. 2 generates y delay times satisfying the condition of:

$$y = m + n - 1 \qquad (EQ.\ 10)$$

The minimum value tFTD(min) of these delay times being represented by:

$$tFTD(min) = tD + tD1 \qquad (EQ.\ 11)$$

and the maximum value of the same by:

$$tFTD(max) = tD + (td1 + td2 + td3 + \ldots tdy) \qquad (EQ.\ 12)$$

td1+td2+td3+ . . . tdm, td(m+1), td(m+2) . . . are variation quantities of the delay time in the delay time fine tuning circuit FTD, and each of them is generated according to the combination of current limiting MOS transistors, (PTF1, NTF1, PTB1, NTB1), (PTF2, NTF2, PTB1, NTB1), (PTF3, NTF3, PTB1, NTB1) . . . , (PTFm, NTFm, PTB1, NTB1), (PTFm, NTFm, PTB2, NTB2), (PTFm, NTFm, PTB3, NTB3, . . . , or (PTFm, NTFm, PTBn, NTBn). Therefore, these current limiting MOS transistors are of a gate size satisfying the conditions of:

$$td1, td2, \ldots, tdy > 0 \qquad (EQ.\ 13)$$

$$tFTD(max) - tFTD(min) = td2 + td3 + \ldots + tdy > tD \qquad (EQ.\ 14)$$

and they should be sequentially arranged in current limiting MOS transistor arrays PTFA, PTBA, NTFA AND NTBA. Now it is supposed that the delay time tFTDj of the delay time fine tuning circuit DFTD in the delay monitor circuit is represented by:

$$tFTDj = tFTD(min) = Constant \qquad (EQ.\ 15)$$

and the initial value of the delay time tFTDk of the delay time fine tuning circuit DFTD is set to be tFTD(min). Then, as FTC is actuated and the delay time tFTDk of FTD consecutively increases from tFTD(min), from (EQ. 13) and (EQ. 14), the timing error δ from the rise of the external clock CLKE till that of the internal clock CLKI is:

$$\delta = -\Delta t \to 0 \qquad (EQ.\ 16)$$

Thus, the timing error δ between the internal clock CLKI, supplied by the coarse tuning circuit CTD 3 clock cycles after the entry of the external clock CLKE, and the external clock CLKE can be reduced by the delay time fine tuning circuit FTD controlled by the fine tuning circuit FTC. However, its accuracy is determined by the delay time difference Δtdz between the delay time fine tuning circuits FTD0 and FTD1 in the phase comparator PC. To simplify the description here, the delay time of FTD0 is supposed to be (tD+td1); that of FTD1, (tD+td1+td2), and the delay time difference Δtdz between FTD0 and FTD1, td2. In practice, however, the current limiting MOS transistor for FTD0 and FTD1 in the phase comparator PC shown in FIG. 10 is selected and Δtdz is set so as to be equal to the largest of the delay time variation quantities td1, td2, . . . , tdy in FTD, which is controlled to make the timing error between the rise of the external clock CLKE and that of the internal clock CLKI smaller than Δtdz, and the clock recovery circuit illustrated in FIG. 1 supplies the internal clock CLK1 which is stable and subject to little timing error.

The result of simulation of the clock recovery circuit described so far will be explained below. The source voltage VCC is supposed to be 2.7 [V]; the number m of delay circuits in the backward delay circuit array BDA, 32; the rise and fall times of the external clock CLKE, 0.1 [ns] each; the logic threshold voltage of each logic gate, 1.35 [V]; the delay time tD of the delay circuits FDE0 to FDEm and BDE1 to BDEm, about 0.25 [ns]; the delay time tDMC of the delay monitor DMC, about 2.4 [ns]; the variation quantities td1, td2, . . . , tdy in the delay time fine tuning circuit FTD, less than about 0.03 [ns]; and the delay time difference Δtdz between the delay time fine tuning circuits FTD0 and FTD1, about 0.035 [ns].

Figure 16:
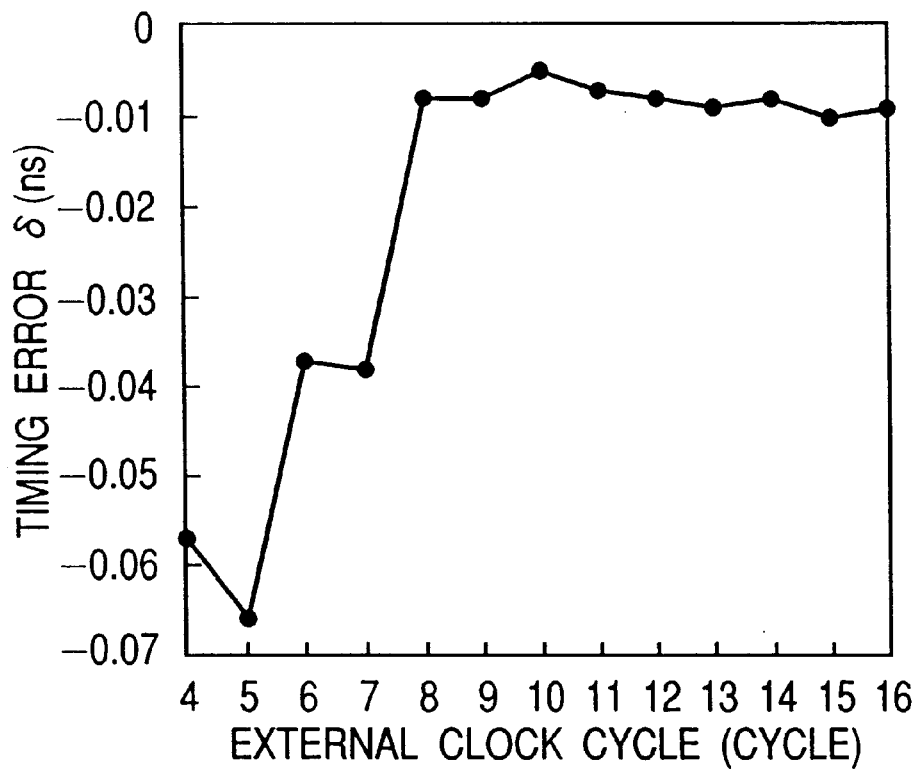
FIG. 16 illustrates the simulation of the operation of the clock recovery circuit of FIG. 1.

FIG. 16 shows the timing error δ between the rise of the in-chip standard clock CLKR and that of the internal clock where the clock cycle time tCK is supposed to be 6 [ns] (167 [MHz] in frequency). The duty of the external clock CLKE is supposed to be 0.5. The timing error of the internal clock CLKI in substantial synchronism with the fourth through 14th of the external clock CLKE is shown here, and the internal clock CLK1 is supplied by delaying the external clock CLKE by an equivalent of 3 clock cycles as shown in FIG. 13. The internal clock CLKI in substantial synchronism with the fourth of the external clock CLKE is supplied about 0.6 [ns] earlier than the in-chip standard clock CLKR. This timing error is greater than the delay time difference Δtdz (about 0.035 [ns] here) between FTD0 and FTD1.

This error is reduced, as explained with reference to FIG. 15, by controlling the delay time of the delay time fine tuning circuit FTD every 2 clock cycles. Thus the internal clock CLKI in substantial synchronism with the sixth of the external clock CLKE is supplied about 0.04 [ns] earlier than the external clock CLKE. This timing error is about 0.03 [ns] smaller than that of the internal clock CLKI in substantial synchronism with the fourth of the in-chip standard clock CLKR, and is compensated for by a value equal to the variation quantity in FTD. However, as this timing error is still greater than the delay time difference Δtdz (about 0.035 [ns] here), the timing error is further reduced by controlling the delay time of FTD in the fine tuning circuit FTC.

Thus, the internal clock CLKI in substantial synchronism with the eighth of the external clock CLKE is supplied about 0.01 [ns] earlier than the external clock CLKE. As this timing error is smaller than Δtdz (about 0.035 [ns] here), the fine tuning circuit FTC is placed in a stable state. Thus, the internal clock CLKI in substantial synchronism with the eighth of the external clock CLKE is supplied about 0.01 [ns] earlier than the external clock CLKE, and this output timing is maintained. Thus, it has been confirmed by simulation that the clock recovery circuit according to the present invention, after locking in the external clock CLKE and the internal clock CLKI in 3 clock cycles with the coarse tuning circuit CTC, performs fine tuning of the output timing of the internal clock CLKI in a few clock cycles with the fine tuning circuit FTC, and can generate internal clocks CLKI with a reduced timing error from the external clock CLKE. The number of clock cycles required here until the fine tuning circuit FTC begins to stably supply the internal clock CLKI with a reduced timing error is dependent on the per-stage delay time tD of the delay circuits FDE0 to FDEm and BDE0 to BDEm and the variation quantity tdy of the delay time in the delay time fine tuning circuit FTD. A case is considered below in which FTD configured to generate 10 stages of delay times, where the accuracy of the timing error δ is ⅒ of the per-stage delay time tD of the delay circuits FDE0 to FDEm and BDE0 to BDEm, is consecutively controlled by the shift register.

Figure 17:
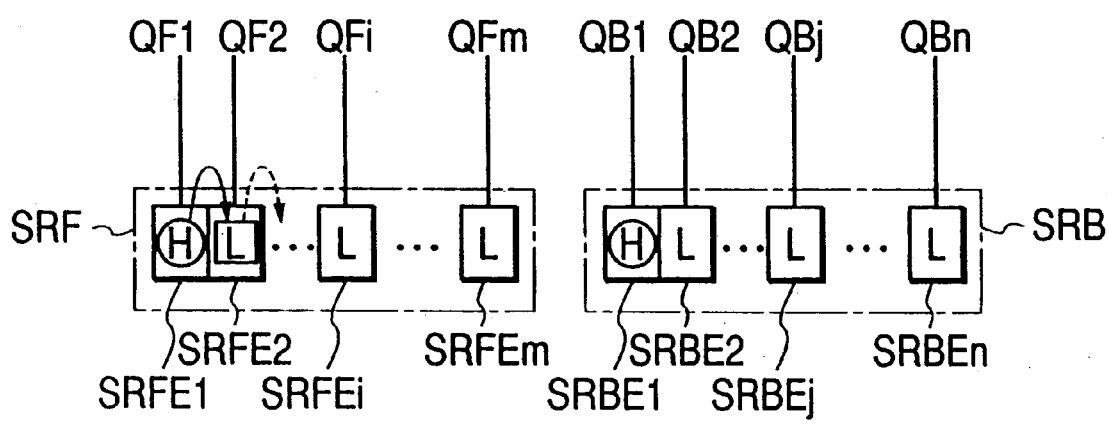
FIG. 17 illustrates Operational Example 1 of the shift register of FIG. 12.

FIG. 17 illustrates the initial state of the outputs QF1 to QFm and QB1 to QBn, respectively, of two shift registers SRF and SRB in the shift register SR shown in FIG. 12. H and L indicate that the outputs QF1 to QFm and QB1 to QBn of the shift registers SRF and SRB are at a high level and a low level, respectively. Mark ○ indicates that the initial value is at a high level, and mark □, the position to which the high level of the initial value is to be shifted. Further, the solid arrow represents the first route by which the high level of the initial value is to be shifted, and the broken arrow, the second route for the transition of the high level. As an example, QF1 and QB1 here are initially set at a high level. As the position of the high level shifts sequentially from (QF2, QB1) to (QF3, AB1), . . . , (QFm, QB1), (QFm, QB2), . . . , and (QFm, QBn) in this process, a maximum of 20 clock cycles are taken from the time the fine tuning circuit begins to operate until the internal clock CLKI with a reduced timing error is generated. As the shift register here has a configuration permitting bidirectional operation, the position of the high level can shift in the reverse diction depending on the result of phase comparison of the external clock CLKE and the internal clock CLKI. This arrangement makes it possible, when the delay time of the delay time fine tuning circuit FTD is excessively extended by any change in the environment, such as the ambient temperature, to move the output of this shift register in the direction to shorten the delay time, and thereby to keep a state of reduced timing error.

Figure 18:
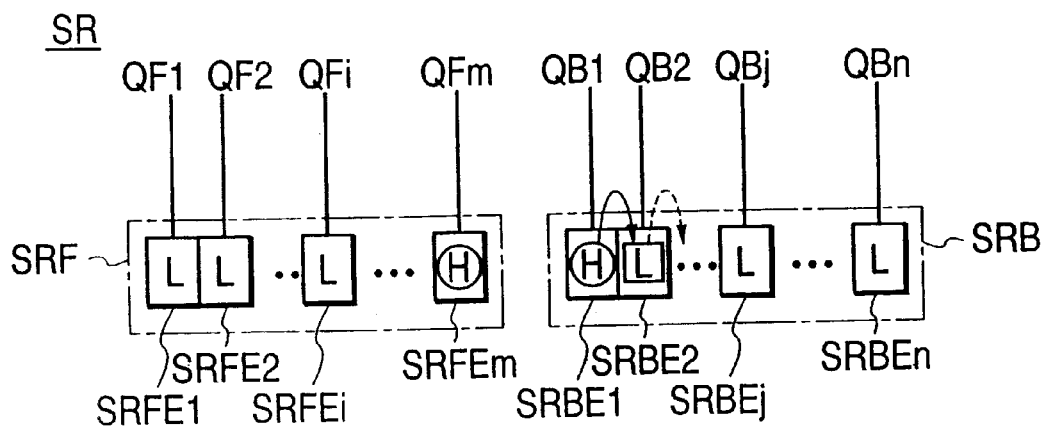
FIG. 18 illustrates Operational Example 2 of the shift register of FIG. 12.

In another example, where QFm and QB1 are initially set at a high level as illustrated in FIG. 18, the position of the high level sequentially shifts from (QFm, QB2), to (QFm, QB3), . . . , and (QFm, QBn), the time taken from the beginning of the operation of the fine tuning circuit until the internal clock CLKI with a reduced timing error is generated can be reduced to about half the number of clock cycles in the example of FIG. 17. As here again the shift register is capable of bidirectional operation, the position of the high level can shift in the reverse diction depending on the result of phase comparison of the external clock CLKE and the internal clock CLKI.

Figure 19:
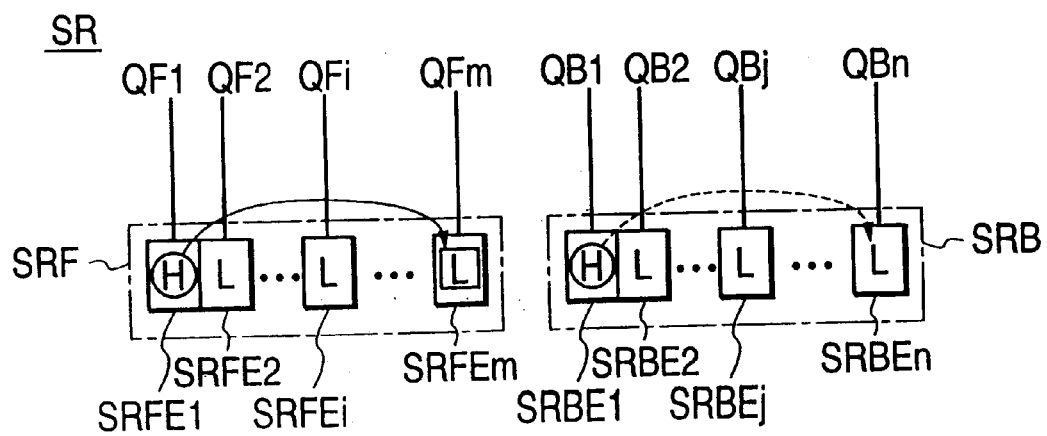
FIG. 19 illustrates Operational Example 3 of the shift register of FIG. 11.

In still another example, as shown in FIG. 19, though QFm and QB1 are initially set at a high level as in the example of FIG. 17, where the shift register SR is controlled in a binary search system, as the position of the high level sequentially shifts from (QFm, QB1), to (QFm, QBn), (QFm, QBj), . . . , the number of clock cycles required from the beginning of the operation of the fine tuning circuit until the internal clock CLKI with a reduced timing error is generated can be further reduced. In this case, too, as the shift register is capable of bidirectional operation, the position of the high level can shift in the reverse diction depending on the result of phase comparison of the external clock CLKE and the internal clock CLKI. Furthermore, if a dynamic shift register is used to enable phase comparison and shift register control can be accomplished within 1 clock cycle in addition to the foregoing system, the number of clock cycles required from the beginning of the operation of the fine tuning circuit until the internal clock CLKI with a reduced timing error is generated can be reduced still further. Since these numbers of clock cycles are smaller than usual DLL, this clock recovery circuit is superior in the saving of power consumption at the time of actuating power supply or returning from a standby state.

<Embodiment 2>

Another clock recovery circuit illustrated in FIG. 2, which is a second preferred embodiment of the present invention, will now be described. The configuration of this clock recovery circuit, which corresponds to the coarse tuning circuit of the clock recovery circuit of Embodiment 1, is characterized by the ability to generate an internal clock CLKI matched in timing with an external clock CLKE in a smaller number of clock cycles than by the prior art when returning from a standby state. The configuration of FIG. 20 differs from that of FIG. 1 in that the fine tuning circuit FTC and BDE0 in BDA0 are eliminated and the output of the delay circuit BDE1 to directly connected to the node NB0. In connection with rearrangement, the delay monitor is retuned to DMCA, which, as shown in FIG. 21,. differs from DMC of FIG. 9 in that DFTD and DDA are eliminated. To understand the configuration and operation of this embodiment, reference may be made to the descriptions in 1-1, 1-3 and 1-5 on Embodiment 2.

As described with regard to the operation of the coarse tuning circuit CTC of Embodiment 1, once the outputs NM1 to NMm are fixed by the latch circuits LB1 to LBm, there will be no change in the propagation route of the clock pulse in the coarse tuning circuit CTC. Accordingly, stopping the supply of the internal standard clock signal to FDA and MCC after the completion of synchronization would inactivate the gates of FDA and MCC, and thereby greatly contribute to saving the consumption of power.

In the basic operation of the clock generating circuit according to the invention, as described with reference to FIG. 13, the internal clock CLKI substantially in synchronism with the external clock CLKE is generated 3 clock cycles after the clock enable signal CKE is entered. Even if the entry of the external clock CLKE is stopped by turning off the clock enable signal CKE after the generation of this internal clock CLKI, the latch circuits LB1 to LBm of the control circuit MCC will hold the clock pulse propagation route as stated above. Therefore, when this clock recovery circuit is restored from a standby state, the time required to supply the internal clock CLKI after inputting the clock enable signal CKE can be reduced by an equivalent of 2 clock cycles, which the determination of the values of the outputs NM1 to NMm of the control circuit MCC of Embodiment 1 with reference to FIG. 13, and a locked-in internal clock can be obtained in only 1 clock cycle. Thus, this clock recovery circuit takes only a short lock-in time. This characteristic proves even more useful when, as described with reference to FIG. 14, the clock cycle time of the external clock CLKE shortens and the time taken to generate the internal clock elongates to 5, 7, . . . cycles, because the time can be shortened by 3, 4, . . . clock cycles. In other words, as it is possible to suspend the operation of this clock recovery circuit every time reading or writing ends in SDRAM or the like to be described later, and to restore the clock recovery circuit from the standby state by entering the clock enable signal CKE after a read command or a write command is entered, this clock recovery circuit can save its power consumption.

<Embodiment 3>

Still another clock recovery circuit illustrated in FIG. 22, which is a third preferred embodiment of the present invention, will now be described. This clock recovery circuit is characteristic in that a delay circuit required for generating an internal clock synchronized with an external clock is determined in one delay circuit array and that delay circuit is reproduced. As a result, the number of delay circuits is about halved to contribute to reducing the circuit area on the semiconductor chip. It differs from the embodiment illustrated in FIG. 20 in the following aspects: (1) FDA and BDA are integrated into a single delay circuit array DL, and (2) clock control switches SW0 and SW1 are inserted into the initial and final stages, respectively, of FDA. For the delay monitor, the circuit shown in FIG. 21 can be utilized. Although the control circuit MCC is common, its outputs NM1 to NMm are wired in a cross pattern and coupled to DL (illustration of wiring is dispensed with in FIG. 22). To simplify the wiring for these outputs NM1 to NMm, a layout in which DL is folded into a half size is effective.

The delay circuit array DL consists of m+1 delay circuits DLE0 to DLEm connected in series. DLE0 comprises two NAND circuits, while the other delay circuits are composed of three NAND circuits each. The clock control switches SW0 and SW1 consists of two transfer gates each in this example. Of the two transfer gates of the clock control switch SW0, one connects nodes NDMC0 and NF1, and the other connects the ground voltage level VSS and the node NF1. Of the two transfer gates of the clock control switch SW1, one connects nodes NFm and NSW0, while the other connects the node NFm and one input terminal of a NAND circuit. SW0 is intended to enable one delay circuit DL to be used on a time sharing basis as FDA and BDA in FIG. 20. Thus, until synchronism is detected by MCC, SW0 is kept in a state of continuity, and a clock is entered into the initial stage of DL. This causes a plurality of reference clocks NF0 to NFm and MCC to detect synchronism. Once a locked-in state is established, as the number of stages for lock-in is held by a latch circuit of MCC, SW0 is made non-continuous, a clock is entered via CB3 into a delay circuit DLEi corresponding to the node NMi detected by MCC, and an internal clock is formed, taken out of the final stage of DL via SW1. SW1 is a switch to prevent any internal clock synchronous with no external clock from being supplied during the process of clock locking-in. However, since this clock recovery circuit requires a lock-in time of no longer than a few clock cycles, SW1 may be dispensed with if erroneous operation by any other circuit using the internal clock can be prevented during the time taken for locking in.

Figure 23:
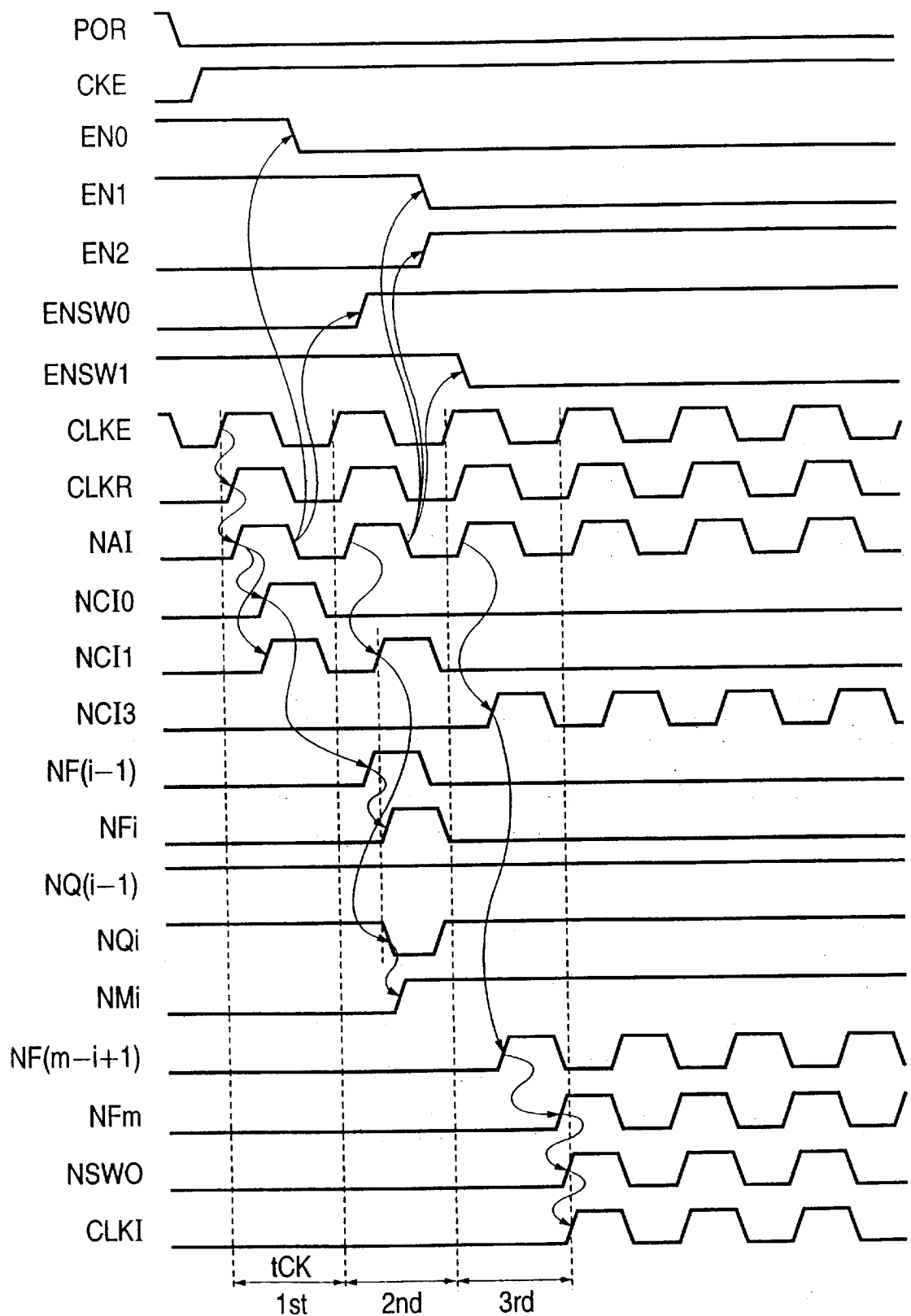
FIG. 23 illustrates the basic operation when the clock cycle time of the clock recovery circuit of FIG. 22 is relatively long.

Next will be described the operation of this circuit with reference to FIG. 23.

As one example, the basic operation of this circuit will be described wherein the clock cycle time is relatively long (the clock cycle time tCK is about twice as long as the delay time tDMCA of the delay monitor), and the clock CLKI is generated 3 clock cycles behind the entry of the clock enable signal CKE. Control with clock control signals ENSW0 and ENSW1 is accomplished, as in the case of the clock control signals EN0, EN1 and EN2 described with reference to FIG. 13, by counting the number of clocks at the node NA1 with, for example, a known counter. First, the clock control signal ENSW0 is set at a low level, and a first in-chip standard clock CLKR is entered from the output of the delay monitor DMCA into the delay circuit array DL via the clock control switch SW0. On this occasion, the clock control signal ENSW1 is set at a high level (where SW1 is non-continuous) to prevent the internal clock CLKI from being supplied. By controlling the clock control switches SW0 and SW1 in this manner, the delay circuit array DL is utilized as the forward delay circuit array FDA illustrated in FIGS. 1 and 20. After the first in-chip standard clock CLKR is entered into the delay circuit array DL, the clock control signal ENSW0 is shifted from a low to a high level to intercept connection between the nods NDMC0 and NF1, and the low ground voltage level is entered into the delay circuit array DL.

Next, as the clock control signal EN1 is at a high level as in the description referring to FIG. 13, phase comparison is performed between a standard clock NCI1, derived from a second in-chip standard clock CLKR through the cock buffer CB1, and a plurality of delay clock signals NF0 to NFm different in phase from each other. As a result, the output NMi of the control signal is raised to a high level to determine the clock propagation route. Further, after a second clock pulse had propagated at the node NA1, the clock control signal EN2 is shifted from a low to a high level; a standard clock NCI3 derived from a third in-chip standard clock CLKR through the clock buffer CB3 is entered into the delay circuit array DL from the delay circuit DLE(m−i+1) into which a high level NMi, of the outputs of the control circuit MCC, is entered; and a clock subjected to delayed by same time length as was given by FDA is supplied to the node NFm. Hereupon, before a third CLKR arrives at the node NFm, the clock control signal ENSW1 is shifted from a high to a low level to connect the nodes NFm and NSW0, and the clock propagating through the delay circuit array DL is supplied through the clock control switch S1, with the result that the delay circuit array DL provides the same effect as the backward delay circuit BDA0 shown in FIG. 1 and the backward delay circuit BDA shown in FIG. 20 do. Finally, the clock at the node NSW0 is amplified through the clock driver CID to supply the internal clock CLKI. In the clock recovery circuit of FIG. 22, too, once the number of delay stages required for locking in is held by MCC, there is no need to detect synchronism again even in the entry of the external clock is suspended temporarily. As a result, the internal clock can be obtained in a short period of time in restoring from a standby state.

Figure 20:
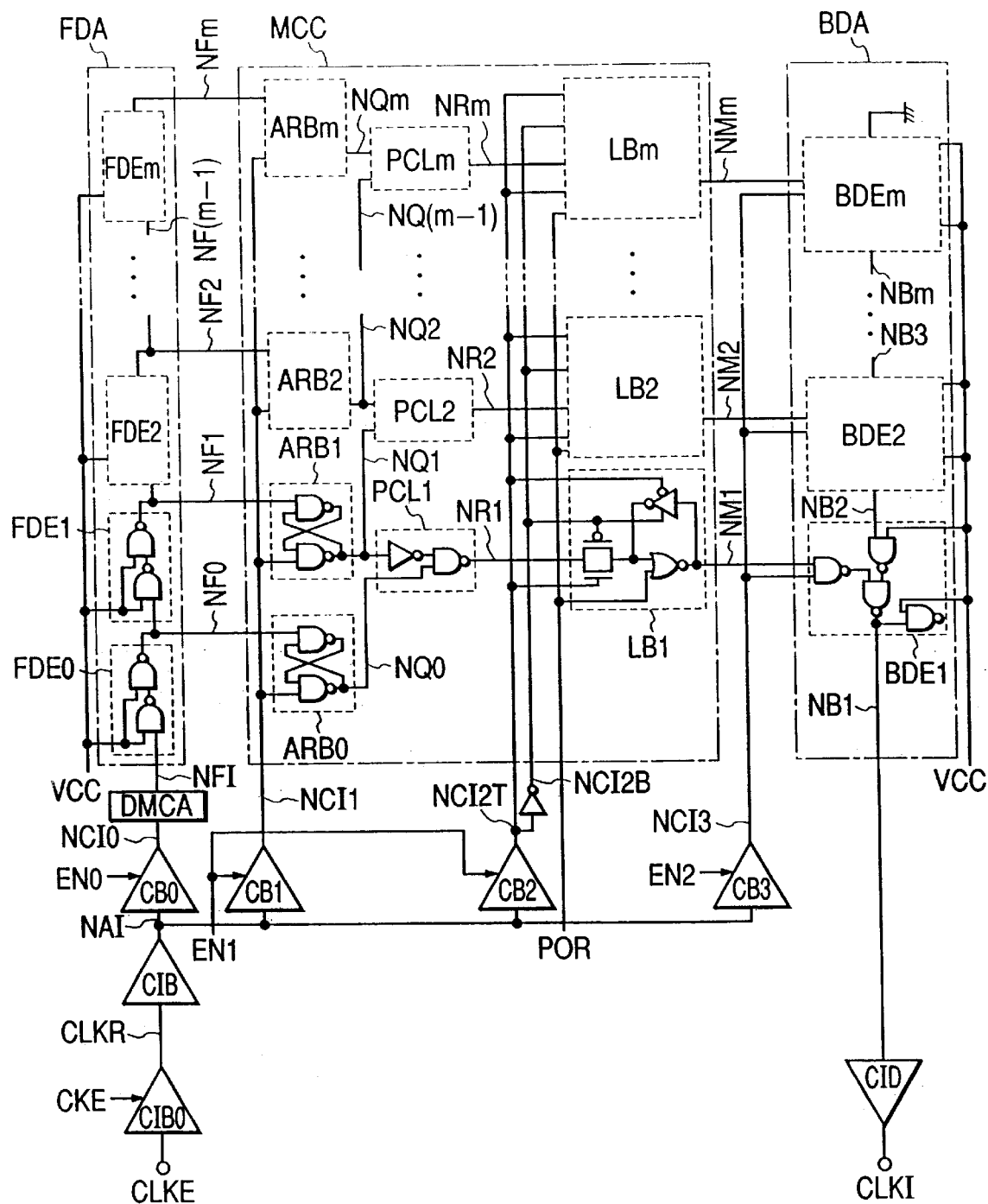
FIG. 20 illustrates Example 2 of a clock recovery circuit according to the invention.
Figure 21:
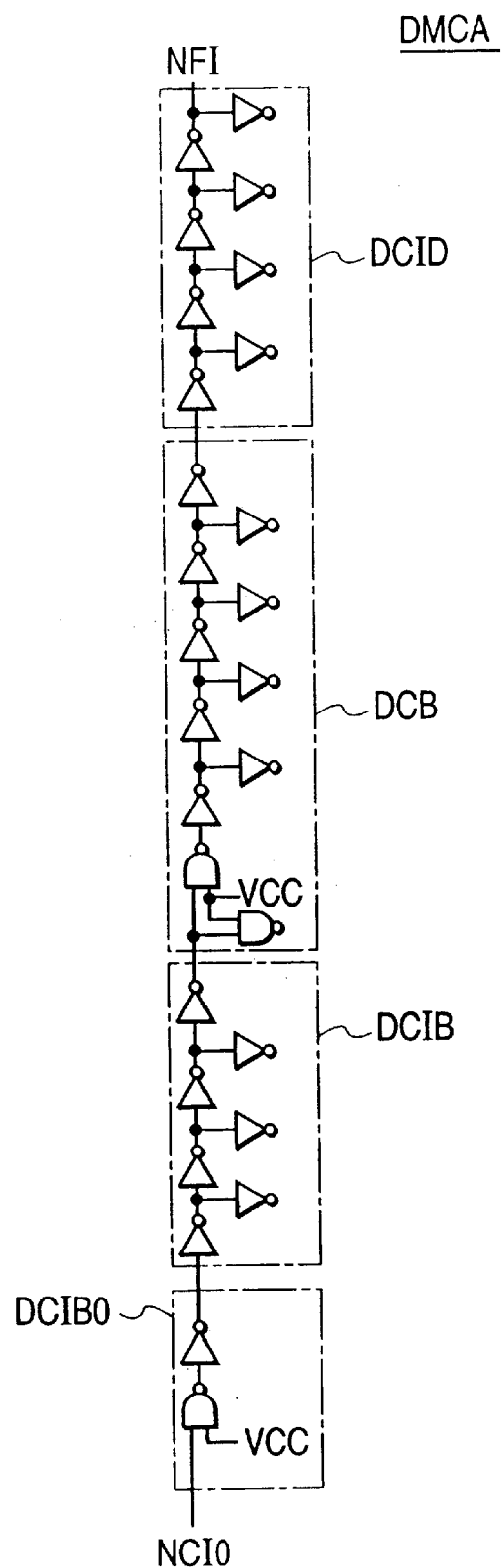
FIG. 21 illustrates an example of a delay monitor DMCA.
Figure 22:
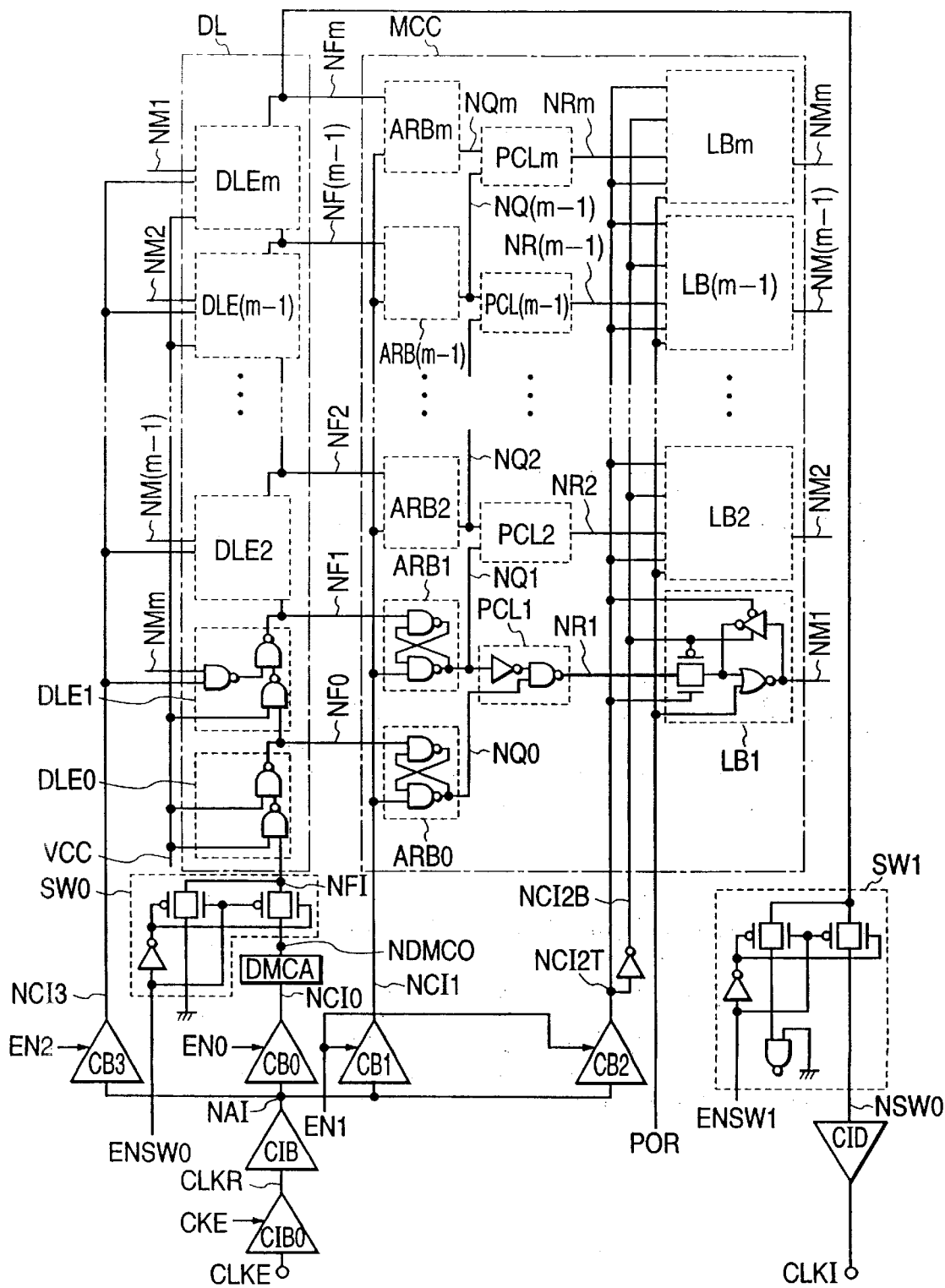
FIG. 22 illustrates Example 3 of a clock recovery circuit according to the invention.

Although the clock recovery circuit illustrated in FIG. 22 has only one delay circuit array DL, the clock control switches SW0 and SW1 are appropriately controlled to enable the delay circuit array DL to provide the same effects as the forward delay circuit array and the backward delay circuit array shown in FIGS. 1 and 20. Accordingly, in the clock recovery circuit shown in FIG. 22, the number of circuit elements required for the delay circuit can be reduced to about half the total number of circuit elements in the coarse tuning circuit shown in FIG. 1 or in the delay circuit arrays of the clock recovery circuit shown in FIG. 20. This feature is useful for reducing the circuit area on a semiconductor chip. This ability to use a single delay circuit array on a time sharing basis is due to the holding of the number of stages for lock-in by MCC in its latch circuits. Furthermore, in this clock recovery circuit as well, by appropriately controlling the clock control signals EN0, EN1, EN2, ENSW0 and ENSW1, the internal clock can be generated 5 cycles behind when the clock cycle time is short (when the clock cycle time tCK is short relative to the delay time tDMCA of the delay monitor) as described with reference to FIG. 14.

<Embodiment 4>

Figure 24:
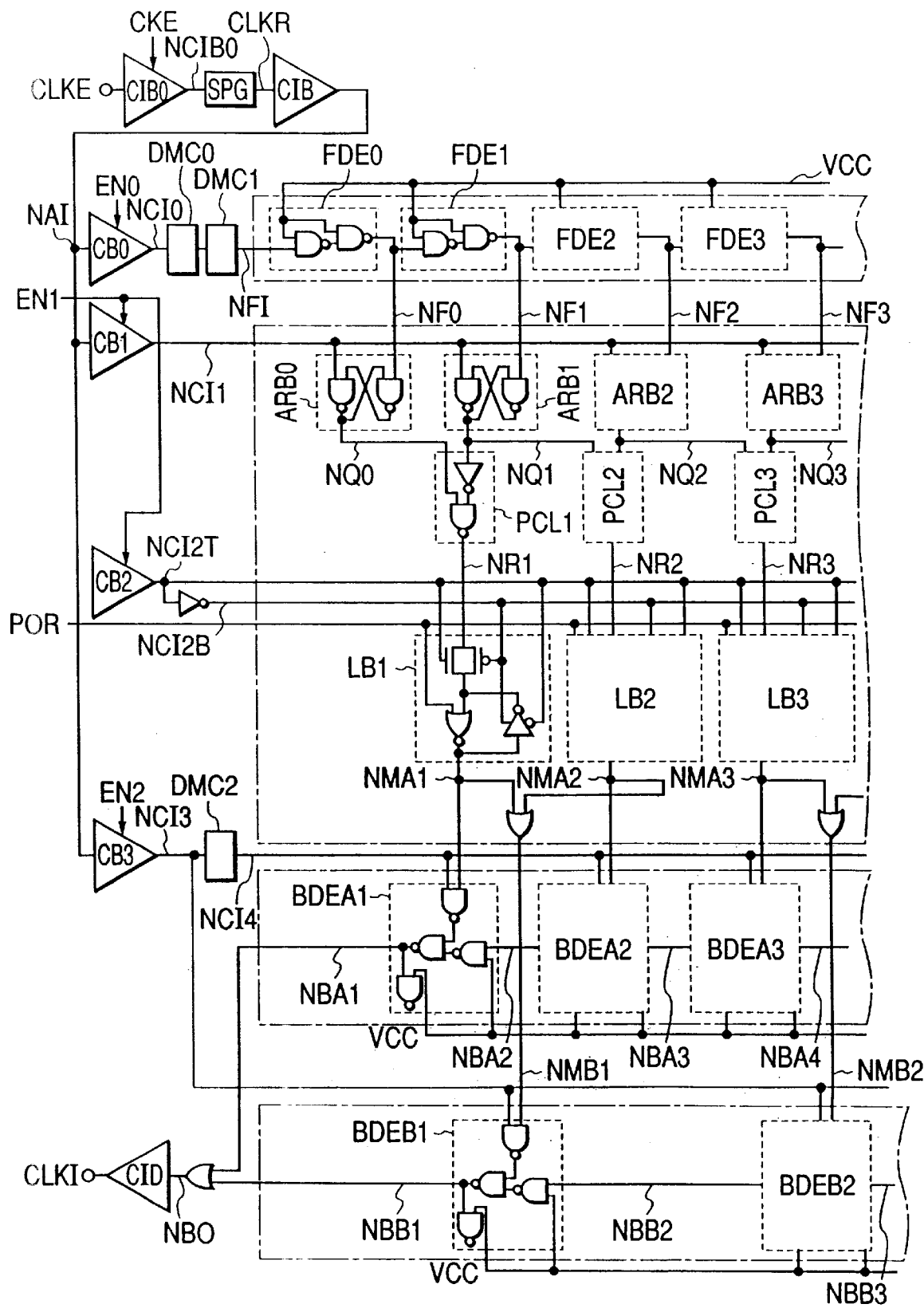
FIG. 24 illustrates Example 4 of a clock recovery circuit according to the invention (Part 1).
Figure 25:
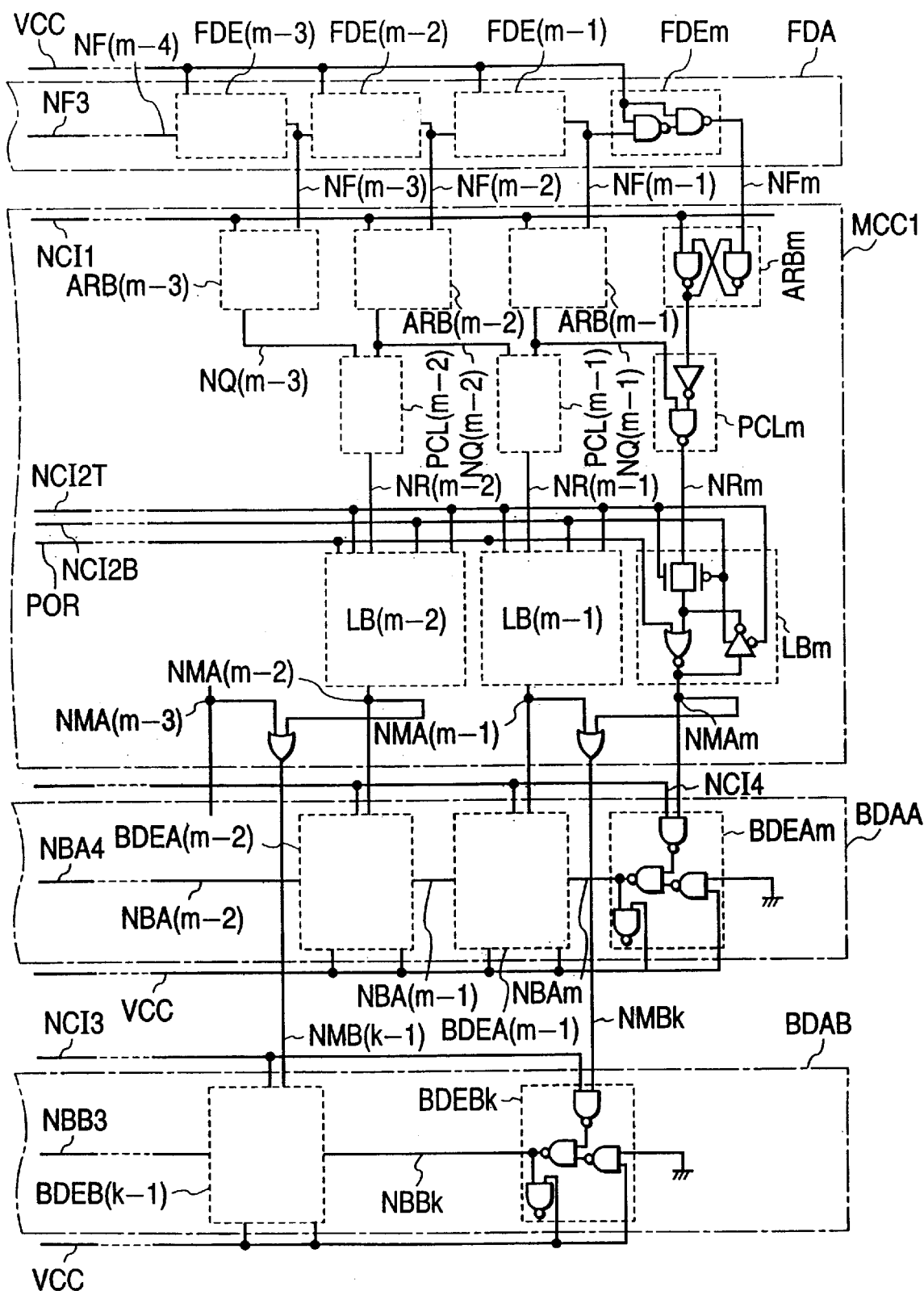
FIG. 25 illustrates Example 4 of a clock recovery circuit according to the invention (Part 2).

Yet another clock recovery circuit shown in FIGS. 24 and 25, which is a fourth preferred embodiment of the present invention, will now be described. FIGS. 24 and 25 illustrate respectively the left and right halves of a whole circuit. This clock recovery circuit has two backward delay circuit arrays. The two are in a length relationship of 1:2, and have a feature that their outputs are synthesized and an internal clock having a frequency double that of an external clock is supplied in synchronism with the external clock. This circuit mainly differs from the circuit shown in FIG. 20 in the following respects. (1) A second backward delay circuit array BDAB, having half as many delay stages as BDA, is additionally provided. (2) The shot pulse generator SPG is inserted between the output end of the clock input buffer CIB0 and the node CLKR. (3) A logic circuit (OR circuit) is added between the output node NBO and the two backward delay circuit arrays to give the logical sum of their outputs. (4) The control circuit is augmented with a plurality of control output nodes for obtaining logical sums of pairs out of the outputs NMAL to NMAm and controlling BDAB. Incidentally, the logic circuit of (3), for which an OR circuit is cited as an example, may as well be an exclusive OR (EXOR) circuit.

Figure 26:
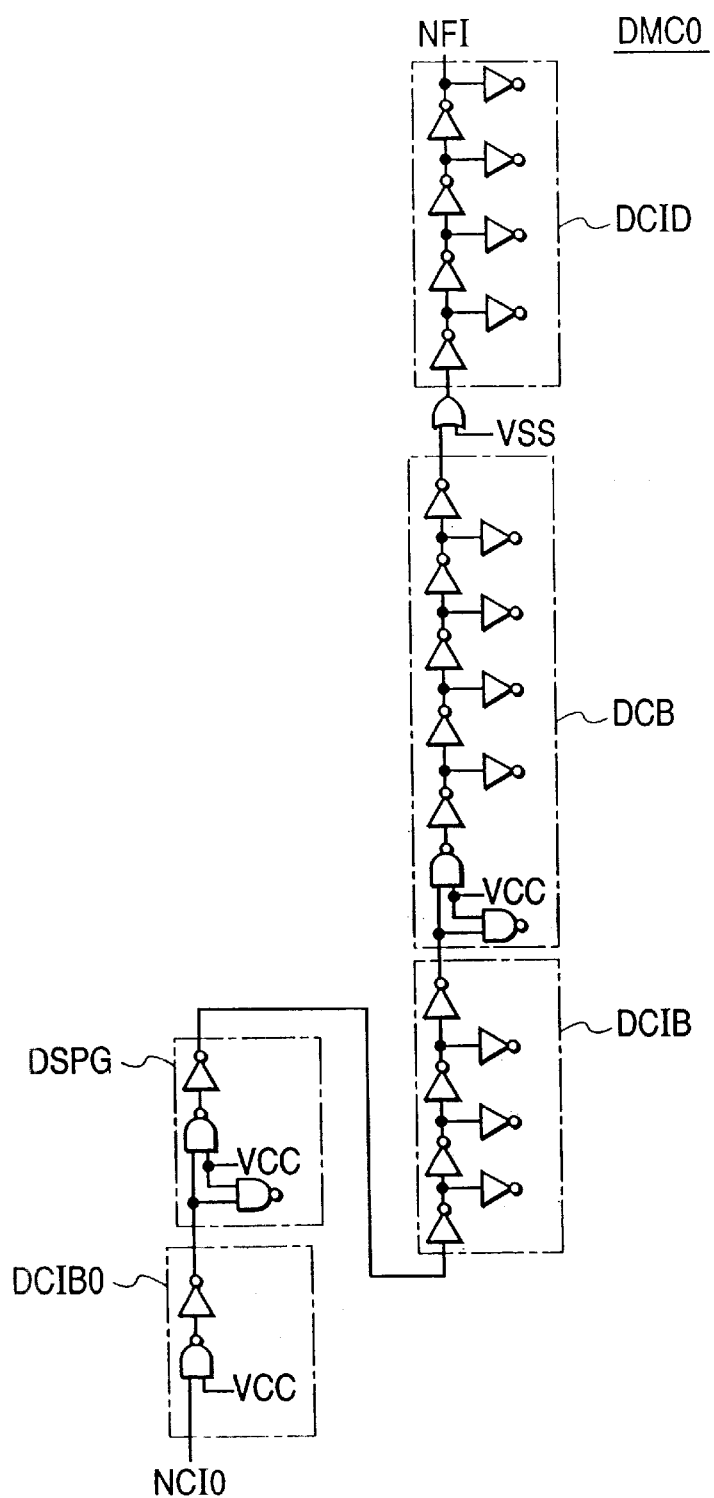
FIG. 26 illustrates an example of a delay monitor DMCO.

In connection with these changes, the delay monitor is retuned. Thus, between two delay monitors DMC0 and DMC1 are inserted between CB0 and the initial input stage of FDA. Also, DMC2 is newly inserted into the input route from CB3 to BDAA. FIG. 26 illustrates the configuration of DMC0. Each of DMC1 and DMC2 has the same configuration as DMC0.

Figure 27:
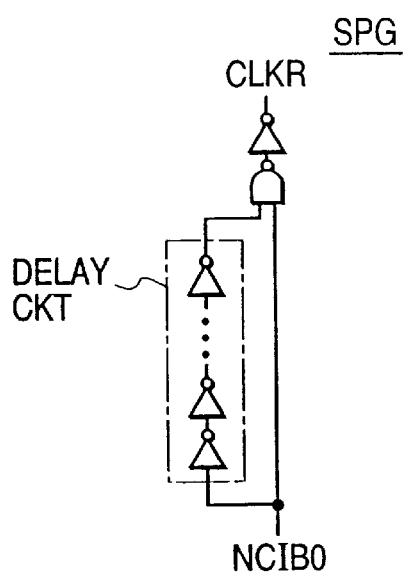
FIG. 27 illustrates an example of a short pulse generator.

The shot pulse generator SPG, as illustrated in FIG. 27, consists of an inverter and a NAND circuit connected in series, and generates a shot pulse of less than 50% duty of the external clock CLKE. One input terminal of the NAND circuit is connected the output NCIB0 of a clock input buffer CIB0, and into the other input terminal is entered a clock from a node NCIB0 through a delay circuit consisting of an odd number of stages of inverters connected in series. The dummy circuit DSPG of the shot pulse generator, as shown in FIG. 26, consists of a NAND circuit, one of whose input terminals is connected to a source voltage level VCC, and an inverter connected in series, and to the other input terminal of the NAND circuit is connected another NAND circuit, which is a gate load capacity of the same capacity as the input load to the shot pulse generator SPG.

A control circuit MCC1 enters outputs from every two of a plurality of first output terminals (NMA1 to NMAm) into different OR circuits. Thus it has terminals for second outputs (NMB1 to NMBk) obtained by entering pairs of NMA1 and NMA2, NMA3 and NMA4, NMA5 and NMA6, . . . into different OR circuits.

The backward delay circuit array consists of two delay circuit arrays BDAA and BDAB, the latter being half as long as the former, and has the same configuration of elemental delay circuits as that shown in FIG. 20. One BDAB is provided for every two delay circuits BDAA. Thus, the configuration is such that, once the number of lock-in stages is determined by MCC1, BDAB add a delay time equal to ½ of the delay time added by BDAA.

Figure 28:
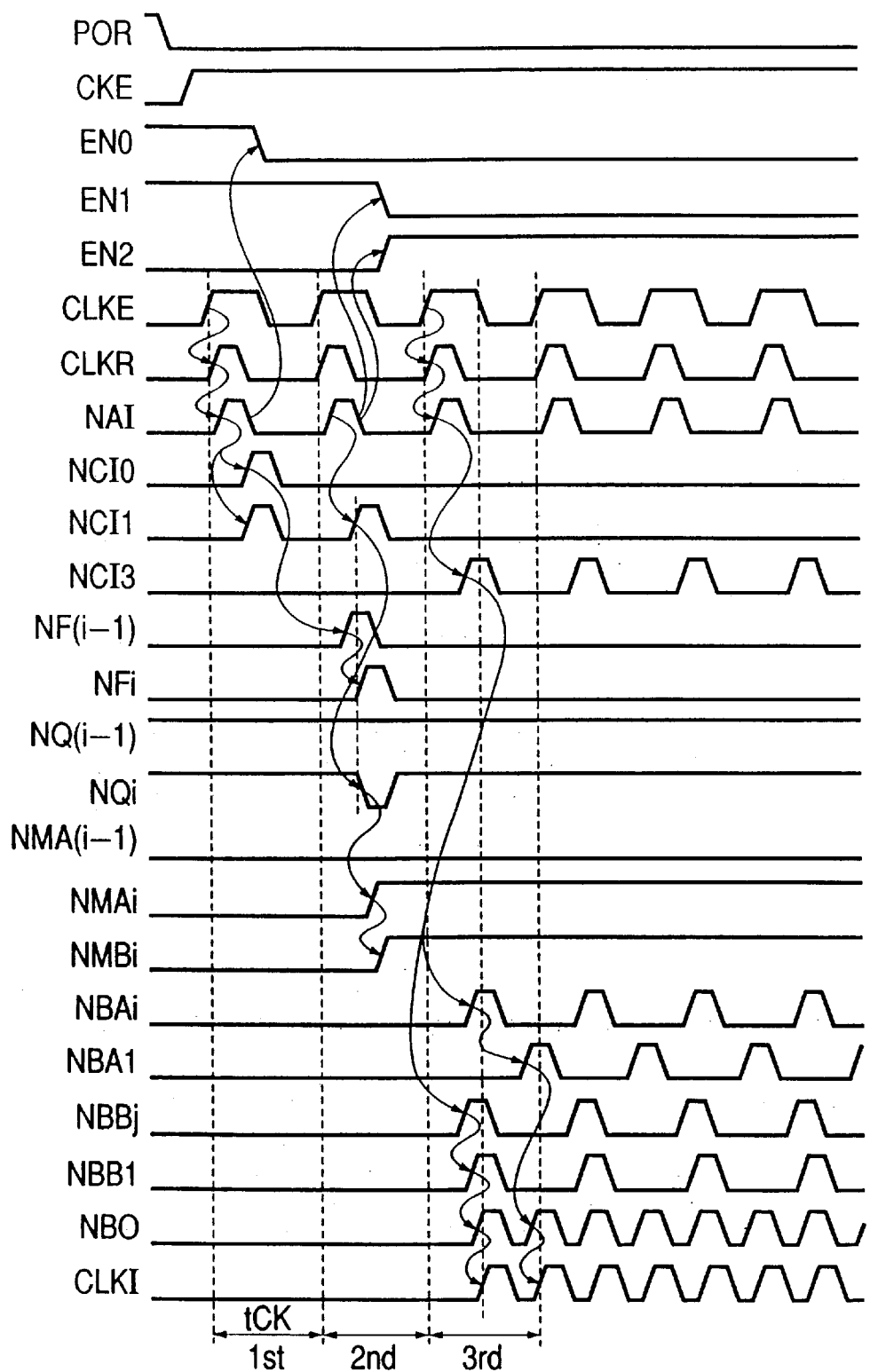
FIG. 28 illustrates the basic operation when the clock cycle time of the clock recovery circuit of FIGS. 24 and 25 is relatively long.

Next will be described, with reference to FIG. 28, the basic operation of this circuit, wherein the clock cycle time is relatively long (the clock cycle time tCK is about twice as long as the delay time 2·tDMC0 of the delay monitor), and the internal clock CLKI is generated 2.5 clock cycles behind the entry of the clock enable signal CKE. The procedure after the entry of a power-on resetting signal POR at a high level at the time of turning on the power supply until the determination of the outputs NMA1 to NMAm and NMB1 to NMBk following the detection of synchronism by the control circuit MCC1 is similar to that illustrated in FIG. 20, except that the standard clock that is propagated is one with a small pulse with, the clock duty being less than 50%, as SPG is inserted after CIB0.

It being supposed that the control circuit MCC1 has detected synchronism and only the output NMAi of the latch circuit LBi is at a high level with all the rest remaining at a low level, the following procedure will be described. Then, of the outputs NMB1 to NMBk obtained by entering every two of the outputs NMA1 to NMAm of the latch circuits LB1 to LBm into different OR circuits, only the output NMBj obtained by entering the outputs NM(i−1) and NMi of the latch circuits LB(i−1) and LBi takes on a high level. The relationship between i and j here is:

$$i=2j \qquad (EQ. 17)$$

The holding of these states sets the positions of the backward delay circuit arrays BDAA and BDAB into which the standard clock NCI3 is to be entered from the in-chip standard clock CLKR through the clock buffer CB3.

When this setting is completed and the clock control signal EN2 takes on a high level, the in-chip standard clock CLKR is entered through the clock buffer CB3 and the node NCI3 into the delay circuit BDEBj, and successively propagates from BDEB(j−1) to BDEBj. Further, the output clock NC14 from the standard clock NCI3 through the delay monitor DMC2 is entered into the delay circuit BDEAi, and successively propagates from BDEA(i−1) to BDEA1. The output of the final stage of each of BDAA and BDAB, after being subjected to logical summation by the OR circuit, is supplied to the node NB0, and amplified through the clock driver CID to supply the internal clock CLKI.

Now will be described the characteristic of the internal clock CLKI in the operation illustrated in FIG. 28, with the time taken to obtain an output being taken into consideration. The delay time of the delay monitor DMC0 is represented by tDMC0, and the per-stage delay time of the delay circuits FDE0 to FDEm, BDEA1 to BDEAM and BDEB1 to BDEBk, by tD. Further, if the node NCI1 rises with a time lag of Δt after the input NF(i−1) of the ith arbiter ARB(i−1) rises, the clock cycle time tCK, from the cycle of the node NCI0, can be represented by:

$$tCK=2 \cdot tDMCO+i \cdot tD+\Delta t \qquad (EQ. 18)$$

Then, with the delay time of the short pulse generator being represented by tSPG and that of the OR circuit by tOR, the delay time tDMCO of the delay monitor DMCO is set to be:

$$tDMC0=tCIB0+tSPG+tCIB+tCB+tOR+tCID \qquad (EQ. 19)$$

as shown in FIG. 26. Similarly to the operation illustrated in FIG. 13, after the number of stages of delay circuit necessary for the backward delay circuit arrays BDAA and BDAB is figured out by the forward delay circuit array FDA, the output of the control circuit MCC1 is fixed within 1 clock cycle, and the positions of the backward delay circuit arrays BDAA and BDAB into which the in-chip standard clock CLKR is to be entered are set. Then, the in-chip standard clock CLKR for the next clock cycle is entered into the backward delay circuits BDAA and BDAB. The delay time tLC on the clock propagation route then is:

$$tLC=tCIB0+tSPG+tCIB+tCB+tDMC0+i \cdot tD+tOR+tCID \qquad (EQ. 20)$$

Therefore, from (EQ. 18), (EQ. 19), and (EQ. 20), the shortest total tDC from the in-chip standard clock CLKR to the internal clock CLKI through the backward delay circuit array BDAA is:

$$tDC=(tCIB0+tSPG+tCIB+tCB)+(2 \cdot tDMC0+i \cdot tD+\Delta t)+[tCK-$$
$$(tCIB0+tSPG+tCIB+tCB)]+(tCIB0+tSPG+tCIB+tCB+tDMC0+$$
$$i \cdot tD+tOR+tCID)$$

$$=(tCIB0+tSPG+tCIB+tCB)+[2 \cdot (tCIB0+tSPG+tCIB+tCB+tOR+$$
$$tCID)+i \cdot tD+\Delta t]+[tCK-(tCIB0+tSPG+tCIB+tCB)]+(tCIB0+$$
$$tSPG+tCIB+tCB+tDMC0+i \cdot tD+\Delta t+tOR+tCID)$$

$$=3 \cdot tCK-\Delta t \quad \text{(EQ. 21)}$$

Thus the internal clock CLI is supplied from the external clock CLKE through the backward delay circuit array BDAA about 3 cycles behind.

Meanwhile, from (EQ. 17) to (EQ. 20), the shortest total tDD from the in-chip standard clock CLKR to the internal clock CLKI through the backward delay circuit array BDAB is:

$$tDD=(tCIB0+tSPG+tCIB+tCB)+(2 \cdot tDMCO+i \cdot tD+\Delta t)+[tCK-$$
$$(tCIB0+tSPG+tCIB+tCB)]+(tCIB0+tSPG+tCIB+tCB+j \cdot tD+$$
$$tOR+tCID)$$

$$=(tCIB0+tSPG+tCIB+tCB)+[2 \cdot (tCIB0+tSPG+tCIB+tCB+tOR+$$
$$tCID)+i \cdot tD+\Delta t]+[tCK-(tCIB0+tSPG+tCIB+tCB)]+(tCIB0+$$
$$tSPG+tCIB+tCB+(i/2) \cdot tD+tOR+tCID)$$

$$=2 \cdot tCK+(tCK-\Delta t)2$$

$$=(5/2) \cdot tCK-\Delta t/2 \quad \text{(EQ. 22)}$$

Thus in the internal clock CLKI there is a pulse supplied from the external clock CLKE through the backward delay circuit array BDAB about 2.5 cycles behind.

To sum up the foregoing, in the basic operation of the clock recovery circuit illustrated in FIGS. 24 and 25, a first internal clock CLKI is supplied 3 cycles behind the external clock CLKE as represented by (EQ. 21); thereafter groups of clocks are supplied, one in every cycle; and a first internal clock CLKI 2.5 cycles behind the external clock CLKE as represented by (EQ. 22) is supplied, alternately thereafter with the groups of clocks supplied every cycle. Thus, as shown in FIG. 28, 2.5 clock cycles behind the entry of the clock enable signal CKE, internal clocks CLKI are generated, one in approximately every half cycle of the external clock CLKE. As the leading edge of each even-numbered one of the internal clock CLKI is substantially synchronized with the leading edge of the external clock CLKE, the timing error between the external clock CLKE and the internal clock CLKI can be represented by (EQ. 2) as in the case of the coarse tuning circuit of FIG. 1. Therefore, the clock recovery circuit provided with the backward delay circuit arrays BDAA and BDAB as shown in FIGS. 24 and 25, with a shot pulse of the external clock CLKE entered, can generate, in synchronism with the external clock CLKE, internal clocks CLKI whose frequency is about double the external clock frequency.

In this clock recovery circuit, too, if the clock control signals EN0, EN1, EN2, ENSW0 and ENSW1 are appropriately controlled, internal clocks can be generated, in the same way as the operation described with reference to FIG. 14, 4, 5.5, . . . clock cycles behind when the clock cycle time is short (the clock cycle time tCK is short relative to the delay time tDMC0 of the delay monitor). Furthermore, since the clock pulse propagation route can be held by the latch circuits LB1 to LBm in the control circuit MCC1, it is possible, as described with respect to Embodiment 2, to recover from a standby state in a short period of time and supply, in synchronism with the external clock CLKE, internal clocks CLKI whose frequency is about double the external clock frequency.

<Embodiment 5>

Figure 29:
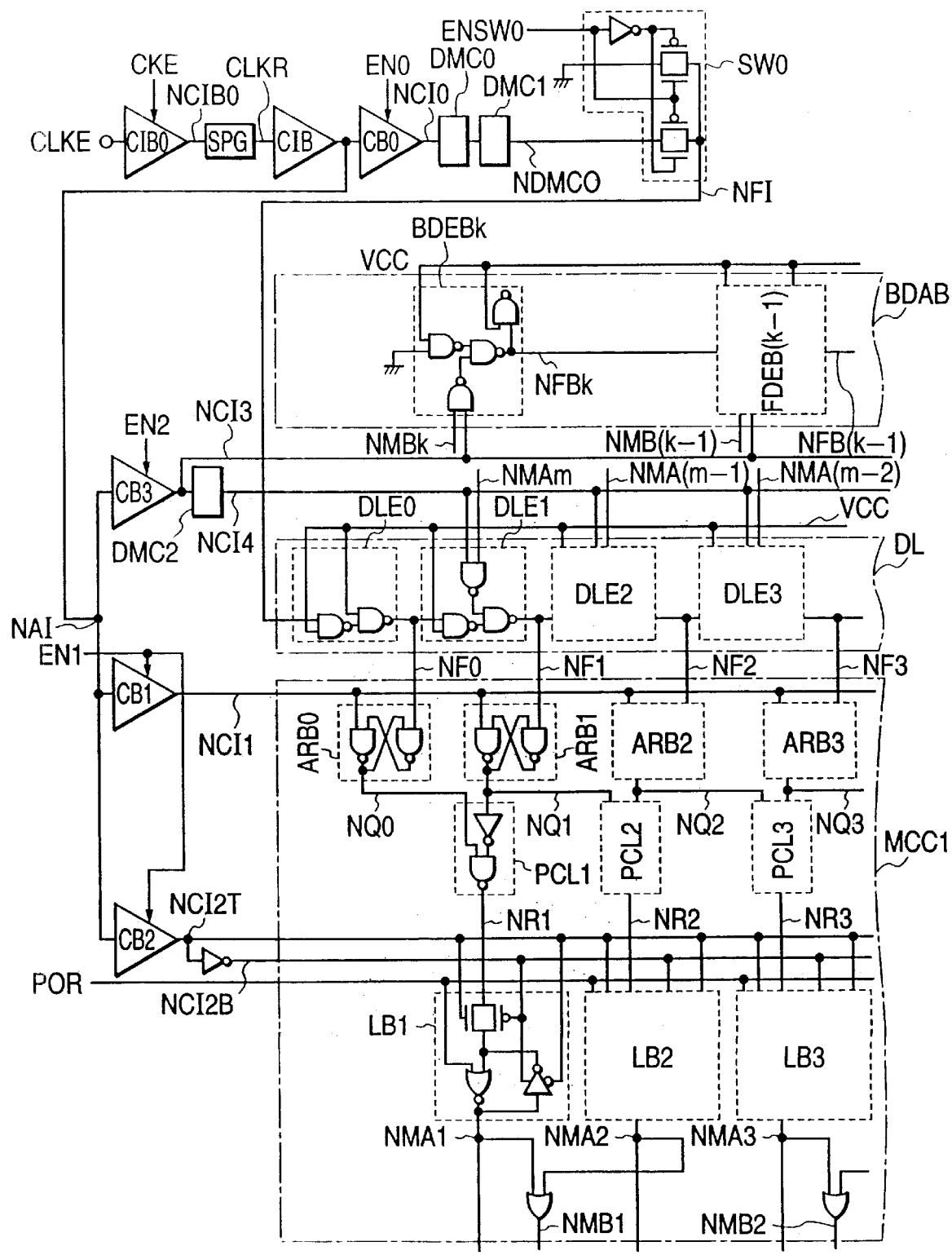
FIG. 29 illustrates Example 5 of a clock recovery circuit according to the invention (Part 1).
Figure 30:
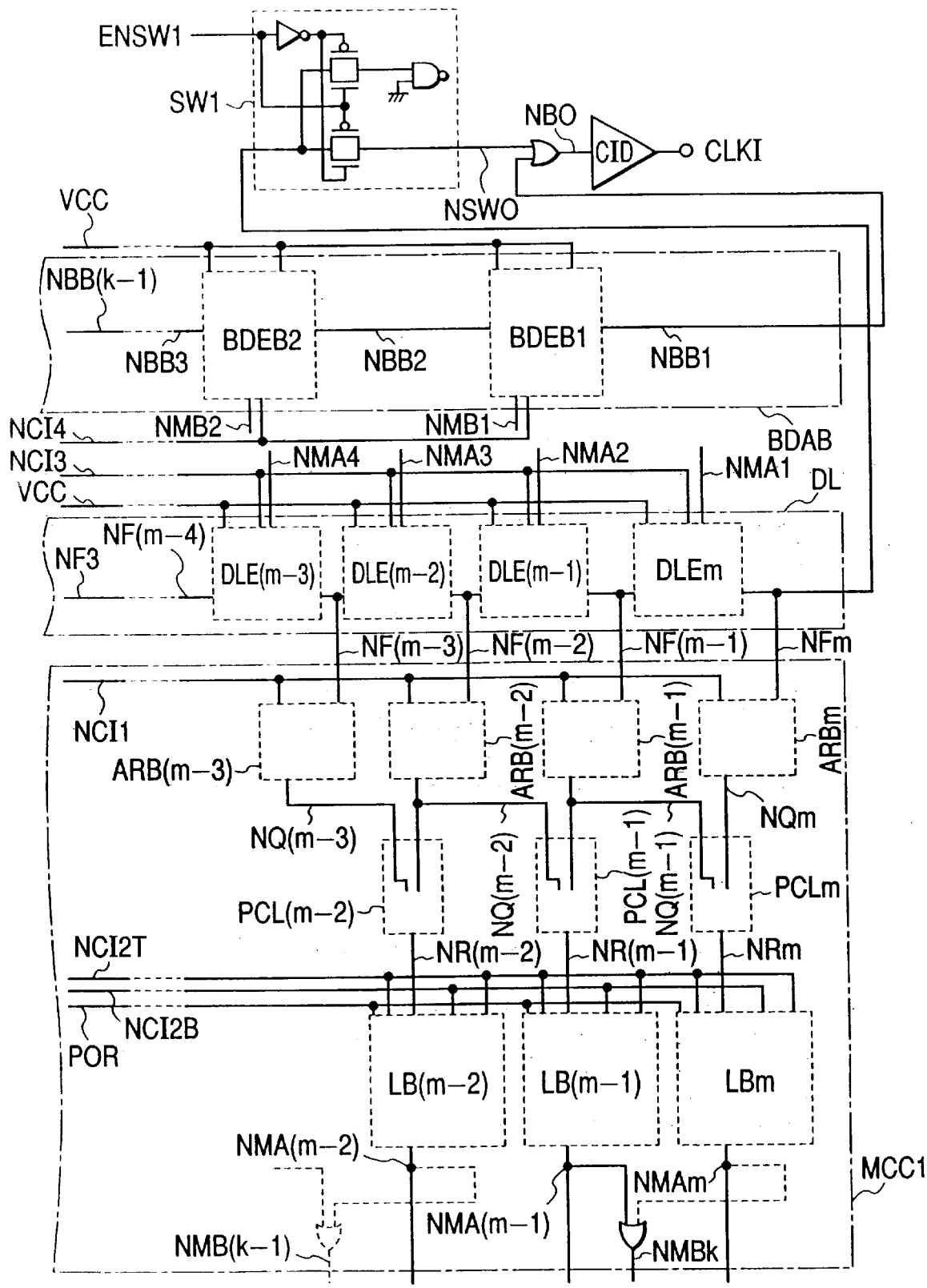
FIG. 30 illustrates Example 5 of a clock recovery circuit according to the invention (Part 2).

Another clock recovery circuit according to the present invention is illustrated in FIGS. 29 and 30 as a fifth preferred embodiment. This clock recovery circuit has a delay circuit array for both delay measurement and delay reproduction, and a backward delay circuit of half the length of the foregoing delay circuit array. They have a feature that their outputs are synthesized and an internal clock having a frequency double that of an external clock is supplied in synchronism with the external clock. The number of delay circuits is smaller than in the circuit of FIGS. 24 and 25, which is a feature useful for reducing the circuit area on a semiconductor chip and, moreover, internal clocks of a double frequency can be reproduced. A technique to integrate the two delay circuit arrays of FIG. 20 into a single array was earlier shown in FIG. 22. This embodiment can be regarded as representing the application of the same technique to the circuit of FIGS. 24 and 25.

This circuit mainly differs from the circuit shown in FIGS. 24 and 25 in the following respects. (1) FDA and BDAA are integrated into a single delay circuit array. (2) The clock control switches SW0 and SW1 are inserted into the initial and final stages, respectively, of DL. As the delay monitor, the circuit shown in FIG. 21 can be used. The control circuit MCC1 is common, but its outputs NMA1 to NMAm and NMAB1 to NMBk are wired in a cross way and coupled to DL (illustration of the wiring is dispensed with in FIGS. 29 and 30). The circuit configuration of the delay circuit array DL is the same as what is shown in FIG. 22. BDAB, on the other hand, is the same as what is shown in FIGS. 24 and 25. The input of the first stage of BDAB is connected to a ground potential.

Figure 31:
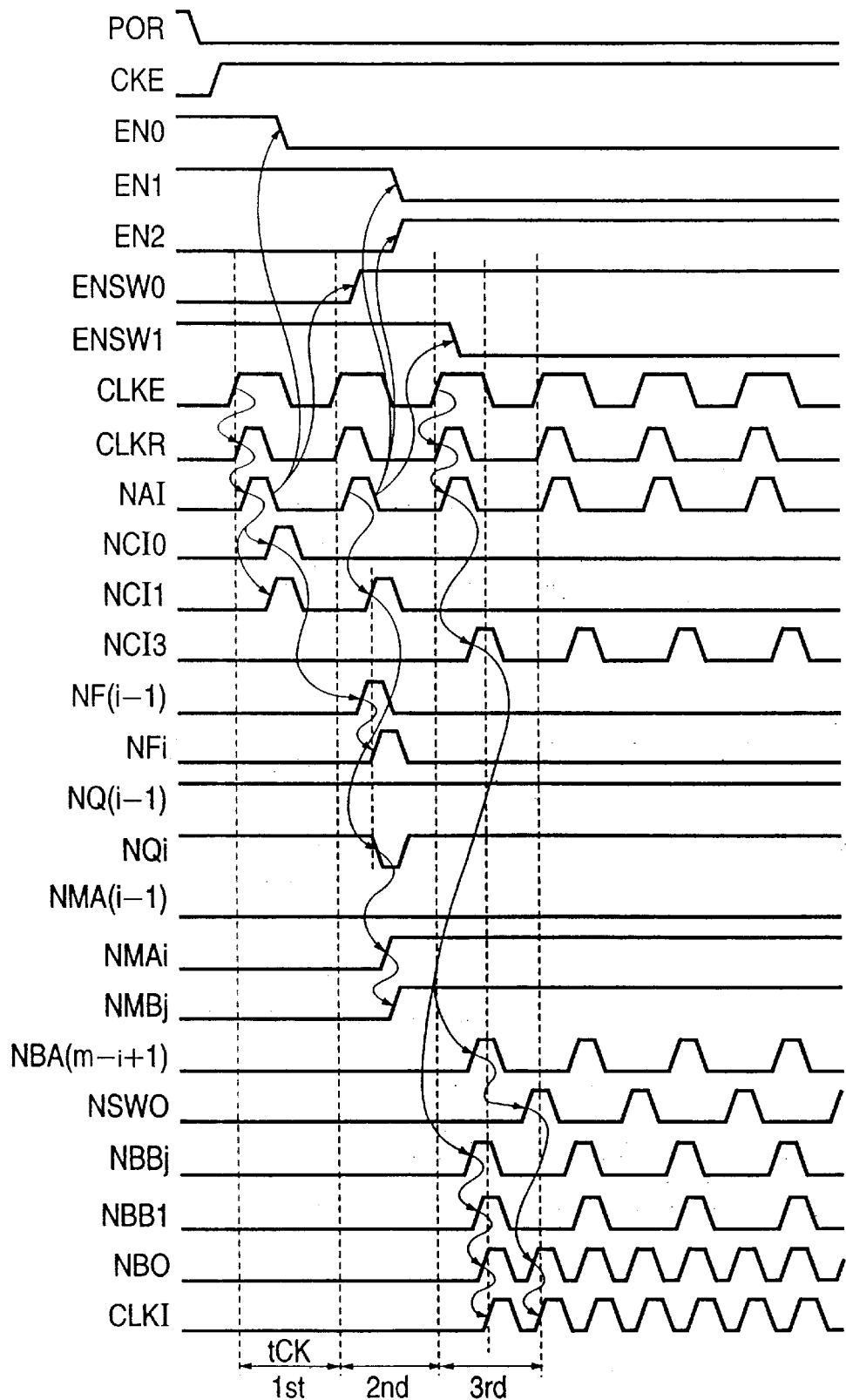
FIG. 31 illustrates the basic operation when the clock cycle time of the clock recovery circuit of FIGS. 29 and 30 is relatively long.

Next will be described, with reference to FIG. 31, the basic operation of this circuit, wherein the clock cycle time is relatively long (the clock cycle time tCK is about twice as long as the delay time 2·tDMCO of the delay monitor), and the internal clock CLKI is generated 2.5 clock cycles behind the entry of the clock enable signal CKE. The operational timing of this circuit is the same as the operation shown in FIG. 22 in the process wherein DL forms the basic wave (of the same frequency as the external clock). Thus, first, SW0 is turned on, and a pulse whose width has been narrowed by SPG is entered into DL to form a plurality of reference clocks. They are compared by MCC1 with a standard clock delivered through CB1, and the number of required delay stages for lock-in is detected and held. The procedure thereafter is the same as the operation illustrated in FIGS. 24 and 25. In BADB, SW0 is turned off, and the standard clock is entered into both BL and BDAB in the position of the number of delay stages for lock-in instructed by MCC1. In BADB, a delay time half that in DL is added, and the logical sum of the final outputs of the two are obtained. An internal clock synchronized with the external clock is thereby formed.

Eventually, in the basic operation of the clock recovery circuit illustrated in FIGS. 29 and 30, a first internal clock CLKI is supplied 3 cycles behind the external clock CLKE as represented by (EQ. 21); thereafter groups of clocks are supplied, one in every cycle; and a first internal clock CLKI 2.5 cycles behind the external clock CLKE as represented by (EQ. 22) is supplied, alternately thereafter with the groups of clocks supplied every cycle. Thus, as shown in FIG. 31, 2.5 clock cycles behind the entry of the clock enable signal CKE, internal clocks CLKI are generated, one in approximately every half cycle of the external clock CLKE. As the leading edge of each even-numbered one of the internal clock CLKI is substantially synchronized with the leading edge of the external clock CLKE, the timing error between the external clock CLKE and the internal clock CLKI can be represented by (EQ. 2) as in the case of the coarse tuning circuit of FIG. 1.

Therefore, the clock recovery circuit provided with the delay circuit array DL and the backward delay circuit array BDAB as shown in FIGS. 29 and 30, with a shot pulse of the external clock CLKE entered while the clock control switches SW0 and SW1 are appropriately controlled, can generate, in synchronism with the external clock CLKE, internal clocks CLKI whose frequency is about double the external clock frequency with a number of circuit elements about half the total number of circuit elements of the delay circuit arrays FDA and BDA in the clock recovery circuit shown in FIGS. 24 and 25. Furthermore in this clock recovery circuit, too, if the clock control signals EN0, EN1, EN2, ENSW0 and ENSW1 are appropriately controlled, internal clocks can be generated, in the same way as the operation described with reference to FIG. 14, 4, 5.5, . . . clock cycles behind when the clock cycle time is short (the clock cycle time tCK is short relative to the delay time tDMC0 of the delay monitor).

<Embodiment 6>

Figure 32:
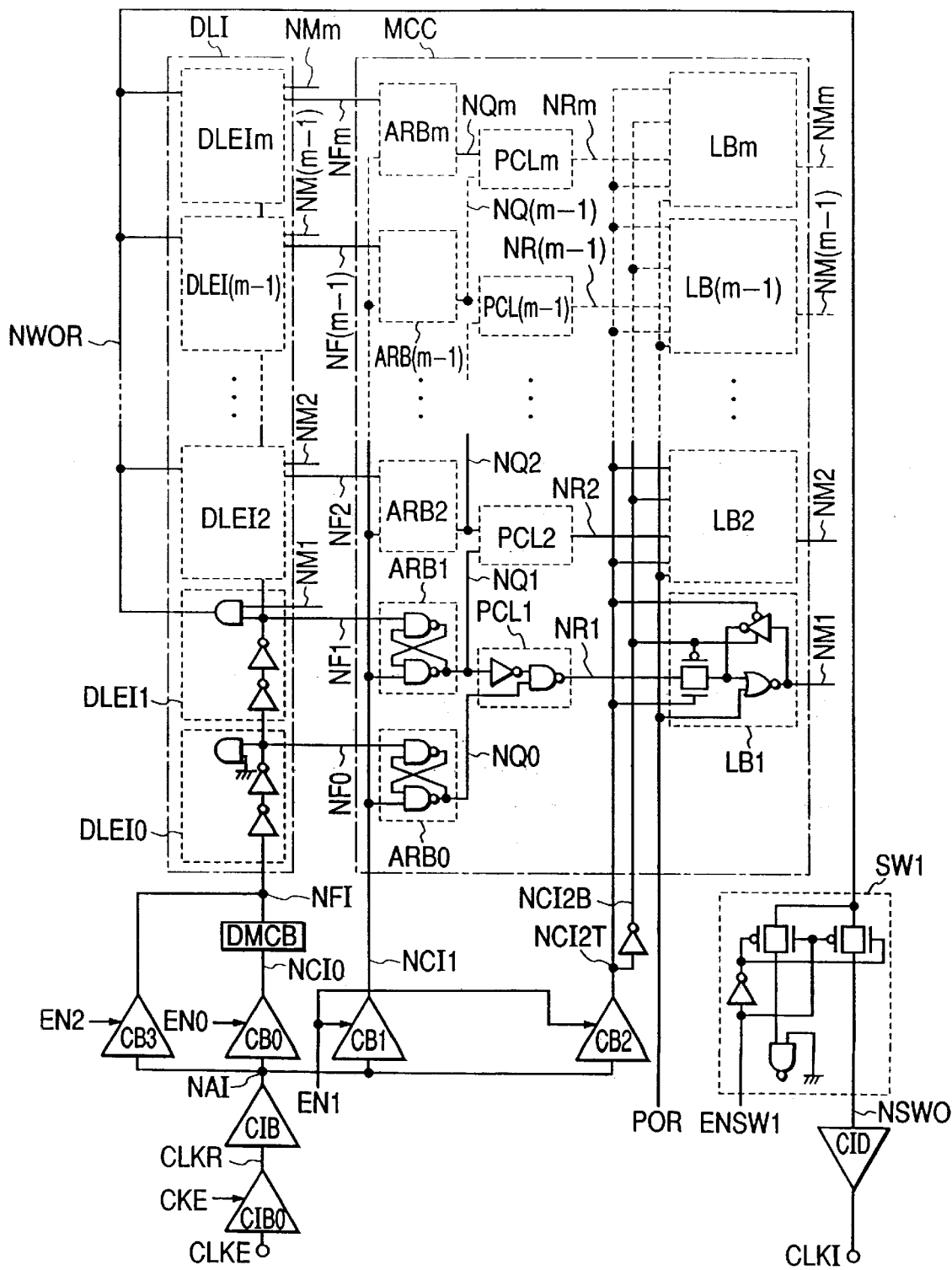
FIG. 32 illustrates Example 6 of a clock recovery circuit according to the invention.

Still another clock recovery circuit according to the present invention is illustrated in FIG. 32 as a sixth preferred embodiment. This clock recovery circuit is characteristic in that it has a single delay circuit array for both delay measurement and delay reproduction, and that the delay circuits required for delay reproduction and the same as those required for delay measurement. This embodiment can be regarded as a variation of the circuit which, as shown in FIG. 22, carries out clock recovery with a single delay circuit array.

Figure 33:
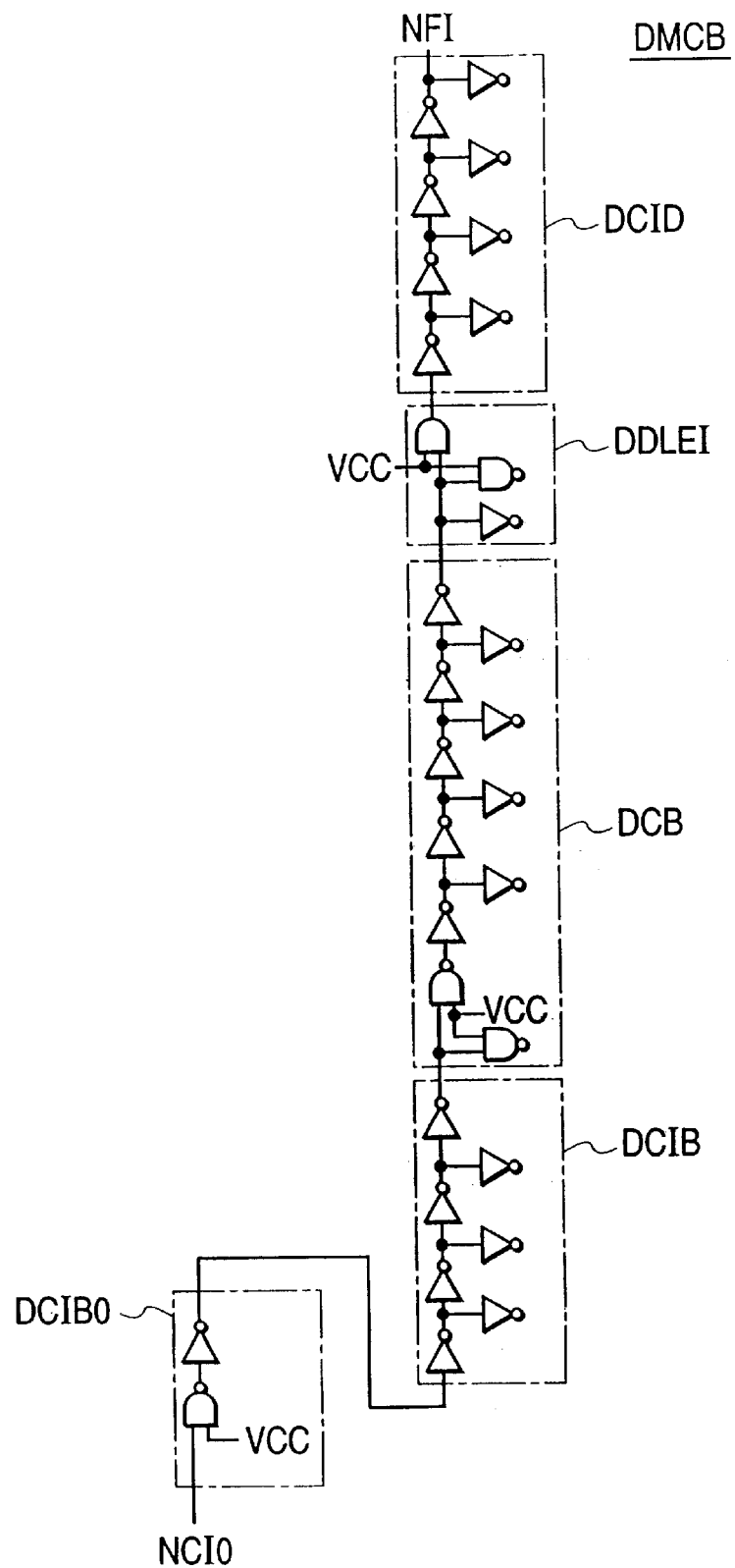
FIG. 33 illustrates an example of a delay monitor DMCB.

This circuit mainly differs from the circuit shown in FIG. 22 in the following respects. (1) The switch SW0 in FIG. 22 is dispensed with, and the input from CB3 is entered into the first stage of the delay circuit array. (2) For the delay circuit array, DL is replaced by DLI. While DL receives the input of the standard clock in the middle of the delay circuit array to add delay times, this DLI receives the input from the initial stage, and gives the output in the middle of the delay circuit array. The delay monitor is compensated for these changes as shown in FIG. 33. DMCB differs from DMCA in FIG. 21 in that a dummy circuit DDLEI is inserted, which is equivalent to the loads of delay circuits DLEA0 to DLEAm and an AND circuit.

MCC is the same as that in FIG. 22 except that the outputs NM1 to NMm are wired plainly in parallel to DLI (illustration of this wiring is dispensed with in FIG. 32). As a result, the wiring layout is simpler than in the circuit of FIG. 22 in which many wires cross each other.

The circuit configuration of the delay circuit array DLI consists of m+1 delay circuits DLEI0 to DLEIm connected in series, wherein the delay circuit DLEI0 consists of two inverter circuits to let clocks propagate and one AND circuit. The reason why the configuration of the delay circuit can be simplified from the NAND circuit shown in FIG. 22 to inverter circuits is that, as stated above, clocks are always entered from the initial stage of DLI and delivered out in the middle of the delay circuit array with the result that the NAND circuit, which serves as a switch for the entry of clocks, is not needed.

By virtue of this circuit configuration, once the outputs NM1 to NMm of the control circuit MCC are fixed, the clock propagating through the delay circuit array DL is supplied to NWOR through the AND circuit into which a high level output of the control circuit MCC is entered, out of the AND circuits of the delay circuits DLEI1 to DLEIm. Further, this clock is amplified through the clock control switch SW1 and the clock driver CID to generate the internal clock CLKI.

Next will be described, with reference to FIG. 34, the basic operation of this circuit, wherein the clock cycle time is relatively long (the clock cycle time tCK is about twice as long as the delay time tDMC0 of the delay monitor), and the internal clock CLKI is generated 3 clock cycles behind the entry of the clock enable signal CKE. The procedure after the entry of a power-on resetting signal POR at a high level at the time of turning on the power supply until the determination of the outputs NM1 to NMm following the detection of synchronism by the control circuit MCC is similar to that illustrated in FIG. 22. It has to be noted, however, that the clock control signal EN2 is kept at a low level during the detection of synchronism, so that the in-chip standard clock CLKR may not be entered from the clock buffer CB3 into the delay circuit array DLI.

It being supposed that the control circuit MCC has detected synchronism and only the output NMAi of the latch circuit LBi is at a high level with all the rest remaining at a low level, the following procedure will be described. After a second clock pulse has propagated in the node NAK, the clock control signal EN2 shifts from a low to a high level. At the same time, ENSW1 shifts from a high to a low level, and the output node NWOR of the AND circuit of each of the delay circuits DLEI0 to DLEIm is connected to the node NSW0. Since EN0 is at a low level here, third and subsequent in-chip standard clocks CLKR are entered into the initial stage of the delay circuit array DLI through the clock buffer CB3. The clock pulse propagating through DLI is supplied to the node NWOR from AND of DLEI1 according to the MCC output, and this pulse is amplified through the clock driver CID to supply the internal clock CLKI.

Figure 34:
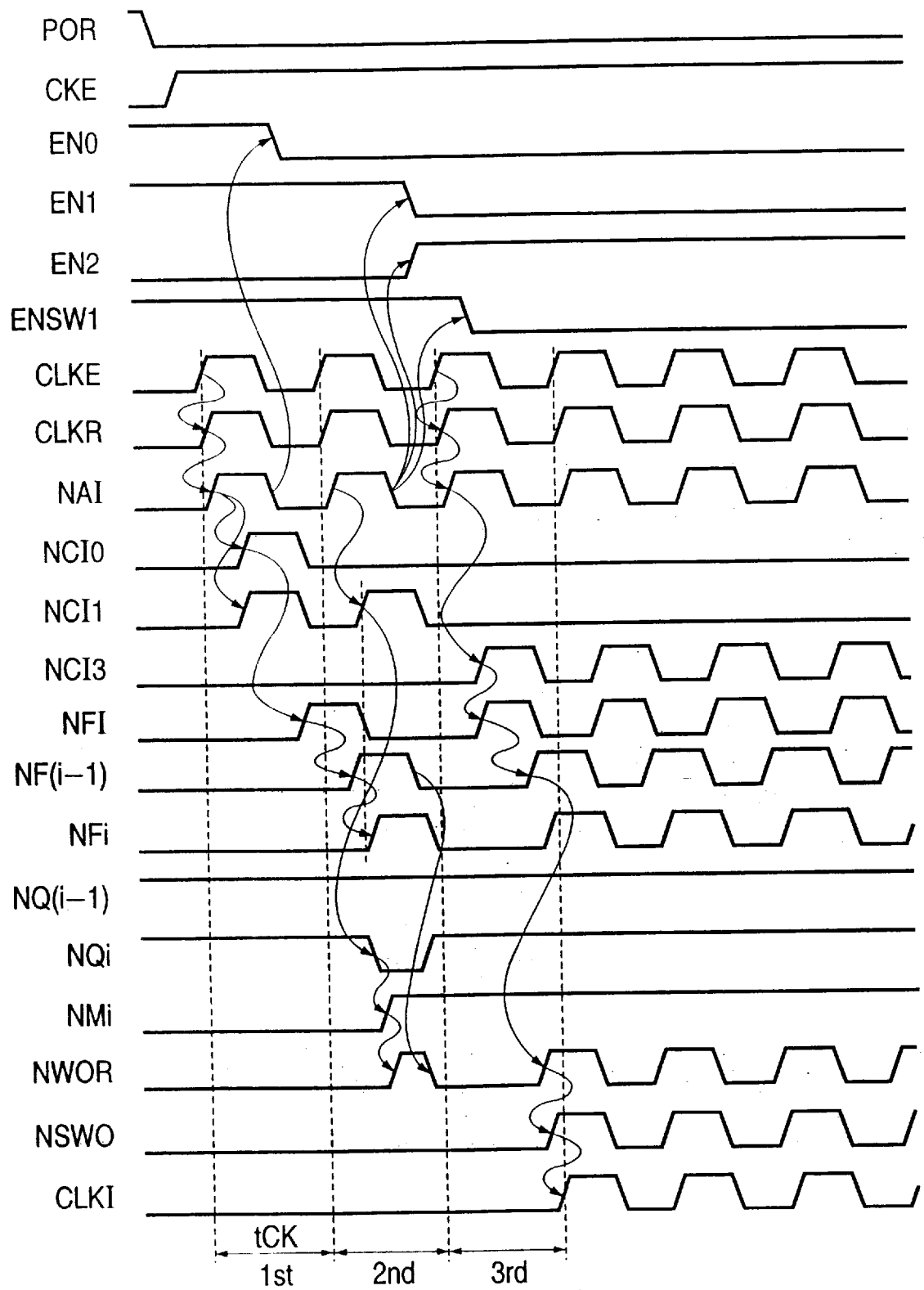
FIG. 34 illustrates the basic operation when the clock cycle time of the clock recovery circuit of FIG. 32 is relatively long.

Now is considered the time required to obtain the output in the operation illustrated in FIG. 34. The delay time of the delay monitor DMCB is represented by tDMCB, and the per-stage delay time of the delay circuits DLEI0 to DLEIm, by tDI. Further, if the node NCI1 rises with a time lag of $\Delta t$ after the input NF(i−1) of the ith arbiter ARB(i−1) rises, the clock cycle time tCK, from the cycle of the node NCI0, can be represented by:

$$tCK = tDMCB + i \cdot tDI + \Delta t \qquad (EQ.\ 23)$$

Then, with the delay time of the AND circuit being represented by tAND, the delay time tDMCB of the delay monitor DMCB is set to be:

$$tDMCB = tCIB0 + tCIB + tCB + tAND + tCID \qquad (EQ.\ 24)$$

as shown in FIG. 26. Similarly to the operation illustrated in FIG. 13, after the number of stages of delay circuit necessary for delaying the standard clock CN10 by 1 clock cycle, the position from which the clock is to be delivered out of the delay circuit array DLI is set. Then, the in-chip standard clock CLKR for the next clock cycle is entered into the delay circuit array DLI through the clock buffer CB3. The delay time tLE on the clock propagation route then is:

$$tLE = tCIB0 + tCIB + tCB + i \cdot tDI + tAND + tCID \qquad (EQ.\ 25)$$

Therefore, from (EQ. 23) to (EQ. 25), the shortest total tDE from the entry of the clock enable signal CKE till the supply of the first internal clock CLKI through the delay circuit array DLI is:

$$tDE = (tCIB0 + tCIB + tCB) + (tDMC0 + i \cdot tD + \Delta t) + [tCK - (tCIB0 + tCIB + tCB)] + (tCIB0 + tCIB + tCB + i \cdot tD + tAND + tCID)$$

$$= [tCIB0 + tCIB + tCB + tAND + tCID) + i \cdot tD + \Delta t] + tCK + [(tCIB0 + tCIB +$$

$tCB+tAND+tCID)+i \cdot tD]$ $=3 \cdot tCK - \Delta t$ (EQ. 26)

Thus, as in the circuit illustrated in FIG. 22, about 3 cycles are required until a first internal clock CLKI is generated from the external clock CLKE. However, in the circuit shown in FIG. 32, as both the delay circuits required for delaying the standard clock NCI0 by 1 clock cycle in determining the state of the outputs NM1 to NMm of the control circuit MCC and the delay circuits required for generating the internal clock CLKI are the same DLEI0 to DLEIi, there is an effect to reduce, compared with the circuit shown in FIG. 22, the timing error between the external clock and the internal clock attributable from the unevenness of device characteristics due to process fluctuations. In this clock recovery circuit, too, if the clock control signals EN0, EN1, EN2 and ENSW1 are appropriately controlled, internal clocks can be generated, in the same way as the operation described with reference to FIG. 14, 4, 5 clock cycles behind when the clock cycle time is short (the clock cycle time tCK is short relative to the delay time tDMCB of the delay monitor).

<Embodiment 7>

Figure 35:
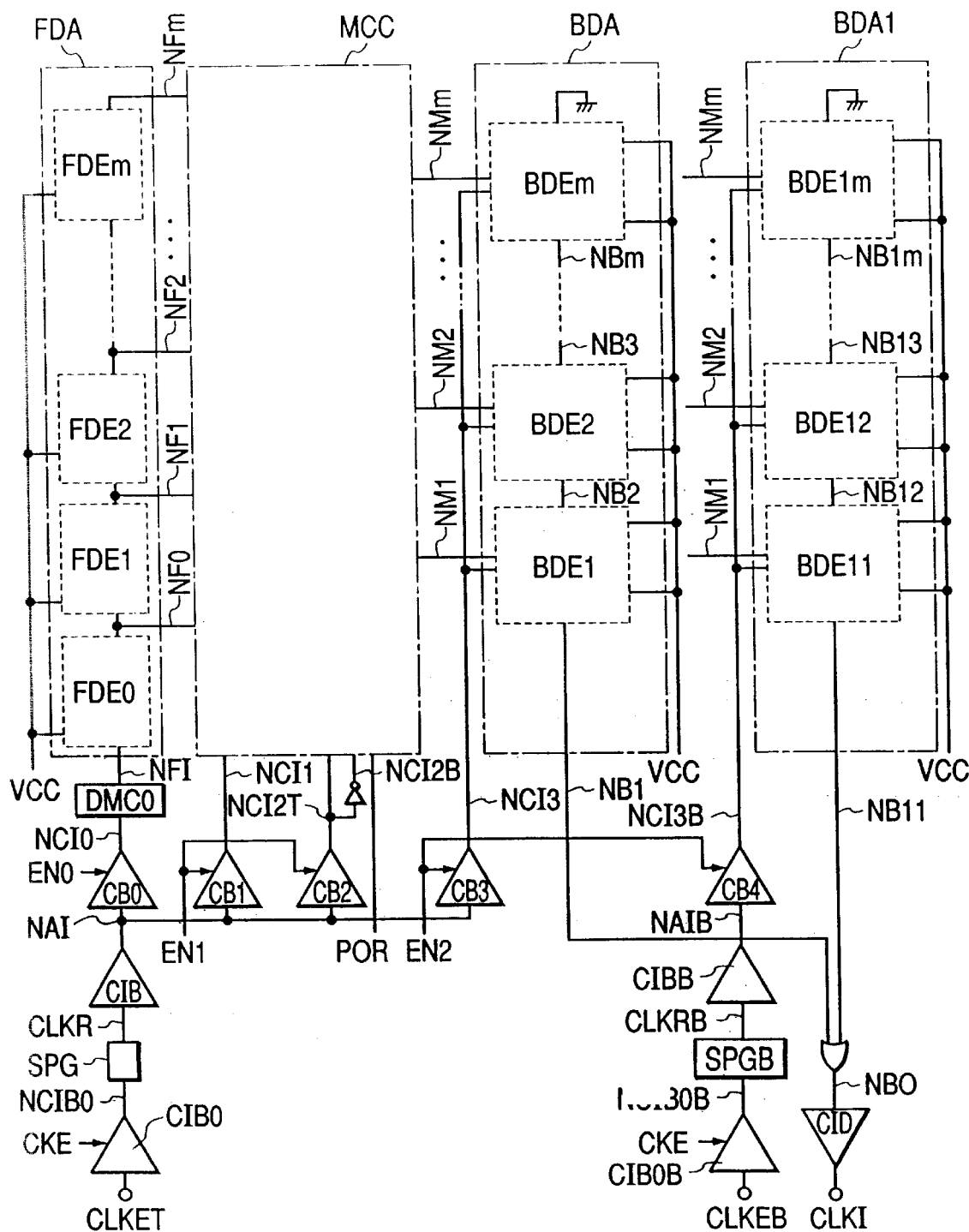
FIG. 35 illustrates Example 7 of a clock recovery circuit according to the invention.

Yet another clock recovery circuit according to the present invention is shown in FIG. 35, which is a seventh preferred embodiment. This clock recovery circuit is characteristic in that it has two backward delay circuit arrays for delaying complementary external clocks and that an internal clock of a double frequency is generated in synchronism with the rise timing of the complementary external clocks. This circuit mainly differs from the circuit shown in FIG. 20 in the following respects. (1) Buffer circuits CIB0B, CIBB and CB4 for entering an inverted external clock CLKEB, besides the non-inverted external clock CLKET in the foregoing embodiments, are added. (2) Shot pulse generators SPG and SPGB for narrowing the pulse width are inserted at the output ends of buffer circuits for receiving CLKET and CLKEB. (3) A second backward delay circuit array BDA1, having the same configuration as BDA, is added to BDA. To BDA1 are connected the same NM1 to NMA which are connected to BDA (illustration of wiring is dispensed with). (4) Between the output node NB0 and the two backward delay circuit arrays is added a logical circuit (OR circuit) for logical summation of their outputs.

The clock input buffers CIB0 and CIB0B have the same configuration as the circuit shown in FIG. 3, and each is a circuit for receiving complementary external clocks CLKET and CLKEB. The shot pulse generators SPG and SPGB have the same configuration as the circuit shown in FIG. 25, and they generate shot pulses of less than 50% duty of the external clocks CLKET and CLKEB. Therefore, the outputs CLKR and LKRB from the outputs NCIB0 and NCIB0B of CIB0 and CIB0B through SPG and SPGB are in-chip standard clocks in a shot pulse form, generated from the leading edges of the external clocks CLKET and CLKEB. The clock input buffers CIB and CIBB into which they are respectively entered have the same configuration as the circuit shown in FIG. 4, and the clock buffer CB4 has the same configuration as the circuit shown in FIG. 8.

Next will be described, with reference to FIG. 36, the basic operation of this circuit, wherein the clock cycle time is relatively long (the clock cycle time tCK is about twice as long as the delay time tDMC0 of the delay monitor), and the internal clock CLKI is generated 2.5 clock cycles behind the entry of the clock enable signal CKE. When the clock enable signal CKE takes on a high level, the external clocks CLKET and CLKET are respectively supplied to nodes CLKR and CLKRB through the clock input buffers CIB0 and CIB0B, and further to nodes NAI and NAIB through the clock buffers CIB and CIBB. Here the procedure from the detection of synchronism by the control circuit MCC until the determination of the outputs NM1 to NMm is similar to that illustrated in FIG. 20.

It being supposed-that the control circuit MCC has detected synchronism and only the output NMAi of the latch circuit LBi is at a high level with all the rest remaining at a low level, the following procedure will be described. As the clock control signal EN2 then shifts from a low to a high level, third and subsequent in-chip standard clocks CLKR are entered into the delay circuit BDEi within BDA from the node NAI CB3. Also, second and subsequent in-chip standard clocks CLKRB are entered into the delay circuit BDE1I in BDA1 from the node NAIB through the clock buffer CB4. Since the same delay as the delay time applied in FDA is added in BDA and BDA1, clocks retaining the phaseal relationship between the external clocks CLKET and CLKEB are supplied to the output nodes NB1 and NB11 of BDA and BDA1.

Figure 36:
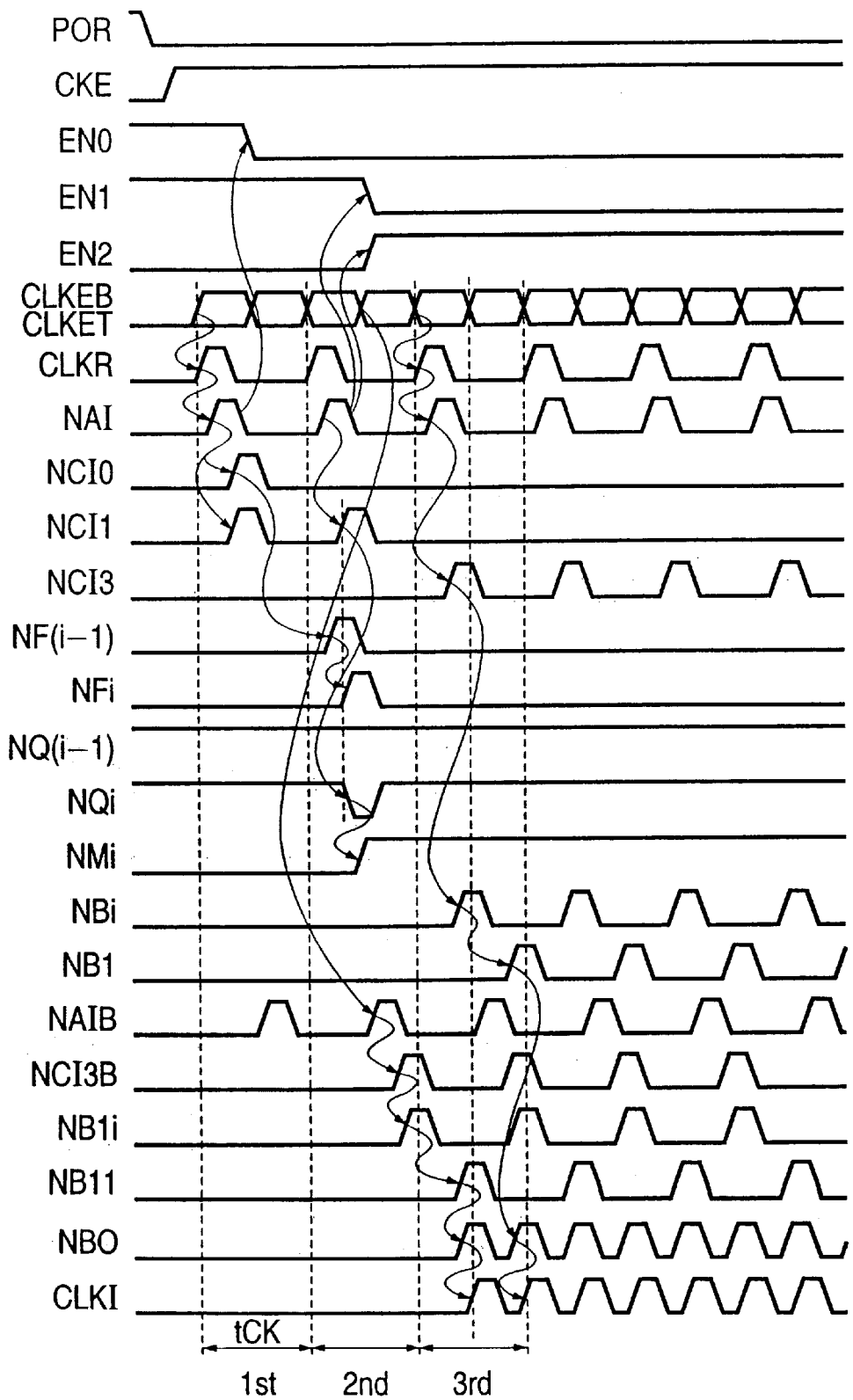
FIG. 36 illustrates the basic operation when the clock cycle time of the clock recovery circuit of FIG. 35 is relatively long.

Since here is shown, as illustrated in FIG. 36, a case in which the duty of the external clocks CLKET and CLKEB are approximately 50%, the internal clock CLKI amplified from the output NB0 of the OR circuit through the clock driver CID becomes a clock of a double frequency, whose leading edge is substantially synchronized with those of the external clocks CLKET and CLKEB. Furthermore, as a pulse generated from the external clock CLKEB is supplied before this internal clock, the internal clock CLKI is generated 2.5 clock cycles behind the entry of the clock enable signal CKE. The clock recovery circuit thus provided with two backward delay circuit arrays for the complementary external clocks CLKET and CLKET of about 50% duty can supply the internal clock CLKI substantially in synchronism with the leading edges of the external clocks CLKET and CLKEB.

Furthermore in this clock recovery circuit, too, if the clock control signals EN0, EN1 and EN2 are appropriately controlled, internal clocks can be generated, in the same way as the operation described with reference to FIG. 14, 4.5, 6.5, . . . clock cycles behind when the clock cycle time is short (the clock cycle time tCK is short relative to the delay time tDMC0 of the delay monitor).

<Embodiment 8>

Figure 37:
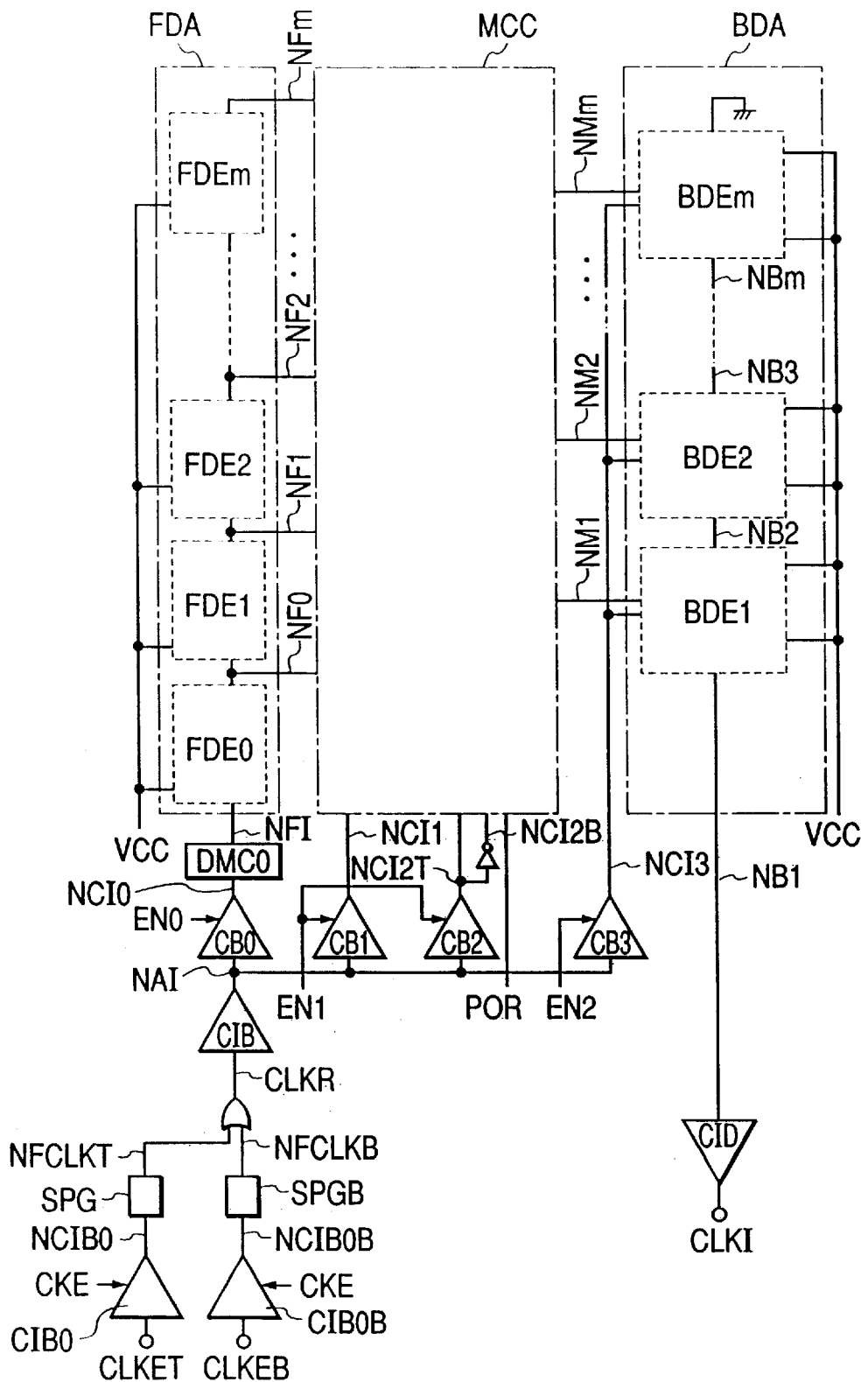
FIG. 37 illustrates Example 8 of a clock recovery circuit according to the invention.

Another clock recovery circuit according to the present invention is shown in FIG. 37, which is an eighth preferred embodiment. This clock recovery circuit is characteristic in that, after a clock of a frequency double that of complementary external clocks is generated from the complementary external clocks, an internal clock is generated in synchronism with the rise timing of the external clocks by using one each of forward and backward delay circuit array. This circuit mainly differs from the circuit shown in FIG. 20 in the following respects. (1) A buffer circuit CIB0B for entering an inverted external clock CLKEB, besides the non-inverted external clock CLKET in the foregoing embodiments, is added. (2) Shot pulse generators SPG and SPGB for narrowing the pulse width are inserted at the output ends of buffer circuits for receiving CLKET and CLKEB. (3) A logical circuit (OR circuit) for logical summation of the outputs of SPG and SPGB is added to enter the logical sum into CIB.

Figure 38:
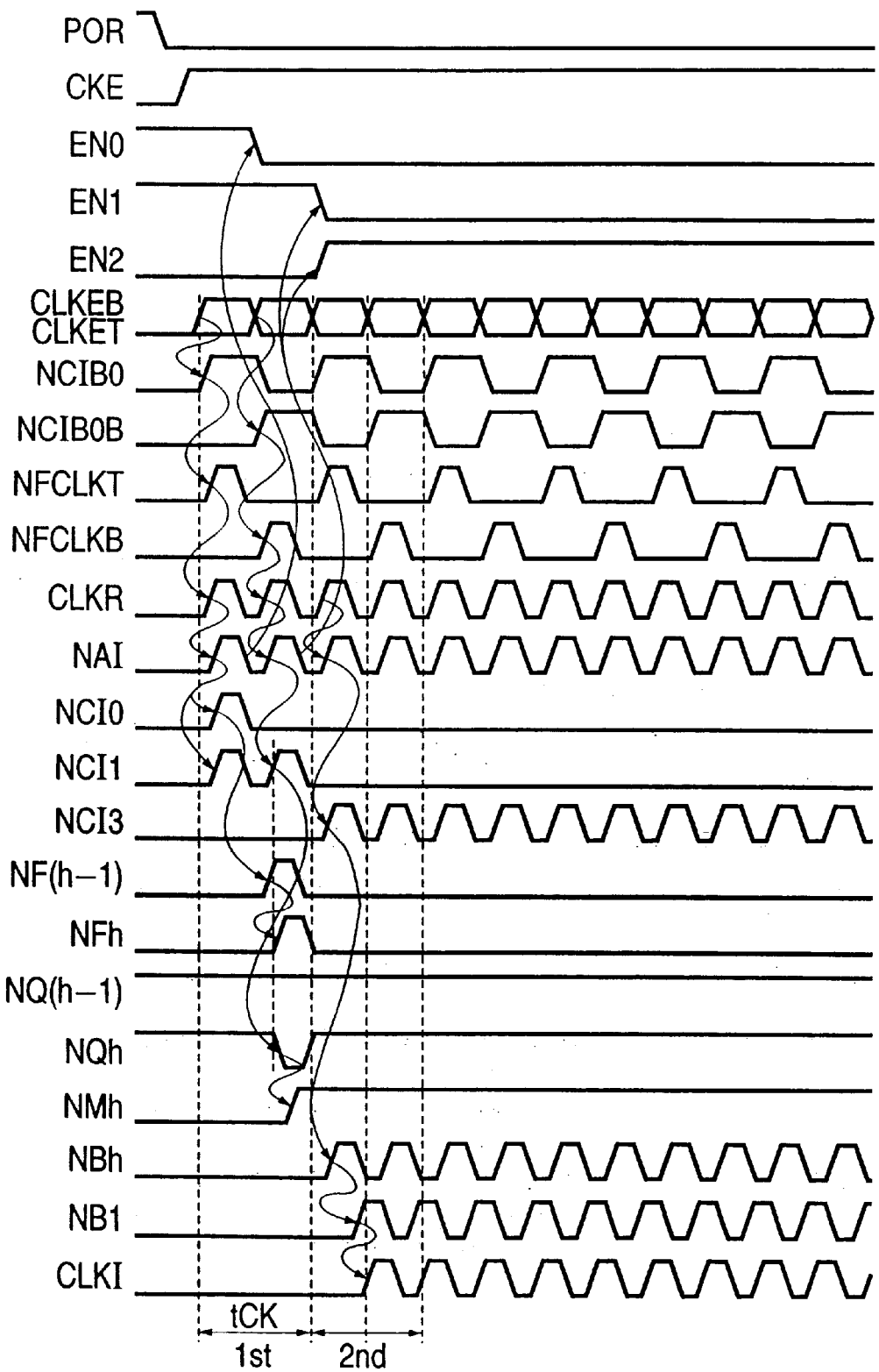
FIG. 38 illustrates the basic operation when the clock cycle time of the clock recovery circuit of FIG. 37 is relatively long.

Next will be described, with reference to FIG. 38, the basic operation of this circuit, wherein the clock cycle time is relatively long (the clock cycle time tCK is about twice as long as the delay time tDMCO of the delay monitor), and the internal clock CLKI is generated 2.5 clock cycles behind the entry of the clock enable signal CKE. Here is shown a case in which the duty of the external clocks CLKET and CLKEB are approximately 50%. When the clock enable signal CKE takes on a high level, the external clocks CLKET and CLKET are respectively supplied to nodes NCIB0 and NCIB0B through the clock input buffers CIB0 and CIB0B, and they are further entered into short pulse generators SPG and SPGB, respectively, to generate clock pulses NFCLKT and NFCLKB of less than 50% duty. In-chip internal standard clocks CLKR supplied from them through an OR circuit are entered into FDA to measure the number of lock-in stages, and the output of the control circuit MCC is determined to generate an internal clock CLKI.

However, as the frequency of the in-chip standard clock CLKR is double that of the external clock, the clock cycle differs from that shown in FIG. 20. Thus a first clock sent to FDA through CB0 to generate a plurality of reference clocks and a second clock sent through CB1 to detect the number of delays stages for lock-in have a phase difference of only a half frequency from the external clock. If the control circuit MCC has detected synchronism and only the output NMh of the latch circuit LBh is at a high level, with all the rest remaining at a low level, the number of delay stages for lock-in will be behind the external clock by a half period. Thus, the relationship between the position of NMh and the clock cycle tCK, from the cycle of the node NCIO, is represented by:

$$tCK/2 = tDMC0 + h \cdot tD + \Delta t \quad (EQ. 27)$$

If the procedure described with reference to FIG. 20 is followed hereafter, in the basic operation of the clock recovery circuit shown in FIG. 37, an internal clock CLKI of a frequency about double that of the external clock is generated after the entry of the clock enable signal CKE in 1.5 clock cycles of the external clock (or 3 cycles of the internal standard clock).

Therefore, the configuration wherein, as shown in FIG. 37, the number of delay stages for lock-in is detected with an in-chip standard clock of a frequency double that of the external clock, provides the benefit of being able to generate an internal clock CLK1 of a frequency double that of the external clock. Moreover, since h in (EQ. 27) is smaller than i explained with reference to FIG. 20, the numbers of stages of FDA and BDA half that of the clock recovery circuit shown in FIG. 20 would be sufficient. In other words, the clock recovery circuit of this embodiment offers the benefit of making possible configuration of the coarse tuning circuit CTC shown in FIG. 1 and that in FIG. 20 using a smaller number of circuit elements.

In this clock recovery circuit, too, if the clock control signals EN0, EN1 and EN2 are appropriately controlled, internal clocks can be generated, in the same way as the operation described with reference to FIG. 14, 2.5, 3.5, . . . clock cycles behind when the clock cycle time is short (the clock cycle time tCK is short relative to the delay time tDMC0 of the delay monitor).

<Embodiment 9>

Figure 39:
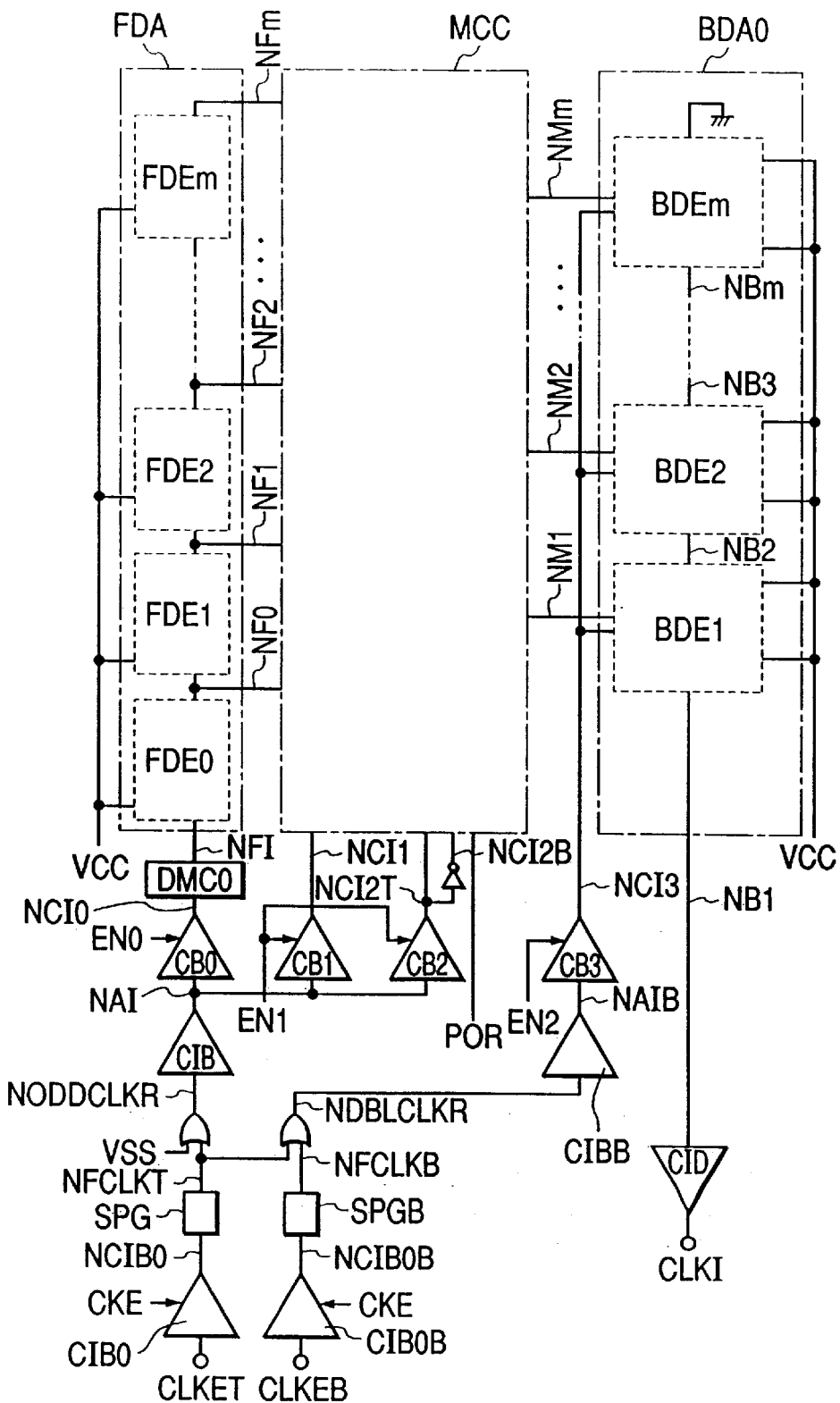
FIG. 39 illustrates Example 9 of a clock recovery circuit according to the invention.

Still another clock recovery circuit according to the present invention is shown in FIG. 39, which is a ninth preferred embodiment. This clock recovery circuit is characteristic in that, after a clock of a frequency double that of complementary external clocks is generated from the complementary external clocks, an internal clock is generated in synchronism with the rise timing of the external clocks by using one each of forward and backward delay circuit array, wherein an internal clock pulse generated from a non-inverted external clock is in synchronism with the rise timing of the non-inverted external clock, and an internal clock generated from an inverted external clock is in synchronism with the rise timing of the inverted external clock. This circuit mainly differs from the circuit shown in FIG. 20 in the following respects. (1) A buffer circuit CIB0B for entering an inverted external clock CLKEB, besides the non-inverted external clock CLKET in the foregoing embodiments, is added. (2) Shot pulse generators SPG and SPGB for narrowing the pulse width are inserted at the output ends of buffer circuits for receiving CLKET and CLKEB. (3) A logical circuit (OR circuit) for logical summation of the outputs of SPG and SPGB is added. (4) The standard clock for BDA0 is a clock resulting from the logical summation of SPG and SPGB. (5) The output of SPG is supplied to CIB via an OR circuit. The OR circuit connected to CIB is a dummy circuit to compensate for delays.

Figure 40:
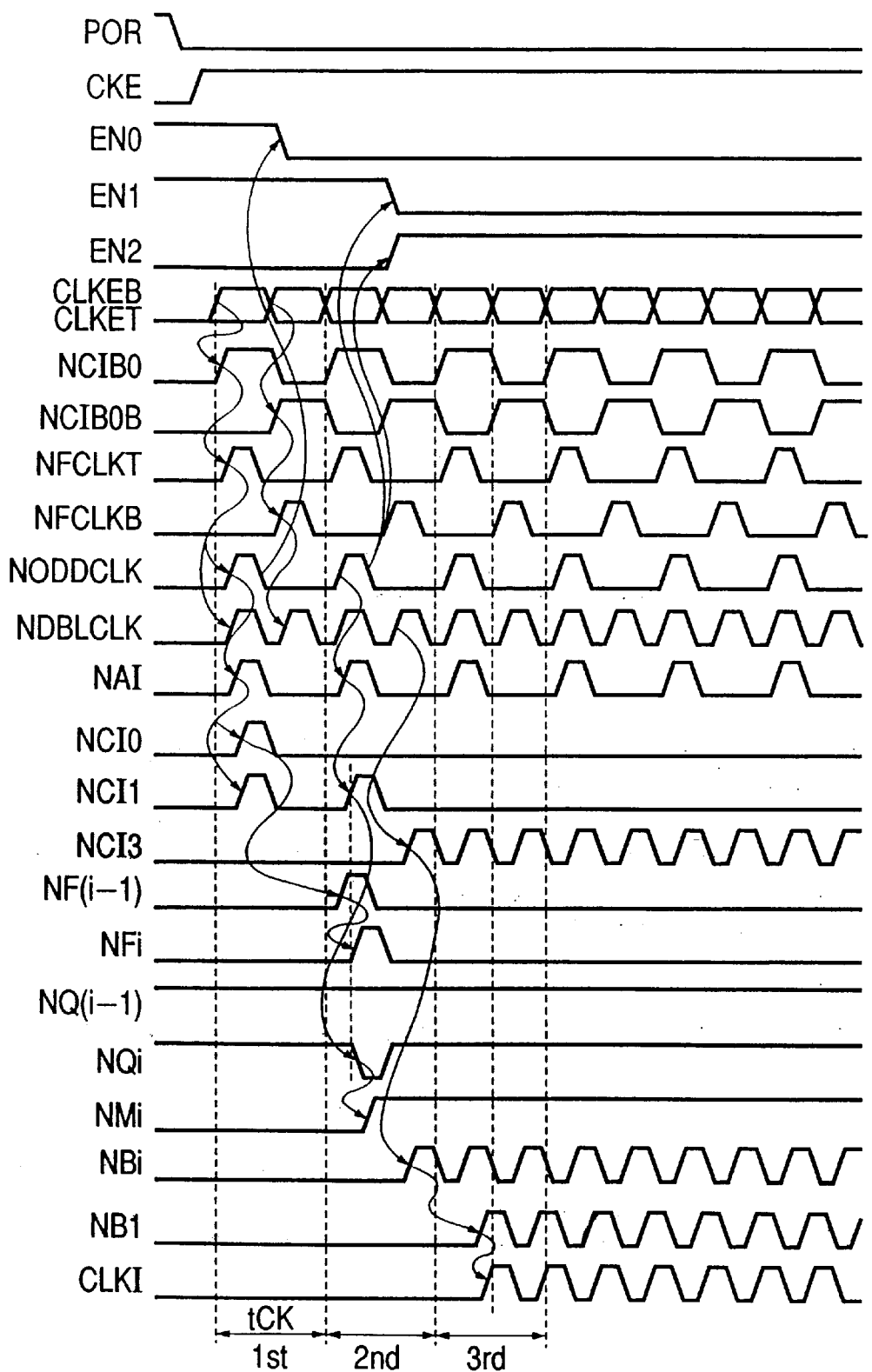
FIG. 40 illustrates the basic operation when the clock cycle time of the clock recovery circuit of FIG. 39 is relatively long.

Next will be described, with reference to FIG. 40, the basic operation of this circuit, wherein the clock cycle time is relatively long (the clock cycle time tCK is about twice as long as the delay time tDMC0 of the delay monitor), and the internal clock CLKI is generated 2.5 clock cycles behind the entry of the clock enable signal CKE. Here is shown a case in which the duty of the external clocks CLKET and CLKEB are approximately 50%.

When the clock enable signal CKE takes on a high level, the external clocks CLKET and CLKET are respectively supplied to nodes NCIB0 and NCIB0B through the clock input buffers CIB0 and CIB0B, and they are further entered into short pulse generators SPG and SPGB, respectively, to generate clock pulses NFCLKT and NFCLKB of less than 50% duty. Of these outputs, the output NAI from the node NFCLKT through the OR circuit and CIB has the same frequency as the external clock. Therefore the procedure until the control circuit MCC detects synchronism and the outputs NM1 to NMm are determined takes place on the same way as is illustrated in FIG. 20.

It being supposed that the control circuit MCC has detected synchronism and only the output NMi of the latch circuit LBi is at a high level with all the rest remaining at a low level, the following procedure will be described. As the clock entered into the delay circuit BDEi through CB3 is, unlike in FIG. 20, an in-chip standard clock NDBLCLKR resulting from the logical summation of the shot pulses of the non-inverted clock CLKET and of the inverted clock CLKEB, it is a clock of a frequency double that of the external clock. This clock pulse propagates through BDA0 and, amplified through the clock driver CID, is supplied as the internal clock CLKI. Thus, the internal clock is supplied only 1 cycle behind the complementary external clocks with the phaseal relationship retained as it is. Accordingly, there is provided the benefit of making possible generation of an internal clock of a frequency double that of the external clock, where an internal clock pulse generated from a non-inverted external clock is in synchronism with the rise timing of the non-inverted external clock, and an internal clock generated from an inverted external clock is in synchronism with the rise timing of the inverted external clock.

Here again, as in the case of FIG. 35, an internal clock generated from a second inverted clock is first supplied, so that the number of clock cycles is 2.5. In this clock recovery circuit, too, if the clock control signals EN0, EN1 and EN2 are appropriately controlled, internal clocks can be generated, in the same way as the operation described with reference to FIG. 14, 4.5, 6.5, . . . clock cycles behind when the clock cycle time is short (the clock cycle time tCK is short relative to the delay time tDMC0 of the delay monitor).

Clock recovery circuits of Embodiments 1 to 9 have been described so far. One of the most important aspects common to all these embodiments is that the control circuit for detecting the number of delay stages for lock-in is provided with latch circuits, which retain the number of delay stages for lock-in. This configuration gives rise to the following operational benefits.

(1) After synchronism is detected, if a standard clock is entered into a predetermined position in one delay circuit array, an internal clock can be generated.

(2) Since this clock recovery circuit takes only a short time to detect synchronism and, once synchronism is detected, latch circuits fix the number of delay stages for lock-in, any operational mismatching with a second clock recovery circuit, with which this circuit is to be paired, can be readily controlled.

(3) The action to reduce the overall power consumption of the semiconductor apparatus by temporarily suspending the supply of external clocks is facilitated. Thus the feature stated in (1) enables the clock recovering action to resume the supply of external clocks to be accomplished in a short period of time (1 clock cycle).

(4) Further in a configuration wherein a dedicated delay circuit array is provided for synchronism detection, the operation of this circuit array can be suspended after the completion of synchronism detection, resulting in a corresponding saving in the consumption of power by the clock recovery circuit.

(5) As the configuration of (1) makes possible the use of one delay circuit array on a time sharing basis, clock recovery can be achieved with only one delay circuit array. In this configuration, the space occupied by the clock recovery circuit can be reduced, with a corresponding contribution to saving the cost of the semiconductor apparatus.

<Embodiment 10>

Figure 41:
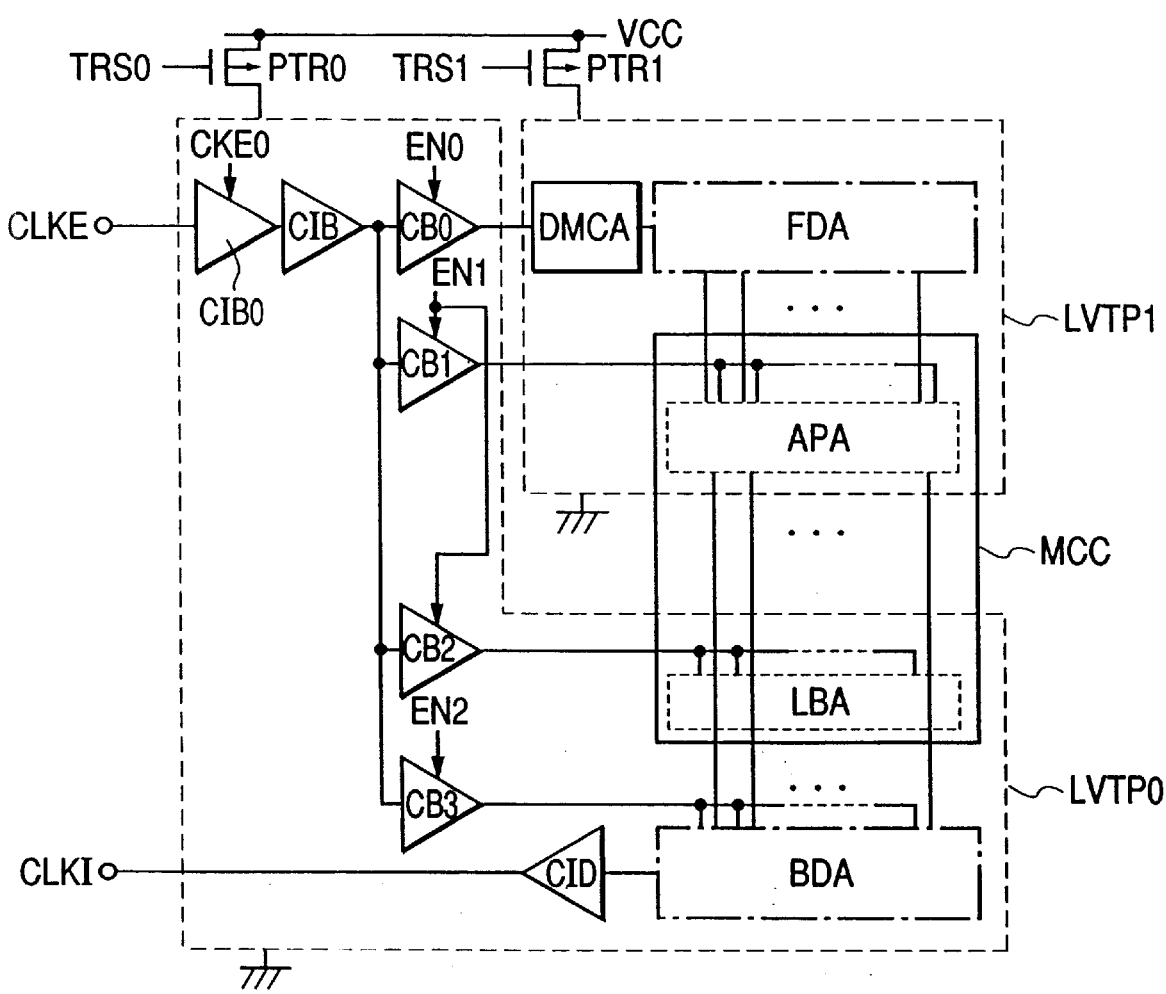
FIG. 41 illustrates Example 10 of a clock recovery circuit according to the invention.

Another clock recovery circuit according to the present invention is shown in FIG. 41, which is a tenth preferred embodiment. This clock recovery circuit is characteristic in that it can save its power consumption by intercepting the source voltage fed to circuits other than the delay circuits required for generating internal clocks synchronized with external clocks. This clock recovery circuit configuration is intended for application to the circuit of FIG. 20. Although some adjustment would be needed for application to the circuits of FIGS. 22, 29, 30 and 32, this embodiment can be applied directly to all others. The circuit elements in the control circuit MCC are divided into latch circuits and a logic circuit array APA. If this feature is applied to the MCC of FIG. 20, APA corresponds to arbiters ARB0 to ARBm and logic circuits PCL1 to PCLm. The configuration of this embodiment is such that at least a power supply block for FDA and APA is separated from other circuit blocks as a circuit block LVTP1 and controlled with a power switch PTR1. Incidentally, the delay monitor in FIG. 20 is included in LVTP1. This embodiment further has a structure in which a circuit block LVTP0 consisting of clock input buffers CIB0 and CIB, clock buffers CB0, CB1, CB2 and CB3, a latch circuit array LBA, a backward delay circuit array BDA and a clock driver CID is also controlled by a source voltage feed transistor PTR0.

In the clock recovery circuit shown in FIG. 20, as described with reference to the operation illustrated in FIG. 13, the actions of the forward delay circuit array FDA and of the arbiters ARB0 to ARBm can be suspended once the output of the control circuit MCC is determined. Therefore, when turning on power supply or restoring from a standby state, the source voltage feed transistors PTR0 and PTR1 are turned on, but after determining the output of the control circuit MCC, source voltage feed to the circuit block LVTP1 can be suspended by turning off the source voltage feed transistor PTR1, thereby to save the consumption of power by this clock recovery circuit, because the latch circuits hold information on the number of delay stages for lock-in. This control system for the source voltage feed line can also be applied where circuits in the logic circuits LVTP0 and LVTP1 are composed of transistors with lower threshold voltages than the source voltage feed transistor PTR0 and PTR1, and in that way the off-currents (sub-threshold leak currents) in the low threshold voltage transistors can be utilized to keep power consumption low.

Application of this embodiment to the configurations of FIGS. 22, 29, 30 and 32 can be accomplished by including circuits whose operation is not needed after the end of synchronism detection into LVTP1. For example, any circuit corresponding to APA in the control circuit allows direct application.

<Embodiment 11>

Figure 42:
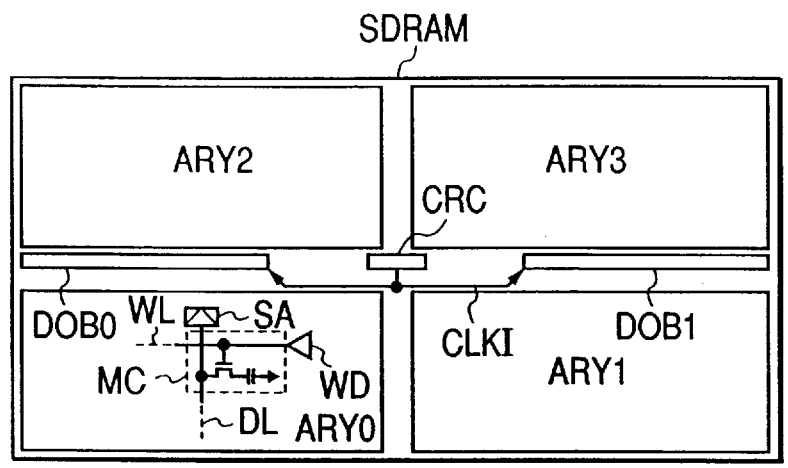
FIG. 42 illustrates an example of a synchronous DRAM according to the invention.

Next is presented an application of the clock recovery circuit so far described. FIG. 42 illustrates a typical configuration of synchronous DRAM. In the diagram, CRC denotes a clock recovery circuit, which may be configured as illustrated in FIG. 1 for instance. The techniques in Embodiments 2 to 10 may be applied as required. ARY0 to ARY3 denote memory arrays, arranged at desired intersections between word lines WL and data lines DL, and consisting of a dynamic type memory cell MC composed of a MOS transistor and a capacitor, a sense amplifier SA connected to a data line DL and a word driver WD for driving word WL. DOB0 and Dob1 are data output buffers, the former supplying data read out of the memory arrays ARY0 and ARY2, and the latter supplying data read our of ARY1 and ARY3. Description of other circuit blocks is dispensed with.

As the clock recovery circuit according to the invention operates in a wide range of clock cycle time, it is highly suitable for use in a semiconductor apparatus, such as a synchronous DRAM, which requires a wide working frequency range. It can operating in a short clock cycle time even if the load of internal clocks is increased and the delay time of the clock driver is extended by the enlargement of chip size accompanying the capacity expansion and the widening of the bus breadth to enhance data rates. It will be adaptable to the increased speed and capacity of future synchronous DRAMs because it can precisely control the output timing of internal clocks and accordingly can secure a sufficient working margin in high frequency operation. Where data output buffers are arranged in distant positions within a chip as illustrated in FIG. 42, the load on the drive circuit for clock signals destined for those buffers will increase, which could be adequately addressed by the clock recovery circuit according to the invention.

Figure 43:
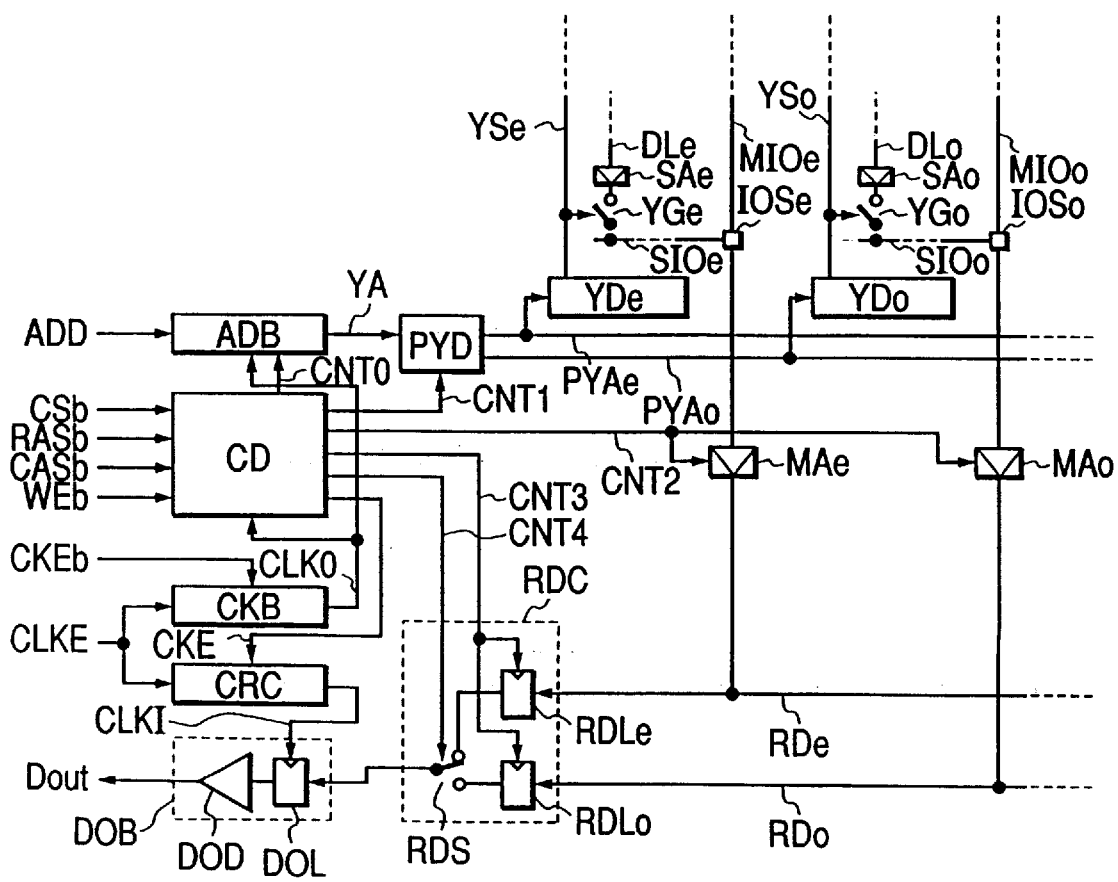
FIG. 43 is a block diagram of the essential parts of the synchronous DRAM according to the invention.

FIG. 43 is a block diagram of the essential part of a synchronous DRAM, illustrating a typical configuration of a column (Y) read bus (data read route). Illustration of a row (X) read bus and a write bus (data write route) is dispensed with in the diagram. Signal names indicated on the left hand side of the diagram refer to input/output terminals which are standard items provided on a synchronous DRAM. Letter "b" at the end of a terminal name indicates an inverted signal. The synchronous DRAM is distinguished from conventional DRAMs by its operation with reference to an external clock entered from a clock input terminal CLKE. The entry of the external clock is controlled with a clock enable input terminal CKE. From an address input terminal ADD may be entered row addresses, column addresses and bank addresses by a system which may be but not limited to an address multiple system. A row address strobe command input terminal RASb and a column address strobe command input terminal CASb are provided to sequentially enter row and column addresses. A synchronous DRAM having a static memory cell and operating with reference to an external clock does not use an address multiple system, and accordingly can be regarded as having neither of these RASb and CASb. There further are a chip selection input terminal CSb for selecting a memory chip and a write enable command input for controlling the writing of data. Whereas output data from a memory are supplied from a data output terminal Dout, this terminal is often used in combination with a data input terminal not shown. Signals destined for the aforementioned input terminals are taken in according to the timing of an external clock entered from a clock input terminal.

ADB denotes an address buffer having the function of an address counter; PYD, a pre-Y decoder; CD, a command decoder; and CKB, a clock buffer. DLe and DLo denote data lines; SAe and SAo, sense amplifiers for amplifying signals on data lines DLe and DlLo; YGe and YGo, Y gates for connecting the sense amplifiers SAe and SAo to sub-input/output lines SIOe and SOo; IOSe and IOSo, input/output line switches for connecting the sub-input/output lines SIOe and SIOo to main input/output lines MIOe and MIOo; YDe and YDo, Y decoders for selecting Y gates YGe and YGo by Y selection lines YSe and YSo; and MAe and MAo, main amplifiers for amplifying signals in the main input/output lines MIOe and MIOo. Many of these elements are provided, but only part of them are shown for the sake of simplicity. CRC denotes a clock recover circuit, which may be configured as illustrated in FIG. 1 for instance. RDC denotes a read data control circuit consisting of read data latches RDLe and RDLo and a read data selector RDS. DOB denotes a data output buffer, consisting of a data output latch DOL and a data output driver DOD. Although as many of the read data control circuit RDC and of the data output buffer DOB as the number of bits of data output per cycle are to be provided, only one each is shown here for the sake of brevity.

Figure 44:
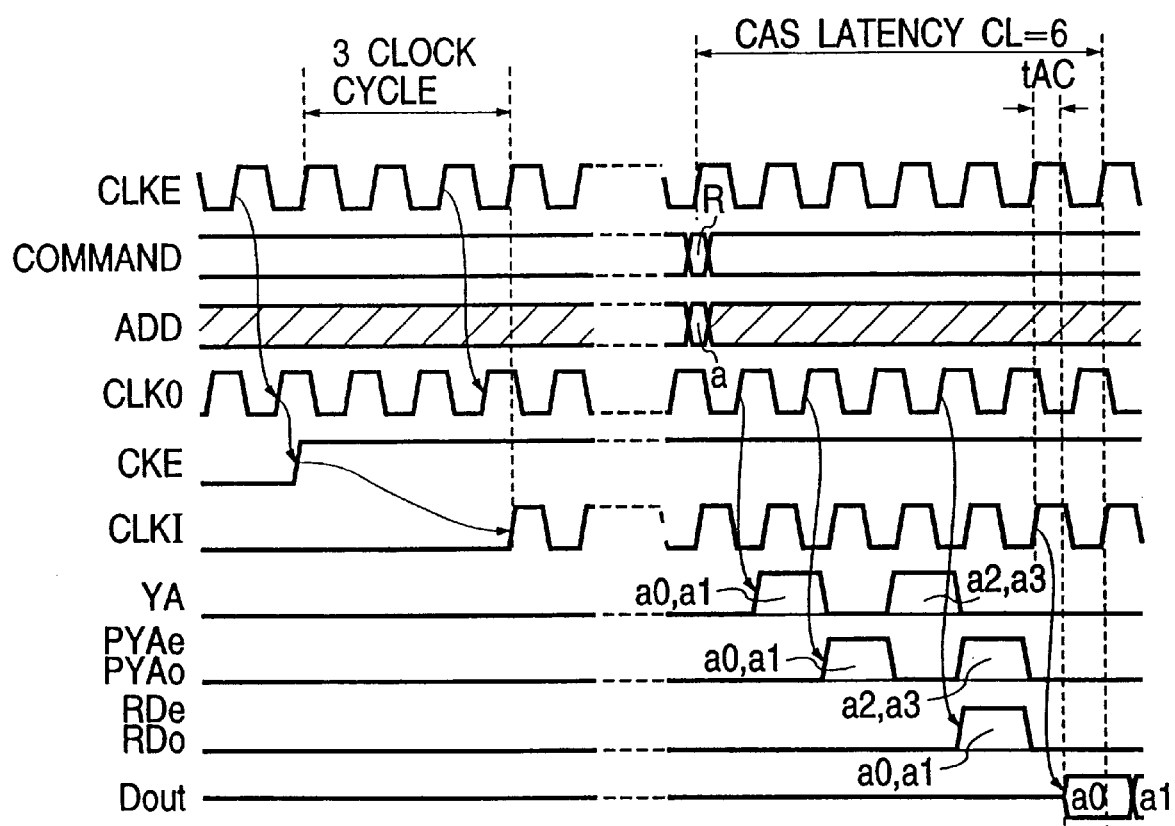
FIG. 44 illustrates the operational timings of the synchronous DRAM according to the invention.

The reading operation of the synchronous DRAM of FIG. 43 will now be described with reference to the timing chart of FIG. 44, which illustrates a case in which two bits are prefetched at a time for pipeline operation, the CAS latency CL is 6 and burst reading in 4 bit units is to be accomplished. Actions in rows by an activate command are supposed to have been completed already. A clock enable signal CKEb from outside has actuated a clock buffer CKB, and an internal clock CLK0 is supplied to a command decoder CD and other elements. The clock buffer CKB has no function to match internal and external clocks in timing, and the phase difference between the internal clock CLK0 and the external CLKE is great though they have the same frequency.

Timed with the rise of the external clock CLKE, a read command R is taken into the command decoder CD in a combination of control signals CSb, RASb, CASb and WEb, and the command decoder CD controls each circuit block with control signals CNT0, CNT1, CNT2, CNT3 and CNT4. Also, the clock recovery circuit CRC is actuated by a clock enable signal CKE.

Simultaneously with the read command R, an address signal a of external addresses ADD is taken into the address buffer ADB, and address signals a0 and a1 of Y addresses are supplied to the pre-Y decoder PYD. Here, a0 and a1 are the first and next addresses, respectively, and addresses for 2 cycles are supplied at the same time because 2 bits are prefetched at a time. One clock cycle after that, the pre-Y decoder PYD supplies the first 2 cycle equivalent of predecoded address signals to the Y address buses PYAe and PYAo. In accordance with these address signals, the Y decoders YDe and YDo selects the Y gates YGe and YGo by the selection lines YSe and YSo, and signals are transferred from the sense amplifiers SAe and SAo to the main input/output lines MIOe and MIOo through the sub-input/output lines SIOe and SIOo and the input/output line switches IOSe and IOSo, and amplified by the main amplifiers MAe and MAo.

Since 2 bit prefetching is performed, 2 clock cycles' time is spent on the operation of this memory array section, and 2 clock cycles later the main amplifiers MAe and MAo supply the read data to the read buses RDe and RDo. Another clock cycle later, the data are latched by the read data latches RDLe and RDLo and, while being switched every clock cycle by the read data selector RDS, are delivered to the data output buffer DOB. Thus, 4 clock cycles after the first rise of the internal clock CLK0 after the entry of the read command, the data are latched by the read data latches RDLe and RDLo.

Here, the clock recovery circuit CRC is actuated by the clock enable signal CKE before the read command R is generated by the command decoder CD and, as described with reference to FIG. 13, the internal clock CLKI is supplied 3 clock cycles behind the first rise of the external clock CLKE. Further, as described with reference to FIG. 15, the internal clock CLKI with little timing error with the external clock CLKE is supplied a few dozens of clock cycles later. This internal clock CLKI controls the timing of the data output latch DOL, and the data output driver DOD supplies output data Dout.

By the use of the internal clock CLKI matched in timing with the external clock CLKE for controlling the data output, the clock access time tAC from the rise of the external clock CLKE till the data output can be reduced.

Since the clock recovery circuit according to the present invention can generator an internal clock CLKI with little timing error from an external clock CLKE a few dozens of clock cycles after the entry of a clock enable signal CLKE, restoration from a standby state is possible in a short period of time, resulting in reduced power consumption during standby and at the time of restoration.

Meanwhile, by causing the internal clock to be supplied to the command decoder and other elements to be generated by the clock buffer CKB without using the clock recovery circuit CRC, the operation can be immediately started upon actuation of the clock buffer by a clock enable signal CKEb from outside.

Incidentally, while FIG. 43 illustrates a state in which the clock buffer CKB for generating the internal clock to be used by the command decoder and other elements and the clock recovery circuit CRC for generating the internal clock CLKI for use by the output buffer DOB are independent of each other, it is also possible for them to share some parts. For instance, they can share a differential amplifier to increase the voltage amplitude of the external clock CLKE, when it is being transferred in a small amplitude, to the same amplitude as the usual working voltage in the chip. The circuit dimensions can be thereby reduced, resulting in savings in power consumption and layout space.

Although the application of the present invention to a synchronous DRAM has been described here, the invention is suitable for any other synchronous memory performing data inputting/outputting in synchronism with an external clock. A synchronous memory is a memory which takes in addresses for reading or writing and the outputting or inputting of data in certain clock cycles. If the application is applied to, for instance a synchronous static random access memory (SRAM) having a memory cell consisting of two inverters (CMOS inverters or resistance load type inverters) whose input and output terminals are cross-coupled, similar effects can be achieved.

Or, it can as well be applied to a vernier for correcting timing errors between external and internal clocks, which is required by a sink link dynamic random access memory (SLDRAM) for protocol-controlling a dynamic random access memory (DRAM).

Furthermore, the configuration illustrated in FIGS. 24 and 25, FIGS. 29 and 30, FIG. 35, FIG. 37 or FIG. 39 can be applied to the coarse tuning circuit of a clock recovery circuit for generating an internal clock CLKI in synchronism with the leading and trailing edges of an external clock CLKE, which is required by a double data rate synchronous DRAM (DDR SDRAM) wherein the timing of a data output latch is controlled and a data output driver DOD supplies output data Dout in synchronism with the leading and trailing edges of the external clock CLKE.

As described above, the present invention is directed to a control circuit for detecting the number of stages for lock-in in a delay circuit array by comparing standard clock with a plurality of reference clock sequences differing in phase, supplied by a plurality of delay circuits, wherein and the number of delay stages for lock-in is retained to constitute a clock recovery circuit. This configuration results in the following principal benefits.

(1) After synchronism is detected, if a standard clock is entered into a predetermined position in one delay circuit array, an internal clock can be generated.

(2) Since this clock recovery circuit takes only a short time to detect synchronism and, once synchronism is detected, latch circuits fix the number of delay stages for lock-in, any operational mismatching with a second clock recovery circuit, with which this circuit is to be paired, can be readily controlled.

(3) The action to reduce the overall power consumption of the semiconductor apparatus by temporarily suspending the supply of external clocks is facilitated. Thus the feature stated in (1) enables the clock recovering action to resume the supply of external clocks to be accomplished in a short period of time.

(4) Further in a configuration wherein a dedicated delay circuit array is provided for synchronism detection, the operation of this circuit array can be suspended after the completion of synchronism detection, resulting in a corresponding saving in the consumption of power by the clock recovery circuit.

(5) As the configuration of (1) makes possible the use of one delay circuit array on a time sharing basis, clock recovery can be achieved with only one delay circuit array. In this configuration, the space occupied by the clock recovery circuit can be reduced, with a corresponding contribution to saving the cost of the semiconductor apparatus.

What is claimed is:

1. A semiconductor integrated circuit having a clock recovery circuit which receives an external clock and generates an internal clock, wherein said clock recovery circuit comprises:

an input standard node, to which said external clock is coupled, for supplying a first standard clock;

a plurality of first delay circuits, whose initial stage is coupled to said input standard node, for supplying a plurality of reference clocks differing in phase from each other;

a control circuit having a comparator for detecting a predetermined number of delay stages required for locking in by comparing the plurality of reference clocks with said first standard clock and detecting one of the plurality of reference clocks closest in phase to said first standard clock, and a latch circuit for holding information on said predetermined number of delay stages;

a plurality of second delay circuits each having an input node into which said first standard clock is entered via a switch; and an output standard node which is coupled to the final stage of said second delay circuits, and which supplies said internal clock, and wherein said internal clock is formed by causing said first standard clock to be entered into said input node of one of said plurality of second delay circuits which corresponds to said predetermined number of delay stages detected by said control circuit, and to be propagated to the final stage.

2. A semiconductor integrated circuit according to claim 1, wherein after said latch circuit has held the information on said predetermined number of delay stages, the entry of said first standard clock into said plurality of first delay circuits and said comparator is suspended.

3. A semiconductor integrated circuit according to claim 1, wherein when the supply of said external clock to said clock recovery circuit is suspended for a predetermined period after said latch circuit has held the information on said predetermined number of delay stages, and said external clock is supplied again, said plurality of second delay circuits forms said internal clock in accordance with information on said predetermined number of delay stages held by said latch circuit.

4. A semiconductor integrated circuit according to claim 1, wherein after said latch circuit has latched said predetermined number of delay stages, the supply of working power to said plurality of first delay circuits and to said comparator of said control circuit is suspended.

5. A semiconductor integrated circuit according to claim 1, wherein said semiconductor integrated circuit further has a second clock recovery circuit, wherein said second clock recovery circuit has a variable delay circuit inserted between said plurality of second delay circuits and the output node of said internal clock, and a phase comparator for comparing the phases of said first standard clock and of said internal clock and controlling the delay time of said variable delay circuit, and wherein the delay time of each of the pluralities of first and second delay circuits of said first clock recovery circuit is a first delay time, and wherein the unit of varying the delay time by said variable delay circuit is a second delay time shorter than said first delay time.

6. A semiconductor integrated circuit according to claim 5, wherein said second delay time is about 1/10 of said first delay time.

7. A semiconductor integrated circuit according to claim 5, wherein the operation of said phase comparator of said second clock recovery circuit is suspended before said latch circuit holds said predetermined number of delay stages, and wherein said phase comparator is enabled to operate and the entry of said external clock into said plurality of first delay circuits and said comparator is suspended after said latch circuit has held said predetermined number of delay stages.

8. A semiconductor integrated circuit according to claim 5, wherein after said latch circuit has latched said predetermined number of delay stages, the supply of working power to said plurality of first delay circuits and to said comparator is suspended.

9. A semiconductor integrated circuit according to claim 5, wherein said second clock recovery circuit further comprises a control signal generating circuit which receives first and second signals supplied by said phase comparator, and supplies a shift register control signal, and a shift register which receives said shift register control signal, and controls said variable delay circuit, and wherein said shift register is controlled according to the output of said phase comparator.

10. A semiconductor integrated circuit according to claim 5, wherein a bit other than the least significant bit and the most significant bit is set in said shift register at the time of initial setting.

11. A semiconductor integrated circuit according to claim 10, wherein said shift register is controlled by a binary search algorithm.

12. A semiconductor integrated circuit according to claim 1, wherein said clock recovery circuit is further provided with a shot pulse generator, which receives said external clock, narrows the pulse width and supplies the resultant clock to said standard node as said first standard clock, a plurality of third delay circuits in which delay circuits in a number equal to ½ of the number of said plurality of second delay circuits are connected in series, and a logic circuit inserted between the output end of said plurality of second delay circuits and said output standard node, and wherein said logic circuit forms said internal clock having a frequency double that of said external clock by logical summation of a first clock resulting from the entry of said first standard clock into the input nodes of said plurality of second delay circuits corresponding to said predetermined number of delay stages detected by said control circuit, and of a second clock resulting from the entry of said first standard clock into the input nodes of said plurality of third delay circuits corresponding to half of said predetermined number of delay stages detected by said control circuit, and supplying the resultant logical sum to said output standard node.

13. A semiconductor integrated circuit according to claim 1, wherein said clock recovery circuit further receives, in addition to said external clock, an inverted external clock having an inverted phase relative to said external clock and generates said internal clock, wherein said clock recovery circuit further comprises:

a first shot pulse generator which receives said external clock, narrows the pulse width and supplies the resultant clock to said standard node as said first standard clock;

a second shot pulse generator which receives said inverted external clock, narrows the pulse width and supplies a second standard clock;

a plurality of third delay circuits each provided correspondingly to said plurality of second delay circuits; and a logic circuit inserted between the final stage of said plurality of second delay circuits and said output standard node, and wherein said logic circuit forms said internal clock having a frequency double that of said external clock by logical summation of a first clock resulting from the entry of said first standard clock into one of said input nodes of said plurality of second delay circuits corresponding to said predetermined number of delay stages detected by said control circuit, and of a second clock resulting from the entry of said second standard clock into the input nodes of said plurality of third delay circuits corresponding to said predetermined number of delay stages detected by said control circuit, and supplying the resultant logical sum to said output standard node.

14. A semiconductor integrated circuit according to claim 1, wherein said clock recovery circuit further receives, in addition to said external clock, an inverted external clock having an inverted phase relative to said external clock and generates said internal clock, wherein said clock recovery circuit further comprises:

a first shot pulse generator which receives said external clock, and generates a first clock whose pulse width is narrowed;

a second shot pulse generator which receives said inverted external clock, and generates a second clock whose pulse width is narrowed; and a logic circuit for supplying said standard node with a signal resulting from the logical summation of said first and second clocks as said first standard clock, and wherein said internal clock has a frequency double that of said external clock.

15. A semiconductor integrated circuit according to claim 1, wherein said semiconductor integrated circuit further has an address input circuit into which an address is entered according to said external clock; a plurality of memory cells selected by said address; and a memory with clock synchronized interface for supplying read data from said plurality of memory cells according to said internal clock.

16. A semiconductor integrated circuit having a clock recovery circuit which receives a first external clock and a second external clock having an inverted phase relative to said first external clock and which generates an internal clock having a frequency double that of said first external clock, wherein said clock recovery circuit comprises:

a first shot pulse generator which receives said external clock, and supplies a first clock whose pulse width is narrowed, a second shot pulse generator which receives said inverted external clock, and supplies a second clock whose pulse width is narrowed;

a logic circuit for generating a third clock resulting from the logical summation of said first and second clocks;

a plurality of first delay circuits which receive said first clock and which supply a plurality of reference clocks differing in phase from each other;

a control circuit having a comparator for detecting a predetermined number of delay stages required for locking in by comparing said plurality of reference clocks with said first clock and detecting the reference clock closest in phase to said first clock, and a latch circuit for holding information on said predetermined number of delay stages; and a plurality of second delay circuits each having an input node into which said third clock is entered via a switch, wherein said internal clock is formed by causing said third clock to be entered into a selected one of said input nodes of said plurality of second delay circuits which corresponds to said predetermined number of delay stage detected by said control circuit, and to be propagated to a final stage of said second delay circuits.

17. A semiconductor integrated circuit having a clock recovery circuit which receives an external clock and generates an internal clock, wherein said clock recovery circuit comprises:

an input buffer, which receives said external clock, for supplying a standard clock from a first node;

a first delay circuit array having a first input node coupled to said first node; a plurality of first delay circuits connected in series, whose input end is coupled to said first input node; and a plurality of first output nodes. provided in each of the connecting nodes of said plurality of first delay circuits, for supplying a plurality of second clocks;

a control circuit having a second input node coupled to said first node; a plurality of reference signal input nodes coupled to said plurality of first output nodes; and a plurality of reference result output nodes;

a second delay circuit array having a third input node coupled to said first node; a plurality of control signal input nodes coupled to said plurality of reference result output nodes; a plurality of second delay circuits connected in series, each provided correspondingly to said plurality of control input nodes; and a second output node coupled to the output of the final stage of said plurality of second delay circuits;

a second node coupled to said second output node; and an output buffer circuit. coupled to said second node, for supplying said internal clock, and wherein said control circuit compares the phases of said first clock entered into said second input node with that of a plurality of clock signals entered into said plurality of reference signal input nodes from said first delay circuit array, detects as the lock-in stage one of said plurality of reference signal nodes into which the closest one of said plurality of clock signals in phase; and supplies a predetermined signal for the lock-in stare to one of a plurality of comparison result output nodes corresponding to said lock-in stage, and wherein said second delay circuit array enters said standard clock into one of said plurality of second delay circuits corresponding to said plurality of control signal input nodes into which said predetermined signal for the lock-in stage is entered, causing the clock to propagate through a predetermined number of said second delay circuits, and supplying it to said second output node;

wherein said control circuit further includes a plurality of latch circuits each coupled to one of said plurality of comparison result output nodes, and wherein said plurality of latch circuits hold information on said stage for lock-in.

18. A semiconductor integrated circuit according to claim 17, wherein the entry of said standard clock into said plurality of first delay circuits and said control circuit is suspended after said plurality of latch circuits have held information on said stage for lock-in.

19. A semiconductor integrated circuit having a clock recovery circuit which receives an external clock and generates an internal clock, wherein said clock recovery circuit comprises:

an input buffer, which receives said external clock, for supplying a standard clock from a first node;

a first delay circuit array having a first input node coupled to said first node; a plurality of first delay circuits connected in series, whose input end is coupled to said first input node; and a plurality of first output nodes, provided in each of the connecting nodes of said plurality of first delay circuits, for supplying a plurality of second clocks;

a control circuit having a second input node coupled to said first node; a plurality of reference signal input nodes coupled to said plurality of first output nodes; and a plurality of reference result output nodes;

a second delay circuit array having a third input node coupled to said first node; a plurality of control signal input nodes coupled to said plurality of reference result output nodes; a plurality of second delay circuits connected in series, each provided correspondingly to said plurality of control input nodes; and a second output node coupled to the output of the final stage of said plurality of second delay circuits;

a second node coupled to said second output node; and an output buffer circuit, coupled to said second node, for supplying said internal clock, and wherein said control circuit compares the phases of said first clock entered into said second input node with that of a plurality of clock signals entered into said plurality of reference signal input nodes from said first delay circuit array. detects as the lock-in stage one of said plurality of reference signal nodes into which the closest one of said plurality of clock signals in phase; and supplies a predetermined signal for the lock-in stage to one of a plurality of comparison result output nodes corresponding to said lock-in stage, and wherein said second delay circuit array enters said standard clock into one of said plurality of second delay circuits corresponding to said plurality of control signal input nodes into which said predetermined signal for the lock-in stage is entered, causing the clock to propagate through a predetermined number of said second delay circuits, and supplying it to said second output node;

wherein said semiconductor integrated circuit further has said second clock recovery circuit, wherein said second clock recovery circuit has a phase comparator for comparing the phases of said standard clock and of said internal clock supplied by said output buffer, and a variable delay circuit inserted between said second node and the input end of said output buffer, and adjusting the delay time with a first delay time as the unit according to the result of comparison by said phase comparator, wherein each of the pluralities of first and second delay circuits of said first clock recovery circuit has a second delay time, and wherein said second delay time is longer than said first delay time.

20. A semiconductor integrated circuit according to claim 19, wherein the variable delay circuit includes a plurality of inverter circuits connected in series, of which the input end is coupled to said second node and the output end is coupled to the input end of said output buffer, wherein each of said plurality of inverter circuits includes a plurality of first MISFETs of a first conductivity type whose sources and drains are connected in parallel, a second MISFET of a first conductivity type, a third MISFET of a second conductivity type, and a plurality of fourth MISFETs of a second conductivity type, each paired with one of said plurality of first MISFETs, whose sources and drains are connected in parallel, wherein said first, second, third, and fourth MISFETs, have sources and drains which are connected in series, wherein the gates of said second and third MISFETs are made input ends, and the coupling nodes of said second and third MISFETs are made output ends, and wherein each of said plurality of fourth MISFETs and the one of said plurality of first MISFETs paired with it differ from each other in gate size.

21. A semiconductor integrated circuit having a clock recovery circuit which receives an external clock and generates an internal clock, wherein said clock recovery circuit comprises:

a plurality of first delay circuits, to which said external clock is coupled, for supplying a plurality of reference clocks differing in phase from each other;

a control circuit having a comparator for detecting a predetermined number of delay stages required for locking in by comparing the plurality of reference clocks with said external clock and detecting the reference clock closest in phase to said clock, and a latch circuit for holding information on said predetermined number of delay stages; and a plurality of second delay circuits for supplying said internal clock resulting from the delaying of said external clock correspondingly to said predetermined number of delay stages detected by said control circuit, said external clock being inputted to one of said plurality of second delay circuits corresponding to said predetermined number of delay stages.

22. A semiconductor integrated circuit having a clock recovery circuit which receives an external clock and generates an internal clock, wherein said clock recovery circuit comprises:

an input standard node, to which said external clock is coupled, which supplies a first standard clock;

a plurality of first delay circuits, whose initial stage is coupled to said input standard node, which supply a plurality of reference clocks differing in phase from each other;

a control circuit having a comparator which detects a predetermined number of delay stages required for locking in by comparing the plurality of reference clocks with said first standard clock and detecting one of the plurality of reference clocks closest in phase to said first standard clock, and a latch circuit which holds information on said predetermined number of delay stages;

a plurality of second delay circuits each having an input node to receive said first standard clock via a switch; and an output standard node which is coupled to the final stage of said second delay circuits, and which supplies said internal clock, and wherein said internal clock is formed by causing said first standard clock to be entered into said input node of one of said plurality of second delay circuits which corresponds to said predetermined number of delay stages detected by said control circuit, and to be propagated to the final stage.

* * * * *